(12) United States Patent
Ausserlechner

(10) Patent No.: US 9,252,354 B2
(45) Date of Patent: Feb. 2, 2016

(54) VERTICAL HALL DEVICE WITH HIGHLY CONDUCTIVE OPPOSITE FACE NODE FOR ELECTRICALLY CONNECTING FIRST AND SECOND HALL EFFECT REGIONS

(71) Applicant: Infineon Technologies AG, Neubiberg (DE)

(72) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 292 days.

(21) Appl. No.: 13/753,195

(22) Filed: Jan. 29, 2013

(65) Prior Publication Data

US 2014/0210461 A1 Jul. 31, 2014

(51) Int. Cl.
*G01R 33/07* (2006.01)
*H01L 33/00* (2010.01)
*H01L 43/04* (2006.01)
*H01L 43/06* (2006.01)

(52) U.S. Cl.
CPC .............. *H01L 43/04* (2013.01); *G01R 33/075* (2013.01); *H01L 43/065* (2013.01)

(58) Field of Classification Search
CPC .. G01R 33/07; G01R 33/0206; G01R 33/028; G01R 35/04
USPC ............. 324/251, 252, 207.2, 762.01, 762.05
See application file for complete search history.

(56) References Cited

U.S. PATENT DOCUMENTS 3,823,354 A 7/1974 Janssen
4,141,026 A * 2/1979 Bate ...................... H01L 43/065
257/426
7,782,050 B2 8/2010 Ausserlechner
8,114,694 B2 2/2012 Kim
(Continued)

FOREIGN PATENT DOCUMENTS

DE 4302342 7/1993
EP 1438755 1/2005
(Continued)

OTHER PUBLICATIONS

De Jong, Paul C., *40.1 Smart Silicon Sensors—Examples of Hall-effect Sensors*, Sensors 2002 Proceedings of IEEE, 5 pages.
(Continued)

*Primary Examiner* — Patrick Assouad
*Assistant Examiner* — Taqi Nasir
(74) *Attorney, Agent, or Firm* — Schiff Hardin LLP

(57) ABSTRACT

Vertical Hall device with highly conductive node for electrically connecting first and second Hall effect regions. A vertical Hall device comprises a first Hall effect region and a different second Hall effect region, both in a common semiconductor body. The first and second Hall effect regions have a main face and an opposite face, respectively. A highly conductive opposite face node is in ohmic contact to the opposite face of the first Hall effect region and the opposite face of the second Hall effect region in the semiconductor body. The vertical Hall device also comprises a first pair of contacts in or at the main face of the first Hall effect region and a second pair of contacts in or at the main face of the second Hall effect region. A convex circumscribing contour of the second pair of contacts is disjoint from a convex circumscribing contour of the first pair of contacts. Alternative embodiments comprise a pair of contacts and an opposite face node contact.

40 Claims, 50 Drawing Sheets

(56) References Cited

U.S. PATENT DOCUMENTS

| | | |
|---|---|---|
| 2004/0212029 A1 | 10/2004 | Boor |
| 2006/0097715 A1* | 5/2006 | Oohira .............. G01R 33/066 324/207.2 |
| 2009/0256559 A1* | 10/2009 | Ausserlechner ....... G01R 33/07 324/251 |
| 2010/0123458 A1 | 5/2010 | Schott |
| 2012/0169329 A1 | 7/2012 | Hellwig |

FOREIGN PATENT DOCUMENTS

| | | |
|---|---|---|
| JP | 1251763 | 10/1989 |
| WO | WO 2004/025742 | 3/2004 |
| WO | WO 2009/050673 | 4/2009 |
| WO | WO 2009/050673 A1 | 4/2009 |

OTHER PUBLICATIONS

Ausserlechner, Udo, *Limits of Offset Cancellation by the Principle of Spinning Current Hall Probe*, Infineon Technologies AG, 4 pages, Oct. 2004.

Vanha, Ralph, *Trench-Hall Devices*, Journal of Microelectromechanical Systems, vol. 9, No. 1, Mar. 2000, pp. 82-87.

Munter, P J A, *A Low-offset Spinning-current Hall Plate*, Sensors and Actuators, A21-A23, 1990, pp. 743-746.

* cited by examiner top view:

$$V_{12} = I * \{R_1 \| (R_2 + R_3) * \underbrace{\frac{R_3}{R_2+R_3}}_{\frac{R_1 * R_3}{R_1+R_2+R_3}} + R_5 \| (R_6 + R_7) + Si*By\}$$

$$V_{14} = I * \{\underbrace{R_5 \| (R_6 + R_7) * \frac{R_6}{R_6+R_7}}_{\frac{R_5 * R_6}{R_5+R_6+R_7}} \qquad - Sj*By\}$$

$$V_{21} = I * \{\underbrace{(R_1 + R_2) \| R_3 * \frac{R_1}{R_1+R_2}}_{\frac{R_1 * R_3}{R_1+R_2+R_3}} + R_5 \| (R_6 + R_7) - Si*By\}$$

$$V_{24} = I * \{\underbrace{R_5 \| (R_6 + R_7) * \frac{R_6}{R_6+R_7}}_{\frac{R_5 * R_6}{R_5+R_6+R_7}} \qquad - Sj*By\} = V_{14}$$

$$V_{32} = I * \{R_1 \| (R_2 + R_3) * \underbrace{\frac{R_3}{R_2+R_3}}_{\frac{R_1 * R_3}{R_1+R_2+R_3}} + R_7 \| (R_5 + R_6) + Si*By\}$$

$$V_{33} = I * \{R_5 + R_6) \| R_7 * \underbrace{\frac{R_6}{R_5+R_6}}_{\frac{R_6 * R_7}{R_5+R_6+R_7}} \qquad + Sj*By\}$$

$$V_{41} = I * \{(R_1 + R_2) \| R_3 * \underbrace{\frac{R_1}{R_1+R_2}}_{\frac{R_1 * R_3}{R_1+R_2+R_3}} + R_7 \| (R_5 + R_6) - Si*By\}$$

$$V_{43} = I * \{R_7 \| (R_5 + R_6) * \underbrace{\frac{R_6}{R_5+R_6}}_{\frac{R_6 * R_7}{R_5+R_6+R_7}} \qquad + Sj*By\} = V_{33}$$

| # | phase | | | | | | |
|---|---|---|---|---|---|---|---|
| 1 | 1 | $V_{121'} =$ | $+I \frac{R_1 R_3}{R_1 + R_2 + R_3}$ | $+I \frac{R_5(R_6+R_7)}{R_5+R_6+R_7}$ | $+IS_i B_y$ | $-I' \frac{R_1 R_{3'}}{R_{1'}+R_{2'}+R_{3'}}$ | $-I' \frac{(R_5+R_6)R_7}{R_5+R_6+R_7}$ | $+I'S_i'B_y$ |
| 2 | 1 | $-V_{143'} =$ | 0 | $-I \frac{R_5 R_6}{R_5+R_6+R_7}$ | $+IS_j B_y$ | 0 | $+I' \frac{R_6 R_7}{R_5+R_6+R_7}$ | $+I'S_j'B_y$ |
| 3 | 2 | $-V_{212'} =$ | $+I \frac{R_1 R_3}{R_1+R_2+R_3}$ | $-I \frac{R_5(R_6+R_7)}{R_5+R_6+R_7}$ | $+IS_i B_y$ | $-I' \frac{R_1 R_{3'}}{R_{1'}+R_{2'}+R_{3'}}$ | $+I' \frac{(R_5+R_6)R_7}{R_5+R_6+R_7}$ | $+I'S_i'B_y$ |
| 4 | 2 | $-V_{243'} =$ | 0 | $-I \frac{R_5 R_6}{R_5+R_6+R_7}$ | $+IS_j B_y$ | 0 | $+I' \frac{R_6 R_7}{R_5+R_6+R_7}$ | $+I'S_j'B_y$ |
| 5 | 3 | $V_{321'} =$ | $+I \frac{R_1 R_3}{R_1+R_2+R_3}$ | $+I \frac{(R_5+R_6)R_7}{R_5+R_6+R_7}$ | $+IS_i B_y$ | $-I' \frac{R_1 R_{3'}}{R_{1'}+R_{2'}+R_{3'}}$ | $-I' \frac{R_5(R_6+R_7)}{R_5+R_6+R_7}$ | $+I'S_i'B_y$ |
| 6 | 3 | $V_{334'} =$ | 0 | $-I \frac{R_6 R_7}{R_5+R_6+R_7}$ | $+IS_j B_y$ | 0 | $+I' \frac{R_5 R_6}{R_5+R_6+R_7}$ | $+I'S_j'B_y$ |
| 7 | 4 | $-V_{412'} =$ | $+I \frac{R_1 R_3}{R_1+R_2+R_3}$ | $-I \frac{(R_5+R_6)R_7}{R_5+R_6+R_7}$ | $+IS_i B_y$ | $-I' \frac{R_1 R_{3'}}{R_{1'}+R_{2'}+R_{3'}}$ | $+I' \frac{R_5(R_6+R_7)}{R_5+R_6+R_7}$ | $+I'S_i'B_y$ |
| 8 | 4 | $V_{434'} =$ | 0 | $+I \frac{R_6 R_7}{R_5+R_6+R_7}$ | $+IS_j B_y$ | 0 | $-I' \frac{R_5 R_6}{R_5+R_6+R_7}$ | $+I'S_j'B_y$ |
| 9 | A | $-V_{A21'} =$ | $-I \frac{R_1 R_2}{R_1+R_2+R_3}$ | $+I \frac{R_5 R_7}{R_5+R_6+R_7}$ | $+IS_i B_y$ | $+I' \frac{R_2 R_{3'}}{R_{1'}+R_{2'}+R_{3'}}$ | 0 | $+I'S_i'B_y$ |
| 10 | A | $V_{A43'} =$ | $+I \frac{R_2 R_3}{R_1+R_2+R_3}$ | $-I \frac{R_5 R_7}{R_5+R_6+R_7}$ | $+IS_j B_y$ | $-I' \frac{(R_1+R_2)R_{3'}}{R_{1'}+R_{2'}+R_{3'}}$ | 0 | $+I'S_j'B_y$ |
| 11 | B | $V_{B12'} =$ | $+I \frac{R_1(R_2+R_3)}{R_1+R_2+R_3}$ | $-I \frac{R_5 R_7}{R_5+R_6+R_7}$ | $+IS_i B_y$ | $-I' \frac{R_1 R_{2'}}{R_{1'}+R_{2'}+R_{3'}}$ | 0 | $+I'S_i'B_y$ |
| 12 | B | $-V_{B34'} =$ | $-I \frac{R_1 R_2}{R_1+R_2+R_3}$ | $+I \frac{R_5 R_7}{R_5+R_6+R_7}$ | $+IS_j B_y$ | $+I' \frac{R_1(R_{2'}+R_{3'})}{R_{1'}+R_{2'}+R_{3'}}$ | 0 | $+I'S_j'B_y$ |
| 13 | C | $-V_{C21'} =$ | $-I \frac{R_1 R_2}{R_1+R_2+R_3}$ | 0 | $+IS_j B_y$ | $+I' \frac{R_2 R_{3'}}{R_{1'}+R_{2'}+R_{3'}}$ | 0 | $+I'S_i'B_y$ |

FIG. 14A

| | | | | | | | | |
|---|---|---|---|---|---|---|---|---|
| 14 | C | $-V_{C34'} =$ | $-I\frac{R_1(R_2+R_3)}{R_1+R_2+R_3}$ | $-I\frac{R_5R_7}{R_5+R_6+R_7}$ | $+IS_iB_y$ | $+I'\frac{(R_1+R_2)R_3}{R_1'+R_2+R_3}$ | $+I'\frac{R_5R_7}{R_{5'}+R_{6'}+R_{7'}}$ | $+I'S_i'B_y$ |
| 15 | D | $V_{D12'} =$ | $+I\frac{R_2R_3}{R_1+R_2+R_3}$ | $0$ | $+IS_jB_y$ | $-I'\frac{R_1'R_2'}{R_1'+R_2'+R_3'}$ | $0$ | $+I'S_j'B_y$ |
| 16 | D | $V_{D43'} =$ | $+I\frac{(R_1+R_2)R_3}{R_1+R_2+R_3}$ | $+I\frac{R_5R_7}{R_5+R_6+R_7}$ | $+IS_iB_y$ | $-I'\frac{R_1'(R_{2'}+R_{3'})}{R_1'+R_{2'}+R_{3'}}$ | $-I'\frac{R_5R_7}{R_{5'}+R_{6'}+R_{7'}}$ | $+I'S_i'B_y$ |
| 17 | G | $V_{G34'} =$ | $+I\frac{R_1R_2}{R_1+R_2+R_3}$ | $0$ | $+IS_jB_y$ | $-I'\frac{R_{2'}R_{3'}}{R_1'+R_{2'}+R_{3'}}$ | $0$ | $+I'S_j'B_y$ |
| 18 | G | $V_{G43'} =$ | $+I\frac{R_1R_2}{R_1+R_2+R_3}$ | $0$ | $+IS_{jj'}B_y$ | $-I'\frac{R_{2'}R_{3'}}{R_1'+R_{2'}+R_{3'}}$ | $0$ | $+I'S_{jj'}B_y$ |
| 19 | H | $V_{H12'} =$ | $0$ | $+I\frac{R_5R_6}{R_5+R_6+R_7}$ | $+IS_iB_y$ | $0$ | $+I'\frac{R_{6'}R_{7'}}{R_{5'}+R_{6'}+R_{7'}}$ | $+I'S_i'B_y$ |
| 20 | H | $V_{H21'} =$ | $0$ | $+I\frac{R_5R_6}{R_5+R_6+R_7}$ | $+IS_{jj'}B_y$ | $0$ | $+I'\frac{R_{6'}R_{7'}}{R_{5'}+R_{6'}+R_{7'}}$ | $+I'S_{jj'}B_y$ |
| 21 | I | $-V_{I34'} =$ | $-I\frac{R_2R_3}{R_1+R_2+R_3}$ | $-I\frac{R_6R_7}{R_5+R_6+R_7}$ | $+IS_iB_y$ | $+I'\frac{R_1'R_{2'}}{R_1'+R_{2'}+R_{3'}}$ | $+I'\frac{R_{6'}R_{7'}}{R_{5'}+R_{6'}+R_{7'}}$ | $+I'S_i'B_y$ |
| 22 | I | $-V_{I43'} =$ | $-I\frac{R_2R_3}{R_1+R_2+R_3}$ | $-I\frac{R_6R_7}{R_5+R_6+R_7}$ | $+IS_{jj'}B_y$ | $+I'\frac{R_1'R_{2'}}{R_1'+R_{2'}+R_{3'}}$ | $+I'\frac{R_{6'}R_{7'}}{R_{5'}+R_{6'}+R_{7'}}$ | $+I'S_{jj'}B_y$ |
| 23 | J | $-V_{J12'} =$ | $+I\frac{R_1R_2}{R_1+R_2+R_3}$ | $-I\frac{R_5R_6}{R_5+R_6+R_7}$ | $+IS_iB_y$ | $-I'\frac{R_1R_2}{R_1'+R_2+R_3}$ | $+I'\frac{R_5R_6'}{R_{5'}+R_{6'}+R_{7'}}$ | $+I'S_i'B_y$ |
| 24 | J | $-V_{J21'} =$ | $-I\frac{R_2R_3}{R_1+R_2+R_3}$ | $-I\frac{R_5R_6}{R_5+R_6+R_7}$ | $+IS_iB_y$ | $+I'\frac{R_{2'}R_{3'}}{R_1'+R_{2'}+R_{3'}}$ | $+I'\frac{R_5R_6'}{R_{5'}+R_{6'}+R_{7'}}$ | $+I'S_i'B_y$ |
| 25 | 9 | $V_{912'} =$ | $+I\frac{R_1R_2}{R_1+R_2+R_3}$ | $-I\frac{R_6R_7}{R_5+R_6+R_7}$ | $+IS_iB_y$ | $-I'\frac{R_1R_2}{R_1'+R_2+R_3}$ | $-I'\frac{R_{6'}R_{7'}}{R_{5'}+R_{6'}+R_{7'}}$ | $+I'S_i'B_y$ |
| 26 | 9 | $V_{921'} =$ | $-I\frac{R_2R_3}{R_1+R_2+R_3}$ | $+I\frac{R_6R_7}{R_5+R_6+R_7}$ | $+IS_iB_y$ | $-I'\frac{R_{2'}R_{3'}}{R_1'+R_{2'}+R_{3'}}$ | $-I'\frac{R_{6'}R_{7'}}{R_{5'}+R_{6'}+R_{7'}}$ | $+I'S_i'B_y$ |
| 27 | F | $V_{F21'} =$ | $+I\frac{R_2R_3}{R_1+R_2+R_3}$ | $+I\frac{R_5R_6}{R_5+R_6+R_7}$ | $-IS_iB_y$ | $-I'\frac{R_1R_2}{R_1'+R_2+R_3}$ | $+I'\frac{R_5R_6'}{R_{5'}+R_{6'}+R_{7'}}$ | $-I'S_i'B_y$ |

FIG 14B

Phase A:
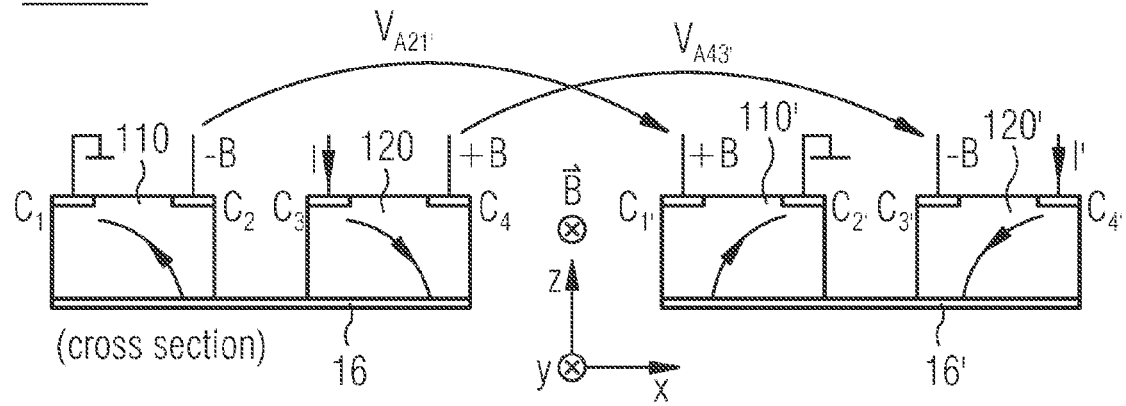
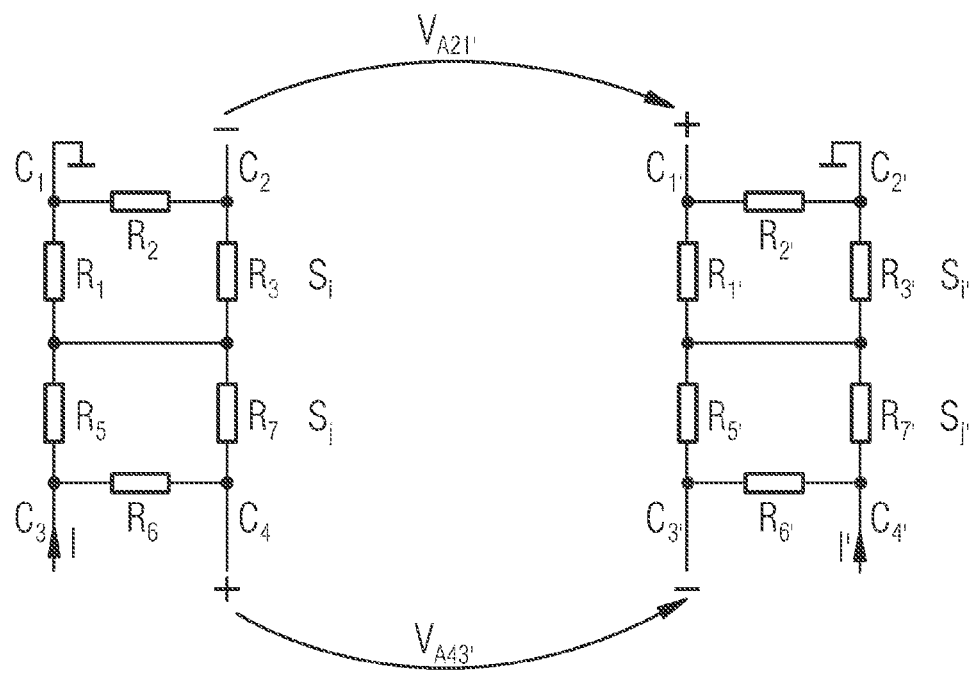
$$V_{A21'} = I \cdot [R_1 \| (R_2+R_3) \cdot \frac{R_2}{R_2+R_3} - S_i \cdot B_y] -$$
$$- I' \cdot [R_{3'} \| (R_{1'}+R_{2'}) \cdot \frac{R_{2'}}{R_{1'}+R_{2'}} + S_{i'} \cdot B_y]$$
$$V_{A43'} = I \cdot [R_5 \| (R_6+R_7) \cdot \frac{R_7}{R_6+R_7} + R_1 \| (R_2+R_3) + S_i \cdot B_y] -$$
$$- I' \cdot [R_{7'} \| (R_{5'}+R_{6'}) \cdot \frac{R_{5'}}{R_{5'}+R_{6'}} + R_{3'} \| (R_{1'}+R_{2'}) - S_{i'} \cdot B_y]$$
FIG 24

Phase G:
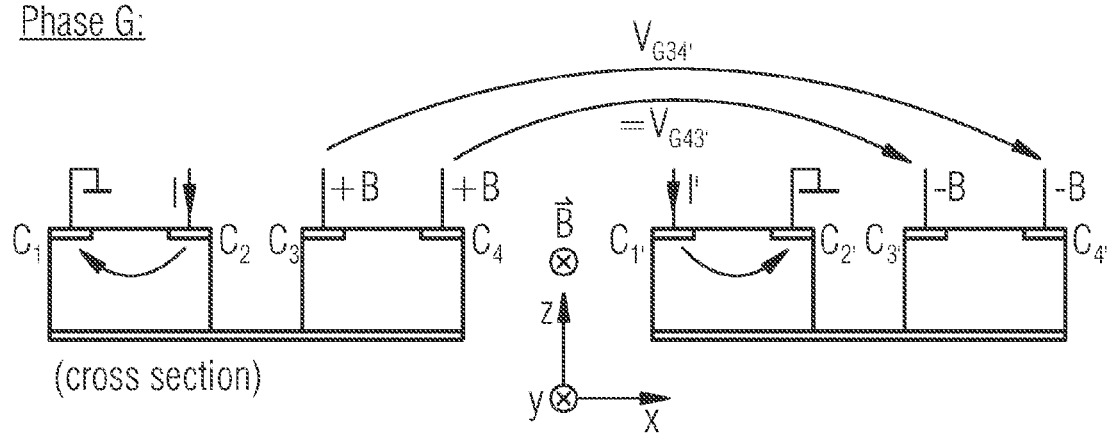
(cross section)
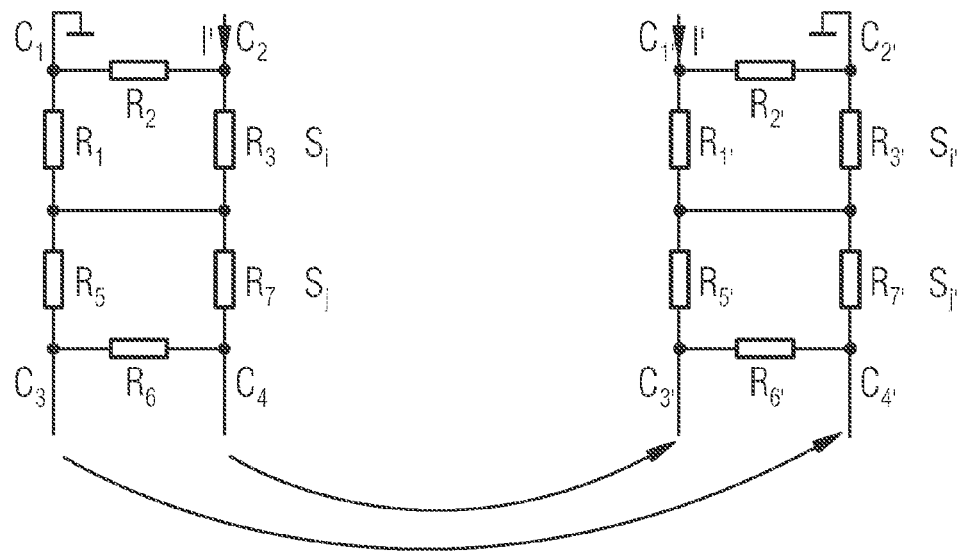
$$V_{G34'} = V_{G43'} = I \cdot [R_2 \| (R_1 + R_3) \cdot \frac{R_1}{R_1 + R_3} + S_{ij} \cdot B_y] -$$
$$- I' \cdot [R_{2'} \| (R_{1'} + R_{3'}) \cdot \frac{R_{3'}}{R_{1'} + R_{3'}} - S_{ij'} \cdot B_y]$$
FIG 28

Phase I:
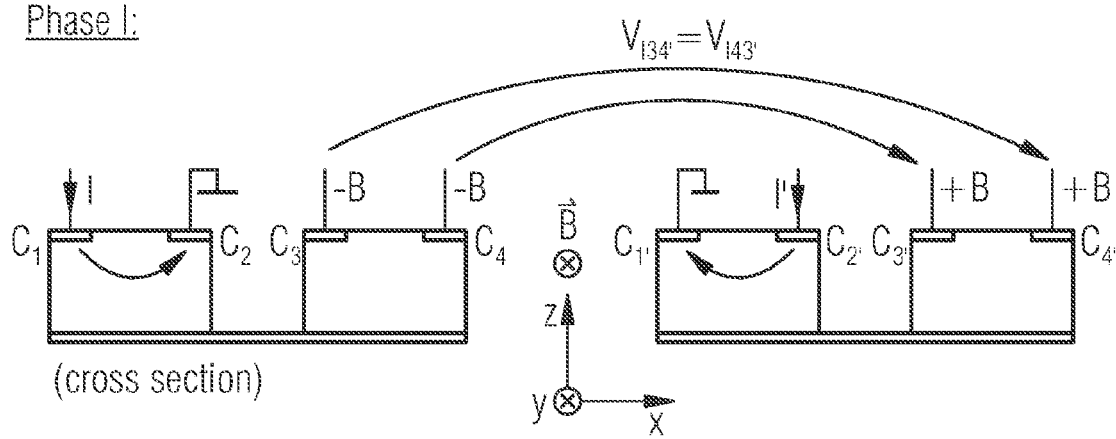
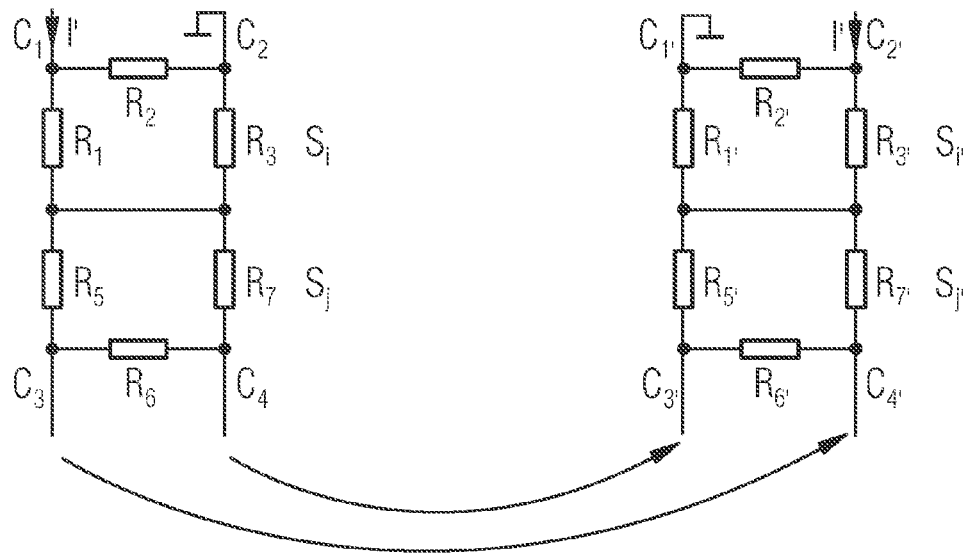
$$V_{I34'} = V_{I43'} = I \cdot [R_2 \mid\mid (R_1 + R_3) \cdot \frac{R_3}{R_1 + R_3} - S_{ji} \cdot B_y] -$$
$$- I' \cdot [R_{2'} \mid\mid (R_{1'} + R_{3'}) \cdot \frac{R_{1'}}{R_{1'} + R_{3'}} + S_{ji'} \cdot B_y]$$
FIG 30

Phase J:
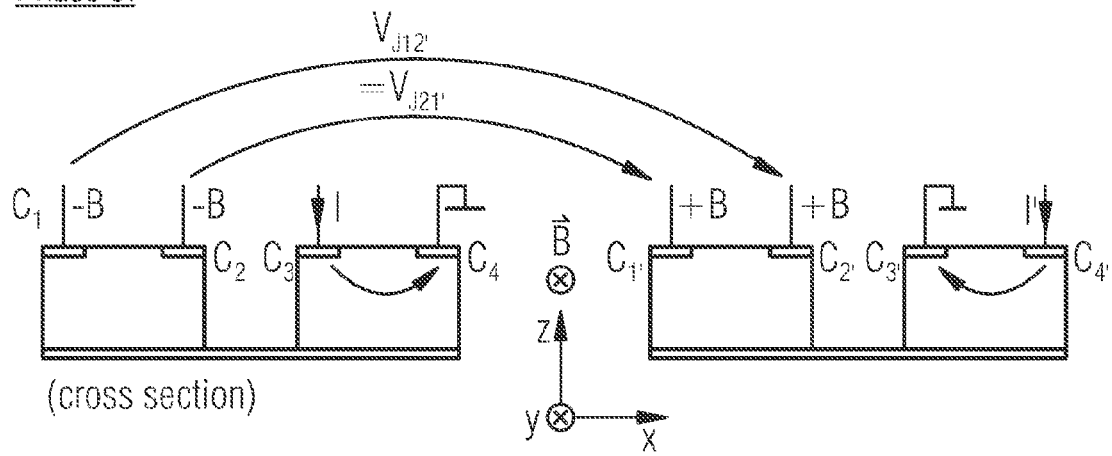
(cross section)
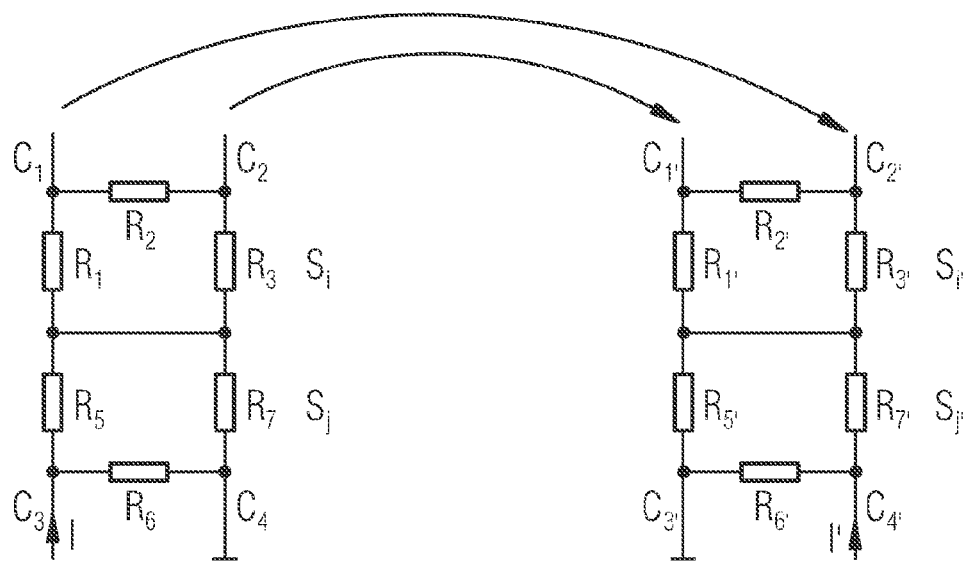
$$V_{j12'} = V_{j21'} = I \cdot [R_6 \| (R_5+R_7) \cdot \frac{R_7}{R_5+R_7} - S_{ji} \cdot B_y] -$$
$$- I' \cdot [R_{6'} \| (R_{5'}+R_{7'}) \cdot \frac{R_{5'}}{R_{5'}+R_{7'}} + S_{ji'} \cdot B_y]$$
FIG 31 phase 9:

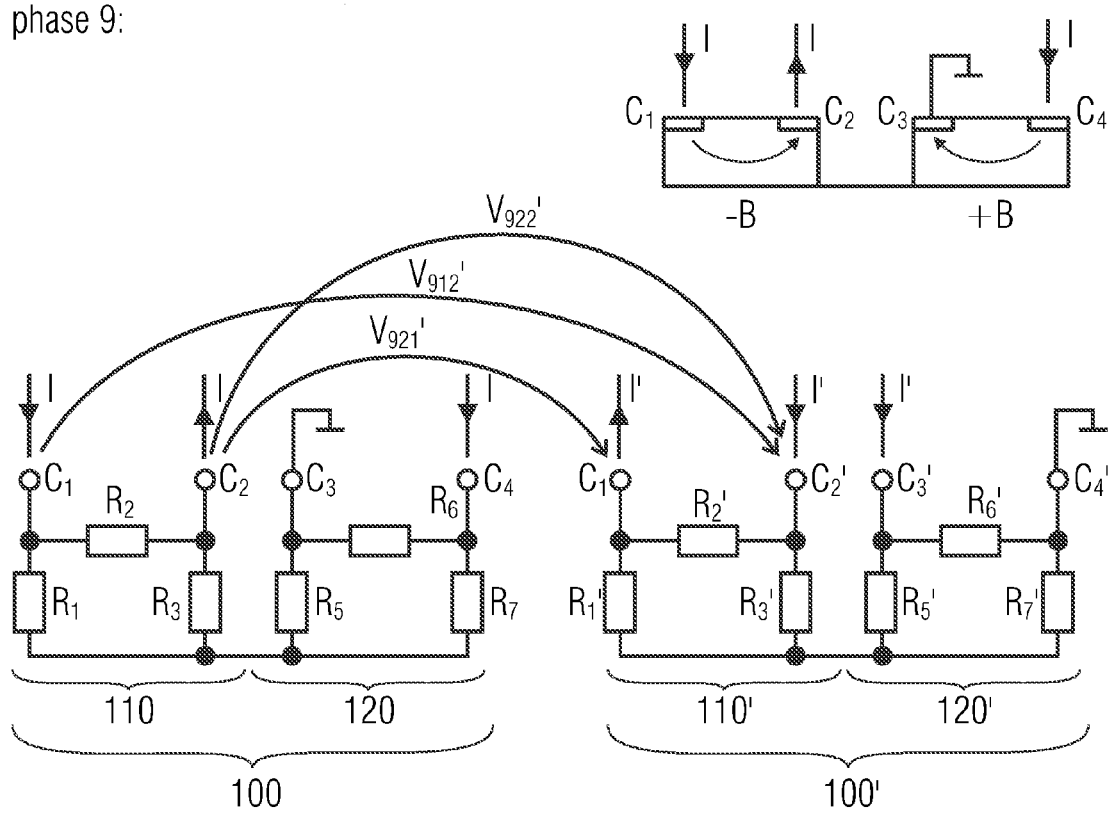

$$V_{912}' = I * R_6 \| (R_5 + R_7) * \frac{R_5}{R_5 + R_7} + I * R_2 \| (R_1 + R_3) * \frac{R_1}{R_1 + R_3} - I * S_{ij} * B -$$

$$- I' * R_6' \| (R_5' + R_7') * \frac{R_7'}{R_5' + R_7'} - I' * R_2' \| (R_1' + R_3') * \frac{R_3'}{R_1' + R_3'} - I' * S_{ij}' * B$$

$$V_{921}' = I * R_6 \| (R_5 + R_7) * \frac{R_5}{R_5 + R_7} - I * R_2 \| (R_1 + R_3) * \frac{R_3}{R_1 + R_3} - I * S_{ij} * B -$$

$$- \{ I' * R_6' \| (R_5' + R_7') * \frac{R_7'}{R_5' + R_7'} - I' * R_2' \| (R_1' + R_3') * \frac{R_1'}{R_1' + R_3'} + I' * S_{ij}' * B \}$$

$$V_{922}' = I * R_6 \| (R_5 + R_7) * \frac{R_5}{R_5 + R_7} - I * R_2 \| (R_1 + R_3) * \frac{R_3}{R_1 + R_3} - I * S_{ij} * B -$$

$$- \{ I' * R_6' \| (R_5' + R_7') * \frac{R_7'}{R_5' + R_7'} + I' * R_2' \| (R_1' + R_3') * \frac{R_3'}{R_1' + R_3'} - I' * S_{ij}' * B \}$$

FIG 32 phase F:

$$V_{F21}' = I * \{R_6 \| (R_5+R_7) * \frac{R_7}{R_5+R_7} + R_2\|(R_1+R_3) \frac{R_3}{R_1+R_3} + S_i * B\} -$$

$$- I' * \{R_6'\|(R_5'+R_7') * \frac{R_5'}{R_5'+R_7'} + R_2'\|(R_1'+R_3') \frac{R_1'}{R_1'+R_3'} - S_i' * B\}$$

phase 5:

$$V_{544'} = I * R_5 \|(R_6 + R_7) * \frac{R_6}{R_6+R_7} - I' * R_5'\|(R_6' + R_7') * \frac{R_6'}{R_6'+R_7'} =$$

$$= I * \frac{R_5 * R_6}{R_5+R_6+R_7} \quad - \quad I' * \frac{R_5' * R_6'}{R_5'+R_6'+R_7'}$$

phase 6:

$$V_{633'} = I * R_7 \|(R_5 + R_6) * \frac{R_6}{R_5+R_6} - I' * R_7'\|(R_5' + R_6') * \frac{R_6'}{R_5'+R_6'} =$$

$$= I * \frac{R_6 * R_7}{R_5+R_6+R_7} \quad - \quad I' * \frac{R_6' * R_7'}{R_5'+R_6'+R_7'}$$

phase 7:

$$V_{744'} = I * R_5 \| (R_6 + R_7) * \frac{R_7}{R_6 + R_7} - I' * R_5' \| (R_6' + R_7') * \frac{R_7'}{R_6' + R_7'} =$$

$$= I * \frac{R_5 * R_7}{R_5 + R_6 + R_7} \quad - \quad I' * \frac{R_5' * R_7'}{R_5' + R_6' + R_7'}$$

phase 8:

$$V_{833'} = I * R_7 \| (R_5 + R_6) * \frac{R_5}{R_5 + R_6} - I' * R_7' \| (R_5' + R_6') * \frac{R_5'}{R_5' + R_6'} =$$

$$= I * \frac{R_5 * R_7}{R_5 + R_6 + R_7} \quad - \quad I' * \frac{R_5' * R_7'}{R_5' + R_6' + R_7'}$$

phase E:

$$V_{E34'} = I * \{R_2 \| (R_1+R_3) * \frac{R_1}{R_1+R_3} + R_6\|(R_5+R_7)\frac{R_5}{R_5+R_7} - S_i * B\} -$$

$$- I' * \{R_2'\|(R_1'+R_3') * \frac{R_3'}{R_1'+R_3'} + R_6'\|(R_5'+R_7')\frac{R_7'}{R_5'+R_7'} + S_i' * B\}$$

VERTICAL HALL DEVICE WITH HIGHLY CONDUCTIVE OPPOSITE FACE NODE FOR ELECTRICALLY CONNECTING FIRST AND SECOND HALL EFFECT REGIONS

TECHNICAL FIELD

Embodiments relate to a vertical Hall device. Further embodiments relate to a method for sensing a magnetic, field parallel to a surface of a semiconductor body. Further embodiments relate to a four-contact vertical Hall device with highly conductive buried layer. Further embodiments relate to a method to operate the four-contact vertical Hall device with highly conductive buried layer. Further embodiments relate to a three-contact vertical Hall device with buried-layer contact.

BACKGROUND

Hall devices are sensors that respond to a magnetic field. They typically suffer from offset error: the offset error is a non-vanishing output signal at zero applied magnetic field. Vertical Hall devices (VHall) mainly respond to a magnetic field parallel to the surface of the substrate.

A number of different designs of vertical Hall devices are known, yet many of them are not apt for the so-called spinning current method (or achieve only poor offset-cancelling performance) and suffer from low magnetic sensitivity and large electric fields. Typically, several contacts are placed on the surface of the substrate in such a way that current can flow in semicircles between two supply contacts while a sense contact is placed between these supply contacts and taps the Hall voltage that is generated by the current diving underneath the sense contact.

Depending on the electronic devices to be manufactured and/or the semiconductor manufacturing technology, a highly conductive, buried layer may be present within the semiconductor substrate. A buried layer is a heavily doped region of the opposite conductivity type as the substrate. The buried layer is placed beneath the active device regions by ion implantation. Both the doping and damage characteristics of the buried layer influence device performance. Buried layer substrates may be formed by, for example, high-energy implantation and rapid thermal annealing. When a buried layer is present within the semiconductor substrate, this typically limits the available depth of a Hall effect region of a vertical Hall device.

SUMMARY

Embodiments provide a vertical Hall device that comprises a first Hall effect region and a second Hall effect region different from the first Hall effect region. Both Hall effect regions are in a common semiconductor body. The first Hall effect region and the second Hall effect region have a main face and an opposite face, respectively. The vertical Hall device further comprises a highly conductive opposite face node in ohmic contact to the opposite face of the first Hall effect region and the opposite face of the second Hall effect region in the semiconductor body. The vertical Hall device also comprises a first pair of contacts in or at the main face of the first Hall effect region. A second pair of contacts is in or at the main face of the second Hall effect region. A convex circumscribing contour of the second pair of contacts is disjoint from a convex circumscribing contour of the first pair of contacts.

Further embodiments provide, a sensing arrangement comprising a vertical Hall device and a further vertical Hall device. The vertical Hall device and the further vertical Hall device comprise, respectively: a first Hall effect region, a second Hall effect region, a highly conductive opposite face node, a first pair of contacts, and a second pair of contacts. The second Hall effect region is different from the first Hall effect region, and both Hall effect regions are in a common, semiconductor body. The first and second Hall effect regions have a main face and an opposite face, respectively. The highly conductive opposite face node is in ohmic contact to the opposite faces of the first Hall effect region and of the second Hall effect region in the semiconductor body. The first pair of contacts is provided in or at the main face of the first. Hall effect region. The second pair of contacts is provided in or at the main face of the second Hall effect region. A convex circumscribing contour of the second pair of contacts is disjoint from a convex circumscribing contour of the first pair of contacts. The highly conductive opposite face nodes of the vertical Hall device and the further vertical Hall device are not in ohmic contact with each other.

According to further embodiments, a method for sensing a magnetic field parallel to a face of a semiconductor body comprises connecting an electrical energy source to a vertical Hall device causing an electric current therein. The vertical Hall device comprises a first Hall effect region with a main face and an opposite face within a semiconductor body, a second Hall effect, region with a main face and an opposite face within the semiconductor body, and a highly conductive opposite face node in ohmic contact to the opposite faces of both the first and second Hall effect regions. A first pole of the electrical energy source is connected to a first contact belonging to a first pair of contacts in or at the main face of the first Hall effect region. A second pole of the electrical energy source is connected to a second contact belonging to a second pair of contacts in or at the main face of the second Hall effect region so that a significant portion of the electric current flows from the first contact via the first Hall effect region, through the highly conductive node, and the second Hall effect region to the second contact, or in opposite direction. The method further comprises sensing at least one sense signal at a third contact belonging to one of the first pair of contacts and the second pair of contacts.

Further embodiments provide a method for sensing a magnetic field parallel to a face of a semiconductor body using a sensing arrangement comprising two vertical Hall devices. Each vertical Hall device comprises a first Hall effect region and a second Hall effect region in the semiconductor body, the first Hall effect regions having a main face and an opposite face and the second Hall effect region having a main face and an opposite face. Each vertical Hall device further comprises a highly conductive opposite face node in ohmic contact to the opposite face of the first Hall effect region and the opposite face of the second Hall effect region in the semiconductor body. Furthermore, each vertical Hall device also comprises a first pair of contacts in or at the main face of the first Hall effect region, wherein a distance of the contacts of the first pair is smaller than twice a depth of the second Hall effect region. A second pair of contacts is provided in or at the main face of the second Hall effect region, wherein a distance of the contacts of the second pair is smaller than twice a depth of the second Hall effect region. The highly conductive opposite face nodes of both vertical Hall devices are not in ohmic contact with each other. The method comprises three, six, nine, or twelve clock phases per spinning current cycles of a spinning current scheme, wherein each clock phase comprises: connecting a clock phase-specific first contact of each vertical Hall device to a reference potential and applying a voltage relative to the reference potential or injecting an electric current at a clock phase-specific second contact of each vertical Hall device. Each clock phase further comprises: sensing signals at the two remaining contacts per vertical Hall device, wherein of these remaining contacts those contacts whose signals increase with an applied magnetic field for a given clock phase are called positive sense contacts for said clock phase, and those contacts whose signals decrease with the applied magnetic field for said clock phase are called negative sense contacts. After completion of the spinning current cycle a total output signal is derived in such a way that it corresponds to the sum of the signals of positive sense contacts in the various clock phases minus the sum of the signals of negative sense contacts in the various clock phases.

According to further embodiments, a vertical Hall device comprises a Hall effect region in a semiconductor body, wherein the Hall effect region has a main face and an opposite face. A highly conductive opposite face node is in ohmic contact to the opposite face of the Hall effect region in the semiconductor body. The vertical Hall device further comprises a pair of contacts in or at the main face of the Hall effect region and an opposite face node contact in or at the main face of the Hall effect region. A resistance between the opposite face node contact and the highly conductive opposite face node is smaller than a resistance between any contact of the pair of contacts and the highly conductive opposite face node.

BRIEF DESCRIPTION OF THE DRAWINGS

Embodiments will be described using the accompanying Figures, in which:

FIG. 31 shows an equivalent circuit diagram of a vertical Hall device similar to the one shown in FIGS. 7 and 8 during a phase 3 of a spinning current scheme, as well as corresponding calculations.

FIGS. 14A and 14B show a table of the equations of the sense signals in 14 different clock phases.

FIG. 24 shows a schematic cross section and an equivalent circuit diagram of a double-device vertical Hall sensor similar to the one shown in FIG. 13E during a phase A of the spinning current scheme.

FIG. 28 shows a schematic cross section and an equivalent circuit diagram of a double-device vertical Hall sensor similar to the one shown in FIG. 13K during a phase G of the spinning current scheme.

FIG. 30 shows a schematic cross section and an equivalent circuit diagram of a double-device vertical Hall sensor similar to the one shown in FIG. 13M during a phase I of the spinning current scheme.

FIG. 31 shows a schematic cross section and an equivalent circuit diagram of a double-device vertical Hall sensor similar to the one shown in FIG. 13N during a phase J of the spinning current scheme.

FIG. 32 shows a schematic cross section and an equivalent circuit diagram of a double-device vertical Hall sensor during a phase 9 of the spinning current scheme.

DETAILED DESCRIPTION

Before the following embodiments will be described in detail using the accompanying Figures, it is to be pointed out that the same elements or elements having the same functionality are provided with the same or similar reference numbers and that a repeated description of elements provided with the same or similar reference numbers is typically omitted. Hence, these options provided for elements having the same or similar reference numbers are mutually exchangeable. In the following description, a plurality of details are set forth to provide a more thorough explanation of embodiments. However, it wilt be apparent to one skilled in the art that embodiments may be practiced without these specific details. In other instances, well-known structures and devices are shown in block diagram form rather than in detail in order to avoid obscuring embodiments. In addition, features of the different embodiments described hereinafter may be combined with each other, unless specifically noted otherwise.

Figure 1:
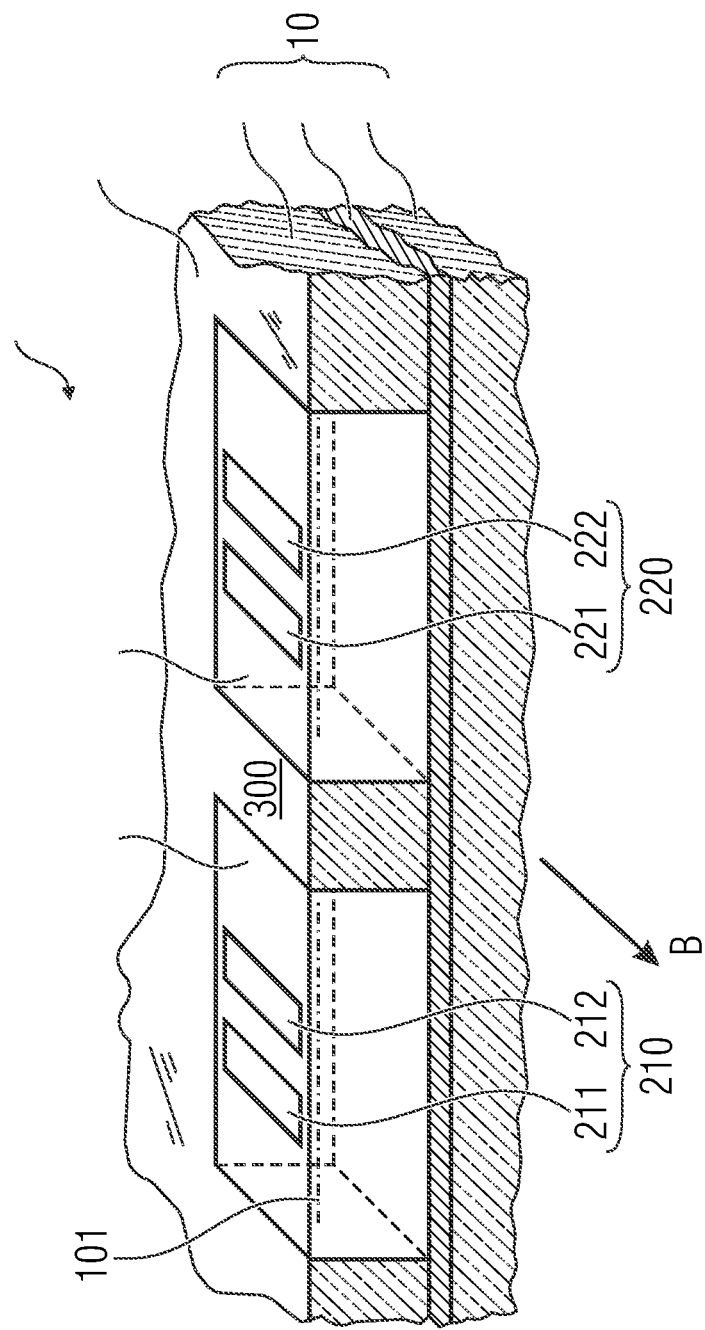
FIG. 1 shows a schematic, perspective cross-section of a vertical Hall device comprising two Hall effect regions and a highly conductive opposite face node.

FIG. 1 shows a schematic, perspective cross-section of a vertical Hall device 100 comprising two Hall effect regions 110, 120, two pairs of contacts 210, 220, and a highly conductive opposite face node 16. The vertical Hall device 100 is in particular intended for sensing a magnetic field B or a component of a magnetic field B that is parallel to a surface 11, of a semiconductor body 10 and substantially perpendicular to a longitudinal axis of the two Hall effect regions 110 and 120. Nevertheless, other uses of the vertical Hall device 100 are not excluded.

The vertical Hall device 100 comprises the first Hall effect region 110 and the second Hall effect region 120 which are formed or located in a semiconductor body 10. The first and second Hall effect regions 110, 120 are different from each other (for example, according to the meaning of "different" in set theory, that is, disjoint: both regions 110, 120 have no intersection region). The vertical Hall device 100 further comprises the highly conductive opposite face node 16 which is in ohmic contact to the bottom of the first Hall effect region 110 and the second Hall effect region 120 in the semiconductor body 10. The highly conductive face node 16 is at the bottom of both Hall effect regions 110, 120 which is opposite to the top of both Hall effect regions, where the contacts 211, 212, 221, 222 are located. As long as the contacts are accessible it is irrelevant which of both contacts and opposite face node is on bottom or top—the relevant aspect is that the highly conductive opposite face node is at the opposite face of the Hall effect regions than the contacts. In the example shown in FIG. 1, the highly conductive opposite face node 16 is a highly conductive layer which, is considered to be a part of the semiconductor body 10 and sandwiched between an upper semiconductor layer 14 and a lower semiconductor layer 18. The upper semiconductor layer 14 can be, for example, an epitaxial layer. The lower semiconductor layer 18 may be, for example, a bulk material of a semiconductor device. With "ohmic contact" between two regions we mean that within operation conditions of the device there is at least an approximately linear relationship between voltage drop across the contact and current through the contact. An example for such an ohmic contact as it is used in the following is an n+S/D diffusion within an n-epitaxial layer. Another example is an n-epitaxial layer above an n-buried layer. So typically regions of the same doping type are in ohmic contact. Conversely, regions of opposite doping type are not ohmic contacts. Examples for non-ohmic contacts are pn-junctions or Schottky-junctions through which notable current flows only if a voltage of at least (several) hundred millivolts is applied with a proper polarity.

The vertical Hall device 100 further comprises a first pair of contacts 210 in the first Hall effect region 110, or at a surface of the first Hall effect region 110. The first pair of contacts 210 comprises the contacts 211 and 212. A distance of the contacts 211 and 212 of the first pair of contacts 210 is preferably smaller than a depth of the first Hall effect region 110, or, according to other embodiments, smaller than twice this depth.

The vertical Hall device 100 also comprises a second pair of contacts 220 in the second Hall effect region 120, or at a surface of the second Hall effect region 120. The second pair of contacts 220 comprises the contacts 221 and 222. A distance of the contacts 221 and 222 of the second pair of contacts 220 is preferably smaller than a depth of the second Hall effect region 120, or, according to other embodiments, smaller than twice this depth. A convex circumscribing contour of the second pair 220 of contacts is disjoint from a convex circumscribing contour of the first pair 210 of contacts. This may also be expressed as follows: A straight line between any two points within the contacts of the first pair 210 of contacts does not contain any point within the contacts of the second pair 220 of contacts, and a straight line between any two points within the contacts of the second pair 220 of contacts does not contain any point within the contacts of the first pair 210 of contacts. In some embodiments, the distance of the contacts of the first pair 210 of contacts and the distance of the contacts of the second pair 220 of contacts may be smaller than a distance of the first pair 210 of contacts and the second pair 220 of contacts.

The vertical Hall device 100 further comprises isolation means 300 between the first Hall effect region 110 and the second Hall effect region 120. In the example illustrated in FIG. 1, the isolation means 300 are implemented as a separation of the first Hall effect region 110 and the second Hall effect region 120. The isolation means 300 may be a portion of the upper layer 14 of the semiconductor body 10 which has for example another doping type than the first and second Hall effect regions 110, 120. Alternatively the isolation means 300 may have the same doping type as the Hall effect regions. In this case it can have a lower doping concentration and hence a lower conductivity than the Hall effect regions, if the isolation 300 has the same doping type as the Hall effect region, isolation could alternatively be provided by a relatively large distance between the first and second Hall effect regions 110, 120. Alternatively isolation can also be provided by an isolating trench between the Hall effect regions 110, 120. A number of other implementations options exist for the isolation means 300, some of which will be illustrated and explained below in more detail.

The vertical Hall device 100 can typically be operated as follows. An electric current is injected in one of the two Hall effect regions 110, 120, say the first Hall effect region 110 via one of the contacts 211, 212. The other contact is typically connected to a circuit having a high input resistance so that substantially no electric current can flow into or out of the first Hall effect region 110 via said other contact. To give an example, let us assume that the electric current is injected into the first Hall effect region 110 via contact 211 and extracted from the second Hall effect region 120 via contact 221. The contacts 212 and 222 are connected to one or more circuits having a high input resistance so that substantially no electric current flows into or out of the first and second Hall effect regions 110, 120 via the contacts 212, 222. The electric potential of the two contacts 212, 222 may be assumed to be "floating", in the subsequent description, the expression "floating contact" may be used to refer to contacts that are not connected to any circuit element at all left, in open circuit, or connected to a circuit having a high input resistance. The electric current that is injected at contact 211 flows towards the highly conductive opposite face node 16 according to a current distribution within the first Hall effect region 110. Indeed, the isolation means 300 are so configured so that at least 50% of a total electric current flowing from the first Hall effect region 110 to the second Hall effect region 120, or vice versa, flow via the highly conductive opposite face node 16. The electric current then flows along the highly conductive opposite face node 16 to the right in FIG. 1, i.e., towards the second Hall effect region 120. Beneath the second Hall effect region 120, the electric current leaves the highly conductive opposite face node 16 and flows through the second Hall effect region 120 towards the contact 221 of the second pair of contacts 220, according to a current density distribution within the second Hall effect region 120. The current distribution within the first Hall effect region 110 causes the contact 212 to be at a specific electrical potential. In a similar manner, the current distribution within the second Hall effect region 120 causes the contact 222 to be at a specific electrical potential. A magnetic field B or a component of a magnetic field 8 parallel to the arrow in FIG. 1 has an influence on the current distribution within the two Hall effect regions 110 and 120. This influence of the magnetic field (component) also influences the electrical potentials at the contacts 212 and 222. Thus, a magnitude and a sign of the magnetic field (component) B parallel to the arrow in FIG. 1 can be determined or at least estimated from observing and evaluating at least one of the electrical, potentials of the contacts 212 and/or 222.

In the example schematically illustrated in FIG. 1, the four contacts 211, 212, 221, and 222 are arranged along a common line, in the present case parallel to the longitudinal axis of the vertical Hall device 100. The first pair of contacts 210 is symmetrical to the second pair of contacts 220 with respect to a symmetry plane that is orthogonal to the surface 11 of the semiconductor body 10 and parallel to the direction of the magnetic field (component) B to be sensed. Furthermore, each of the first pair of contacts 210 and the second pair of contacts 220 is symmetrical with respect to itself and to its corresponding Hall effect region 110, 120. A first symmetry plane is perpendicular to the surface 11 of the semiconductor body 10 and parallel to the longitudinal axis 101 of the vertical Hall device 100. The second symmetry-plane is also perpendicular to the surface 11 of the semiconductor body 10 and perpendicular to the longitudinal axis 101 of the vertical Hall device 100. This second symmetry plane extends between the contacts 211 and 212 for the first pair of contacts 210 and the first Hall effect region 110. For the second pair of contacts 220 and the second Hall effect region 120 this second symmetry plane extends in the middle between the contacts 221 and 222. The contacts of the first pair 210 and the contacts of the second pair 220 can be regarded as being arranged symmetrically with respect to a geometric union of the first and second Hall effect regions 110, 120.

In the vertical Hall device 100 shown in FIG. 1, the distance of the contacts 211, 212 of the first pair 210 is substantially equal to the distance of the contacts 221, 222 of the second pair 220. According to alternative embodiments, the distance of the contacts of the first pair 210 may differ from the distance of the contacts of the second pair 220 by a certain amount, for example by at most 10% or by at most 5%. In a similar manner, the size and the shape of the contacts the first pair of contacts 210 is substantially identical to the size and the shape of the contacts of the second pair of contacts 220 in the example illustrated in FIG. 1. However, in alternative embodiments, at least one of a size and a shape of the first pair of contacts 210 may differ from a size and a shape of the second pair of contacts 220 by a certain amount, for example by at most 10% or by at most 5%. In the alternative or in addition, at least one of a size and a shape of the first Hall effect region 110 can differ from a size and a shape of the second Hall effect region 120 by a certain amount, for example by at most 10% or 5%, according to some further embodiments. Still more generally, the second Hall effect region 120 and the second pair of contacts 220 could be rotated by 90 degrees so that it would react to a magnetic field rotated by 90 degrees instead of the depicted magnetic field. In this case, the vertical Hall device 100 could not have a preference direction (longitudinal direction) anymore, but two equitable directions that are orthogonal to each other and lie in the chip plane, i.e. are parallel to surface 11.

In other words. FIG. 1 and also at least some of the subsequent figures show a highly symmetric vertical Hall device 100 with four contacts 211, 212, 221, 222 and a highly conductive opposite face layer 16. Without excluding other options or implementations, the vertical Hall device 100 is especially suited for semiconductor technologies with a n-type buried layer (nBL) acting as the highly conductive opposite face layer 16. The vertical Hall device 100 can offer high magnetic sensitivity. Furthermore, the vertical Hall device 100 can be operated according to a kind of spinning current method that may greatly suppress the offset. The highly conductive opposite face node 16 is illustrated in FIG. 1 as a layer that is two-dimensional and parallel to the surface 11, but it could, in the alternative, have a line shape, strip shape, dot shape, circular shape, etc., as well. However, it is advantageous if the highly conductive opposite face node covers the footprint of both contacts 211, 212 (i.e. it is so large that the projection of 211 and 212 is fully within the highly conductive opposite face node). This minimizes the voltage drop along the current streamlines, which flow from the Hall region into the highly conductive opposite face node. The two-dimensional character of the highly conductive opposite face node cause a substantially location-independent electric potential at the opposite faces of the first and second Hall effect regions. In this manner, the current lines pass efficiently—i.e., with minimal voltage drop—from the Hall effect region to highly conductive opposite face node 16. In contrast, a point-like opposite face node would result in wasted voltage which would be suboptimal.

Figure 2:
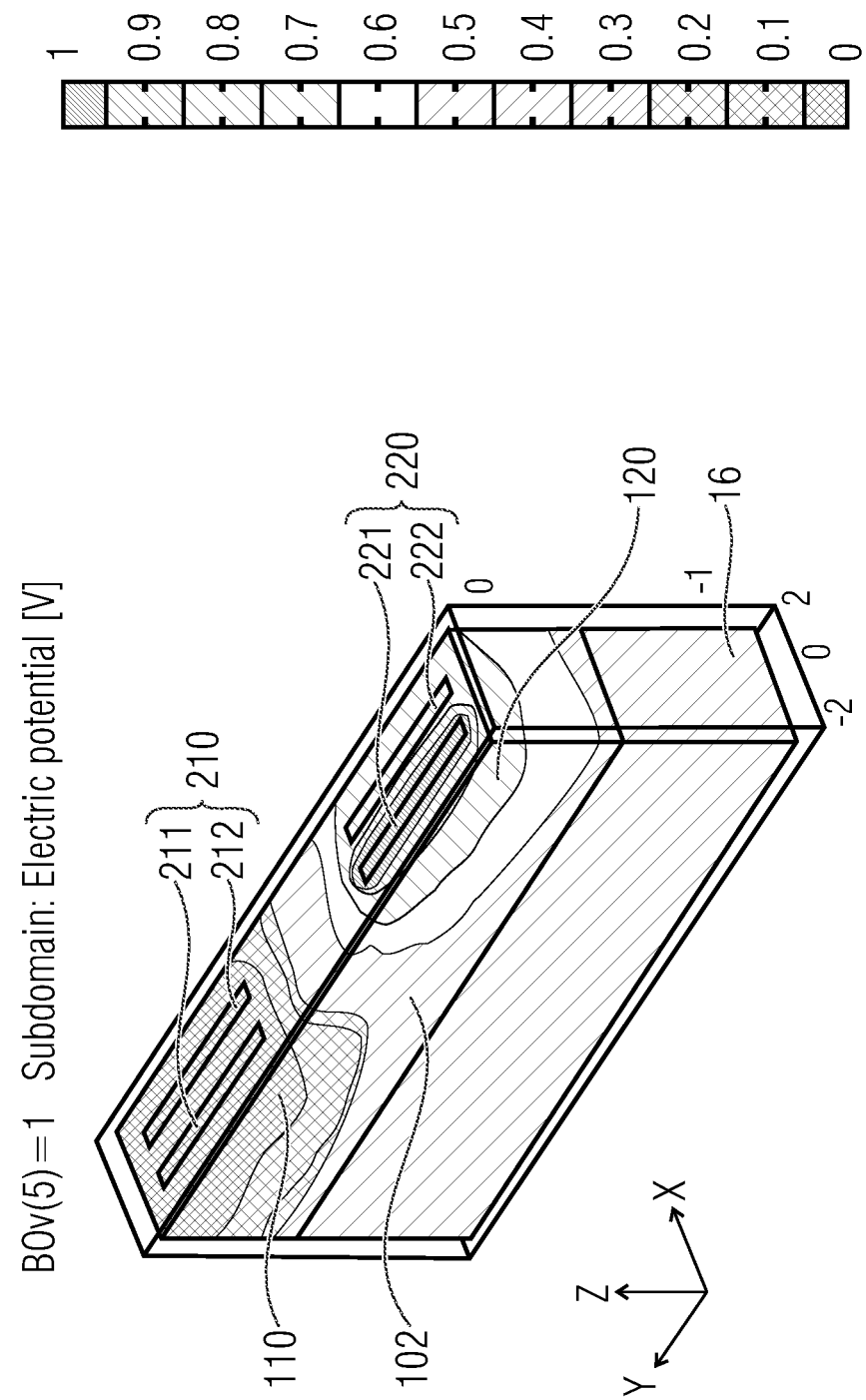
FIG. 2 shows in a perspective view a result of a numerical simulation of the electric potential in a vertical Hall device with a highly conductive opposite face node comprising two pairs of contacts arranged in a rectangular manner.

FIG. 2 shows a perspective view of the First Hall effect region 110 and a second Hall effect region 120 different from the first Hall effect region 110, both Hall effect regions in a common semiconductor body. The first Hall effect region 110 and the second Hall effect region 120 have a main face and an opposite face, respectively. FIG. 2 also shows the highly conductive opposite face node 16 of a vertical Hall device. The vertical Hall device schematically shown in FIG. 2 differs from the vertical Hall device 100 from FIG. 1 in that the contacts 211, 212, 221, 222 are arranged in a rectangular manner rather than along a line. Another difference is that the first Hall effect region 110 and the second Hall effect region 120 are arranged in a common tub or well so that the isolation means is provided by a relatively large distance between the first pair of contacts 210 and the second pair of contacts 220. A distance between the first pair of contacts 210 and the second pair of contacts 220 can be larger than the depth of the first Hall effect region 110 and also larger than the depth of the second Hall effect region 120. Yet another difference is that in FIG. 2 the contacts 211, 212, 221, 222 are closer to the perimeter of the corresponding Hall effect region 110, 120 than in FIG. 1. Placing the contacts relatively close to the perimeter of the Hall effect region avoids that the electric current can escape outwards when it should instead flow downwards to the nBL 16. This can be achieved, for example, by choosing a distance of each contact to the perimeter smaller than the thickness (or depth) of the Hall effect region.

FIG. 2 shows a block shaped Hall tub 102 that has a rectangular main (sur-)face at which there are two pairs of contacts 210 and 220. Contact 211 may also be referred to as C1. Contact 212 may also be referred to as contact C2. Contact 221 may also be referred to as contact C3. Contact 222 may also be referred to as contact C4. The perimeter of the Hall tub 102 is isolated against other parts of the substrate or semiconductor body 10 (not shown), for example by junction isolation or by trench isolation. The Hall tub 102 comprises an opposite face which is in (ohmic) contact with a highly conductive layer 16 (the NBC). The contacts 211, 212, 221, 222 are in the shape of stripes with large aspect ratio. According to one possible example, a length of the contacts 211, 212, 221, 222 can be approximately 10 µm and a width can be approximately 0.7 µm. Two stripes shaped contacts (for example, contacts 211 and 212) are spaced apart in a first direction x by about 2 µm (if the Hall tub 102 is 6 µm deep, for example). The two stripe-shaped contacts 22 and 222 are also spaced apart in the first direction x by about 2 µm in the illustrated example of FIG. 2. The two pairs of contacts 210, 220 are separated in a second direction y that is orthogonal to the first direction by a distance that is longer than the spacing of the contact within each pair 210, 220, and preferably even longer than the depth of the Hall tub 102, e.g., 10 µm. This long distance effectively splits the Hall tub 102 into the two separate Hall regions 110, 120 in a sense that there is no intimate electric coupling between them with the exception of the common nBL 16. A distance between the first pair of contacts 210 and the second pair of contacts 220 is larger than the depth of the first Hall effect region 110 and also larger than the depth of the second Hall effect region 120 in the example illustrated in FIG. 2. This means that if a contact C1 or 211 of the first pair of contacts C1-C2 (210) is used to inject current into the device and a contact C3 of the second pair of contacts C3-C4 (220) is kept as ground node while the contact C2 (212) and C4 (222) are left floating, the current mainly flows from contact C1 down into the nBL 16, then in y-direction along the nBL 16, and finally up from the nBL 16 to contact C3, whereas only a negligible portion of the current (less than 50%) flows from the contact C1 laterally through the Hall tub 102 into contact C3 without traversing the nBL 16. Each pair of contacts 210, 220 is placed symmetrically with respect to the Hall tub 102. In the implementation schematically illustrated in FIG. 2, the contacts 211, 212, 221, and 222 are kept at a distance from a perimeter of the Hall tub 102. According to alternative embodiments the contacts 211, 212, 221, 222 may extend until the perimeter of the Hall tub. However, such configurations may not be possible in some cases due to layout design rules: Then one may attempt to minimize the distance between the contacts 211, 212, 221, 222 and the perimeter of the Hall tub 102 in both directions (x-direction and y-direction) to an allowable minimum distance defined by the layout design rules. For the magnetic sensitivity of the device it is typically beneficial if the contacts extend as close as possible to the perimeter.

The different hatch patterns in FIG. 2 illustrate the electric potential within the Hall tub 102 when contact 221 (C3) is at a high electric potential and contact 211 (C1) is at a low electric potential.

As can be seen in FIG. 2, the contacts of the first pair 210 and of the second pair 220 can be arranged as a quadrangle at the surfaces of the first and second Hall effect regions 110, 120.

Figure 3:
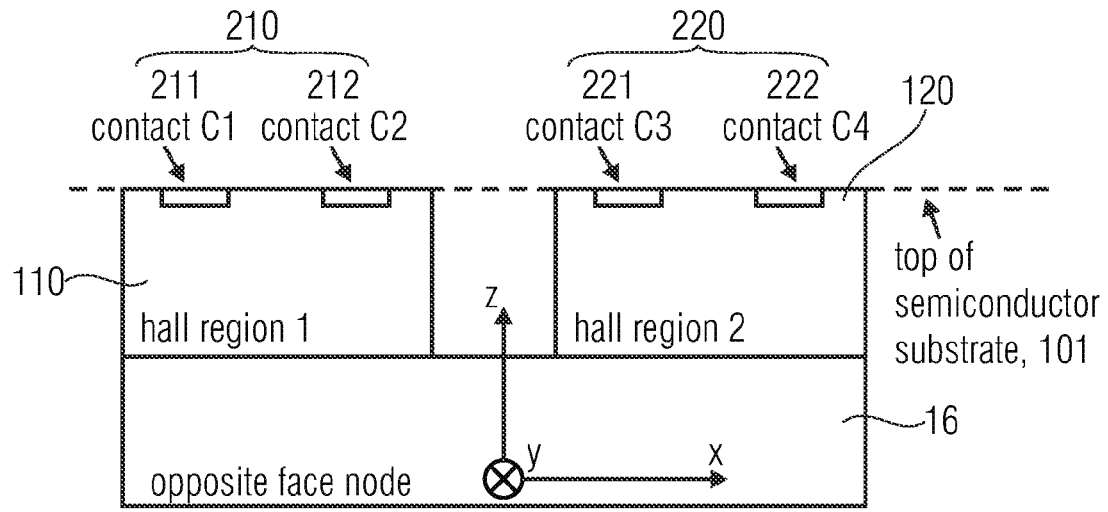
FIG. 3 shows a schematic cross-section of a vertical Hall device comprising two Hall effect regions and a highly conductive opposite face node.

FIG. 3 shows a schematic cross-section of a vertical Hall device that is similar to the vertical Hall device shown in FIG. 1. The two Hall effect regions 110, 120 are basically isolated from each other except at their opposite faces, where they are connected via a low ohmic layer 16 (e.g., the nBL: in general the Hall regions 110, 120 are doped with one conductivity type and a doping concentration between $10^{15} \ldots 5 \cdot 10^{16}/cm^3$. The highly conductive opposite face node (buried common node) 16 is doped preferably at least 20 times higher with the same conductivity type, e.g. $10^{19}/cm^3$). The Hall regions 110, 120 can be epitaxial layers with a depth of 6 µm, for example. Each Hall effect region 110, 120 has two contacts 211, 212 and 221, 222 that are typically equal in geometry. The contacts 211, 212, 221, 222 typically do not extend more than half of the thickness of the corresponding Hall effect region 110, 120 into the semiconductor body, i.e., in −z direction. As already mentioned above, the contacts 211, 212, 221, 222 are typically arranged symmetrically (both with respect to x- and y-directions) in the Hall effect regions 110, 120, and typically also with respect to a geometric union of the first and second Hall effect regions 110, 120. The spacing of the contacts 211, 212, 1221, 222 is typically smaller than the depth of the Hall effect regions 110, 120.

According to some embodiments, the Hall effect regions 110 and 120 need not be identical in size, in a similar manner, the contacts 211 (C1) and 212 (C2) need not be identical to the contacts 221 (C3) and 222 (C4). Furthermore, the exact doping concentration of both Hall effect regions 110, 120 does not need to be identical according to some embodiments, yet the type of doping (n-doping or p-doping) typically has to be identical. Contact 212 (C2) can be shifted against contact 211 (C1) in a first direction (e.g. in the x-direction as drawn in FIG. 3). Contact 221 (C3) can be shifted against contact 222 (C4) in the same direction (e.g., in the x-direction as drawn in FIG. 3) or in an orthogonal direction re-direction). In the latter case each contact C3 and C4 should also be rotated around its center by 90°. Furthermore, both Hall effect regions 110, 120 can be displaced to each other in the same direction as contacts 211 and 212 (x-direction as drawn). According to a particular embodiment, contact 222 (C4) is shifted against contact 221 (C3) in a first direction (identical to contact 211 and 212 (C1 and C2)) and the second Hall effect region 120 is shifted against the first Hall effect region 110 in a second direction that is perpendicular to the first direction, as schematically illustrated in FIG. 2. According to this embodiment, the two Hall effect regions 110, 120 are laterally isolated by distance only—in effect this embodiment can be understood as having a single Hall tub 102, only, but two Hall effect regions 110, 120, wherein the first. Hall effect region 110 (or a boundary thereof) can be defined laterally by distances from contacts 211 (C1) or 212 (C2) that are smaller than the spacing of contacts 211 (C1) and 212 (C2). The second Hall effect region 120 (or its boundary) can be defined laterally by distances from contact 221 (C3) or 222 (C4) that are smaller than the spacing of contacts 211, 212 (C3, C4). According to embodiments, the first and second directions are parallel to the edges of a semiconductor die in which the vertical Hall sensor is formed. According to alternative embodiments, an approximate, distance-related isolation between the first and second Hall effect regions 110, 120 can be achieved by providing a distance between the first and second contact pairs 210, 220 that is at least as large as the depth of the Hall effect regions 110, 120.

Figure 4:
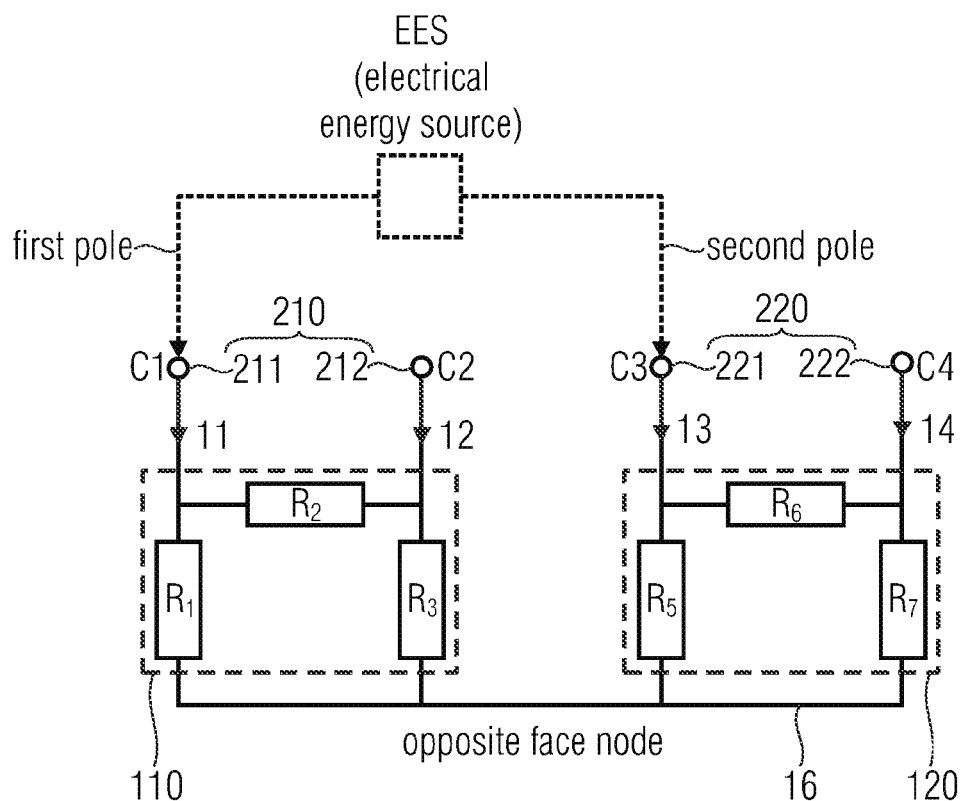
FIG. 4 shows an equivalent circuit diagram of the vertical Hall device in FIG. 3.

FIG. 4 shows a schematic, equivalent circuit diagram of the vertical Hall device shown in FIG. 3. The first Hall effect region 110 can be modeled by an equivalent circuit comprising three resistances $R_1$, $R_2$, and $R_3$. The second Hall effect region 120 can be modeled by an equivalent circuit comprising three resistances $R_5$, $R_6$, and $R_7$.

Figure 5:
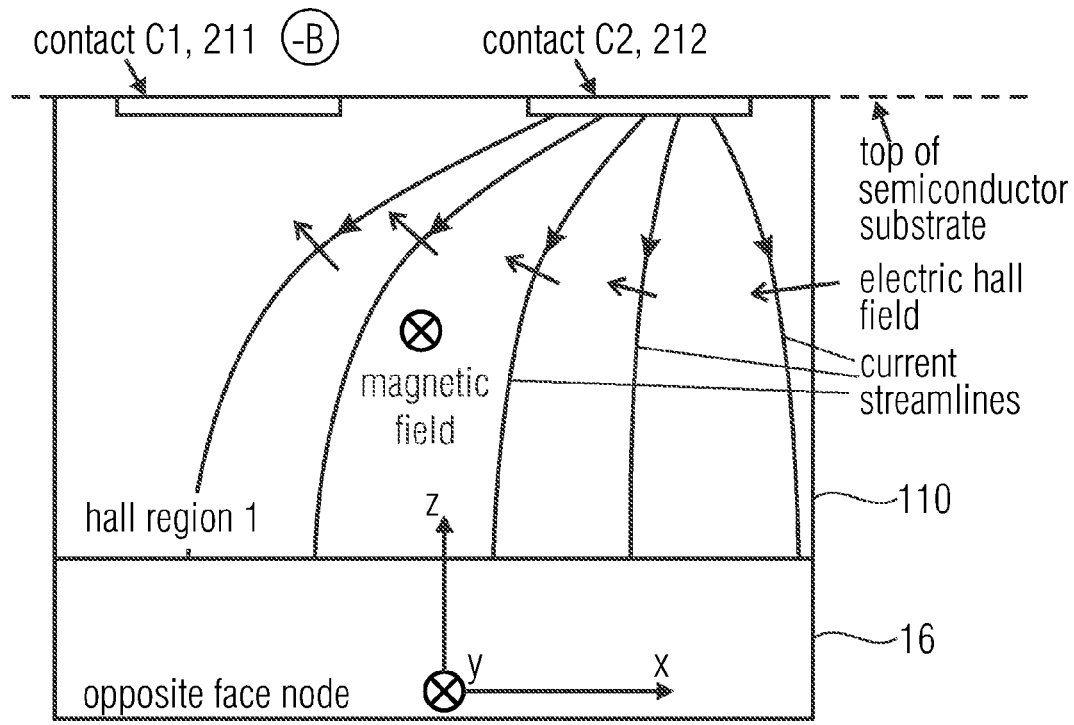
FIG. 5 schematically illustrates an electric field and current streamlines within a Hall effect region exposed to a magnetic field when an electric current is fed to a right contact C2 and extracted at a highly conductive opposite face node of the Hall effect region.

Typically, a Hall signal is generated as explained in the following paragraph relative to FIGS. 5 and 6. For the purpose of explaining how a Hall signal is generated we only need to consider half of the device, i.e., one of the Hall effect regions 110 and 120: suppose that contact 212 (C2) is at high potential (=positive supply terminal), contact 211 (C1) is floating (=sense terminal), and the opposite face node 16 is at low electric potential. Then the current streamlines as schematically illustrated in FIG. 5 will result. Some of the current streamlines flow in substantially vertical direction down from contact 212 (C2) to the highly conductive opposite face node 16: they are less efficient for the Hall signal. Other current streamlines flow in arcs from contact 212 (C2) to the left underneath contact 211 (C1) and down to the highly conductive opposite face node 16: these current streamlines are more important for the Hall signal that can be sensed at contact 211 (C1). Due to the Lorenz force on the charge carriers exerted by the magnetic field, an electric Hall field establishes that is perpendicular to the current streamlines. This electric Hall field pulls the electric potential at contact 211 (C1) up or down, depending on the polarity of the magnetic field B. Without loss of generality we can assume that the electric potential at contact 211 (C1) falls if contact 211 is at the right side of the current streamlines when the magnetic field points into the drawing plane. Where the right side is refers to the direction when one moves with the current streamlines.

Figure 6:
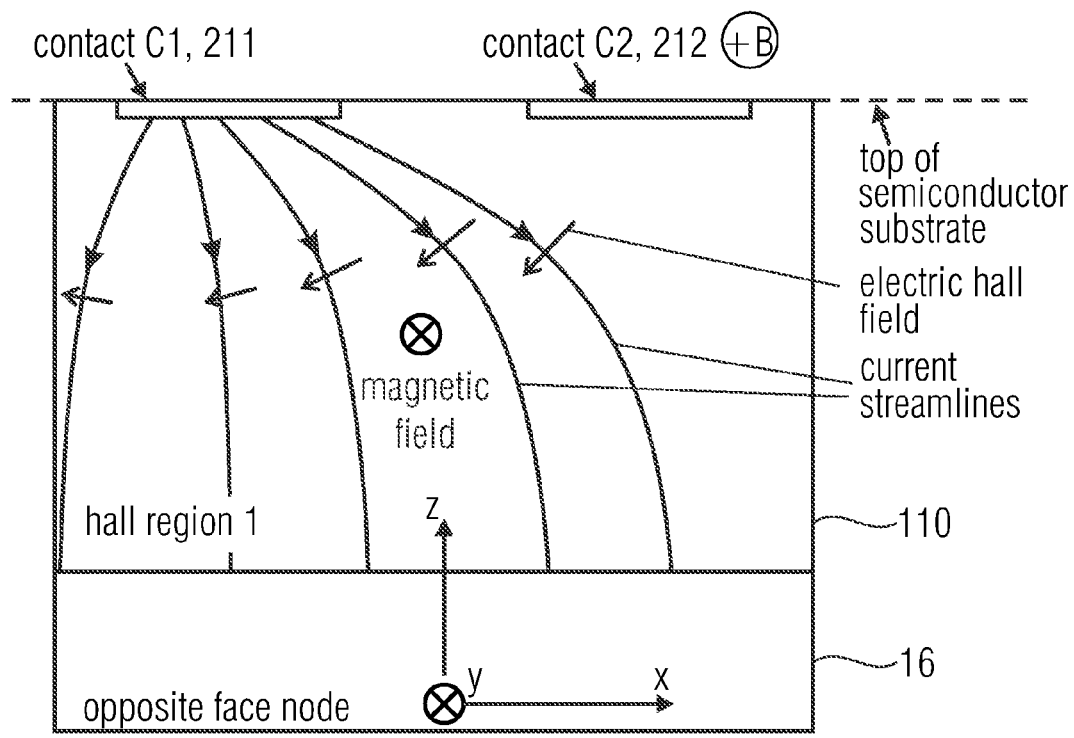
FIG. 6 shows the vertical Hall effect region of FIG. 5 with the difference that the electric current is fed to the Hall effect region via a left contact C1.

FIG. 6 shows the Hall effect region 110 during a second operating phase in which the functions of the contacts 211 (C1) and 212 (C2) are in versed: contact 211 is now the positive supply terminals, while contact 212 is the floating sense contact. It can be seen in FIG. 6 that the electric potential at contact 212 (C2) rises with an applied magnetic field that points into the drawing plane, because contact 212 is at the left side of the current streamlines referred to a direction of electric current flow.

Figure 7:
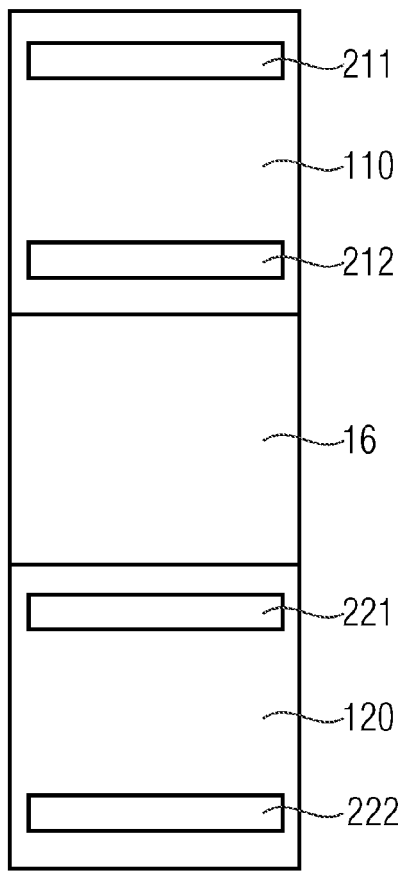
FIG. 7 shows a schematic top view of a vertical Hall device comprising two Hall effect regions and two pairs of contacts, wherein the contacts are arranged along a line.
Figure 8:
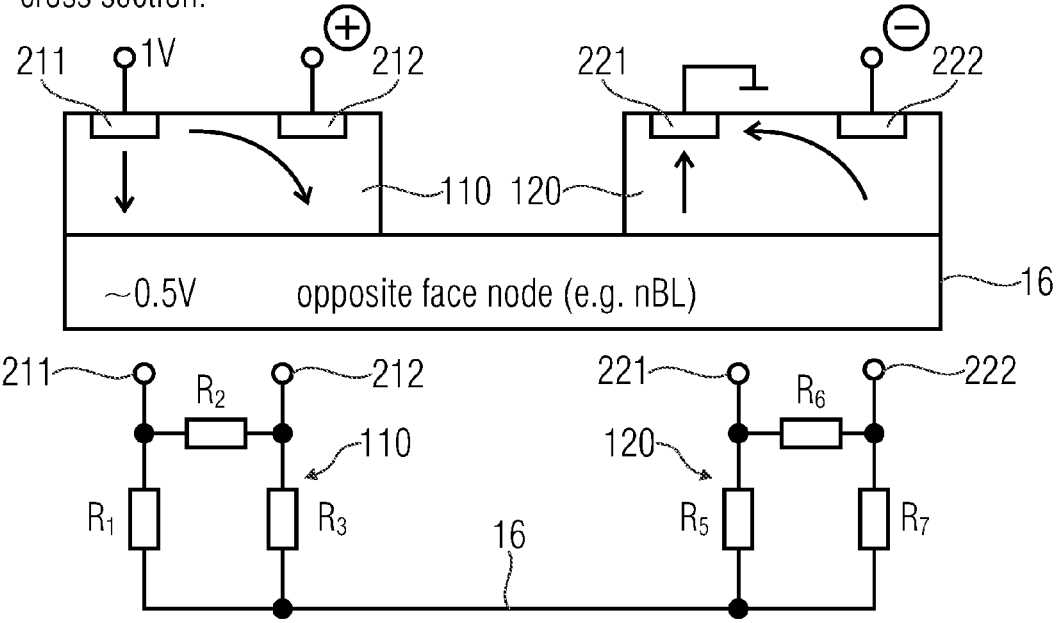
FIG. 8 shows a schematic cross-section and an equivalent circuit diagram of the vertical Hall device shown in FIG. 7.

FIG. 7 shows a schematic top view of a vertical Hall device and FIG. 8 shows a schematic cross-section and a schematic equivalent circuit diagram of the vertical Hall device. In the subsequent FIGS. 9 to 12, the schematic equivalent circuit, diagram of the vertical Hall device is illustrated in different clock phases of a spinning current scheme. Furthermore, each of FIGS. 9 to 12 indicates the corresponding equations for calculating the voltages of the sense contacts against a ground potential (reference potential).

In the following, the notation $R_a \| R_b$ means a parallel connection of resistors $R_a$ and $R_b$.

Figure 9:
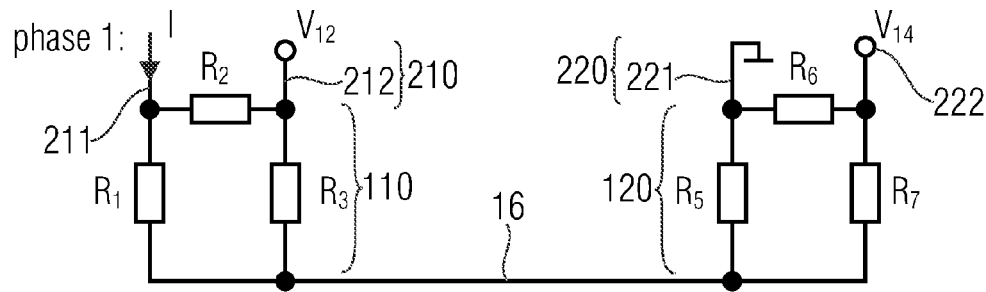
FIG. 9 shows an equivalent circuit diagram of a vertical Hall device similar to the one shown in FIGS. 7 and 8 during a phase 1 of a spinning current scheme, as well as corresponding calculations.

Iu-Biasing Operation of the Device:

One possible mode for operating the device is called Iu-biasing. Current is injected into the device and voltage is sampled at the floating sense pins in various operating phases:

Operating Phase 1:

FIG. 9 schematically illustrates the equivalent circuit diagram of the vertical Hall device during a clock phase I of the spinning current scheme. The electric current I is injected into the first Hall effect region 110 via the contact 211 of the first pair of contacts 210. The contact 221 is connected to the ground potential. The contacts 212 and 222 function as sense contacts and are "floating". The contact 212 has an electric potential $V_{12}$ which is determined by the equation indicated in FIG. 9. The term Si*By represents an Influence of a magnetic field within the first Hall effect region 110. The electric potential V14 at the contact 222 is also indicated in FIG. 9 as a corresponding equation. The term Sj*By corresponds to the influence of the magnetic field within the second Hall effect region 120.

The notation $R_5 \| (R_6+R_7)$ means that a resistance $R_5$ is connected in parallel to a series connection of resistances $R_6$ and $R_7$. Hence, $$R5\|(R_6+R_7) = \frac{R_5 \cdot (R_6+R_7)}{R_5+R_6+R_7}.$$

Current I is injected into contact C1 (211), contact C2 (212) is floating, contact C3 (221) at ground, and contact C4 (222) is floating. The electric potential at contact C2 (212) is $$V12=I*\{R1*R3/(R1+R2+R3)+R5\|(R6+R7)+Si*By\}.$$

The electric potential at contact C4 (222) is $$V14=I*\{R5*R6/(R5+R6+R7)-Sj*By\}$$

The quantity Si is the current related magnetic sensitivity in the first Hall region 110 and Sj is the current related magnetic sensitivity in the second Hall region 120 (they may differ due to different geometries or doping in region 110 and 120 or due to nonlinearity due to different potential, yet usually they are nearly identical).

Figure 10:
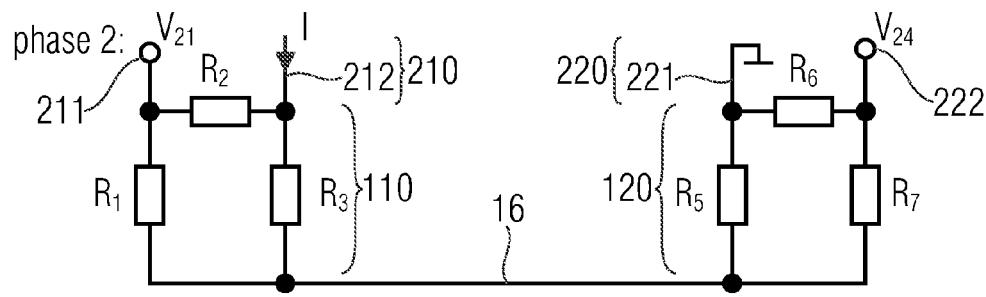
FIG. 10 shows an equivalent circuit diagram of a vertical Hall device similar to the one shown in FIGS. 7 and 8 during a phase 2 of a spinning current scheme, as well as corresponding calculations.

Operating Phase 2:

FIG. 10 shows the equivalent circuit diagram of the vertical Hall device schematically illustrated in FIGS. 7 and 8 during a second clock phase of the spinning current scheme. During the second clock phase, the electric current I is injected into the first Hall effect region 110 via the contact 212 and extracted from the second Hall effect region 120 via the contact 221. An electric potential $V_{21}$ can be observed at the contact 211 which now functions as a sense contact. An electric potential $V_{24}$ can be observed at the contact 222 which also functions as sense contact, just as in the first clock phase of the spinning current scheme schematically illustrated in FIG. 9.

Hence, current I is injected into contact C2 (212), contact C1 (211) is floating, contact C3 (221) is at ground, and contact C4 (222) is floating. The electric potential at contact C1 (211) is $$V21=I*\{R1*R3/(R1+R2+R3)+R5\|(R6+R7)-Si*By\}.$$

The electric potential at contact C4 (222) is $$V24=I*\{R5*R6/(R5+R6+R7)-Sj*By\}.$$

Figure 11:
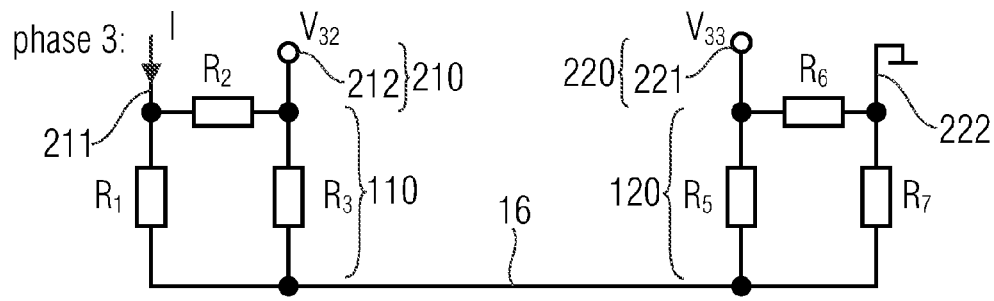

Operating Phase 3:

FIG. 11 schematically illustrates the equivalent circuit diagram of the vertical Hall device of FIGS. 7 and the 8 during a third dock phase (phase 3) of the spinning current scheme. The contacts 211 and 222 are configured to function as supply contacts, i.e. electric-current I is supplied to the first Hall effect region 110 via the contact 211, and is extracted from the second Hall effect region 120 via the contact 222. The contacts 212 and 221 function as sense contacts. The equations for the corresponding electric potentials $V_{32}$ and $V_{33}$ are also indicated in FIG. 1.

Hence, current I is injected into contact C1 (211), contact C2 (212) floating, contact C4 (222) at ground, and contact C3 (221) floating. The electric potential at contact C2 (212) is $$V32=I*\{R1*R3/(R1+R2+R3)+R7\|(R5+R6)+Si*By\}.$$

The electric potential at contact C3 (221) is $$V33=I*\{R6*R7/(R5+R6+R7)+Sj*By\}.$$

Figure 12:
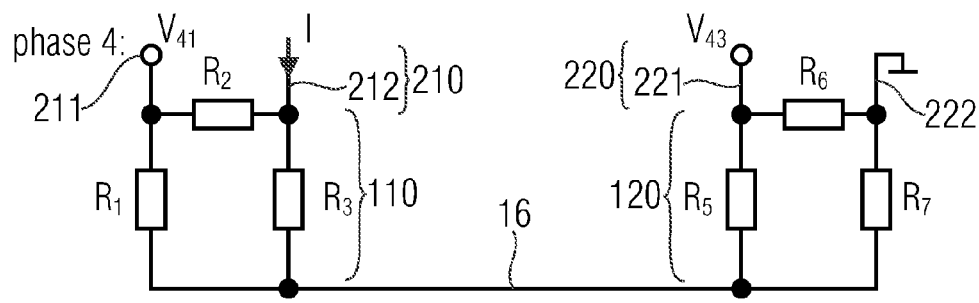
FIG. 12 shows an equivalent circuit diagram of a vertical Hall device similar to the one shown in FIGS. 7 and 8 during a phase 4 of a spinning current scheme, as well as corresponding calculations.

Operating Phase 4:

FIG. 12 schematically illustrates the equivalent circuit diagram of the vertical Hall device for a fourth clock phase of the spinning current scheme in which the contacts 212 and 222 function as supply contacts and the contacts 211 and 221 function as sense contact. The equations for the sense voltages $V_{41}$ and $V_{43}$ are also indicated in FIG. 12.

Hence, current I is injected into contact C2 (212), contact C1 (211) is floating, contact C4 (222) is at ground, and contact C3 (221) is floating. The electric potential at contact C1 is $$V41=I*\{R1*R3/(R1+R2+R3)+R7\|(R5+R6)-Si*By\}.$$

The electric potential at contact C3 (221) is $$V43=I*\{R6*R7/(R5+R6+R7)+Sj*By\}.$$

When studying the equations of the different sense voltages shown in FIGS. 9 to 12, it can be seen that the sense voltages $V_{12}$, $V_{32}$, $V_{33}$, and $V_{43}$ have a positive dependency on the magnetic field B. The sense voltages $V_{14}$, $V_{21}$, $V_{24}$, and $V_{41}$ have a negative dependency on the magnetic field B.

It can also be seen that the sense voltage $V_{24}$ in clock phase 2 shown in FIG. 10 is identical to sense voltage $V_{14}$ of clock phase 1 in FIG. 9. In a similar manner, sense voltage $V_{43}$ of clock phase 4 in FIG. 12 is identical to sense voltage $V_{33}$ of clock phase 3 in FIG. 11.

The various sense signals obtained during the clock phases 1 to 4 can be combined with each other, in particular added or subtracted, in order to reduce or substantially cancel the offset:

$$V_3-V_{21}=2*I*S_i*By$$

$$V_{32}-V_{41}=2*I*S_j*By$$

$$V_{33}-V_{14}=2*I*S_j*By+I*R_6(R_7-R_5)/(R_5+R_6+R_7)$$

$$V_{43}-V_{24}=2*I*S_j*By+I*R_6(R_7-R_5)/(R_5+R_6+R_7),$$

wherein $S_i$ and $S_j$ are the current-related magnetic sensitivities of the first Hall effect region 110 and the second Hall effect region 120, respectively. Note that of first two signals of the four signals above are free of offset, whereas the third signal and the fourth signal are not free of offset.

It is also possible to combine four of the sense voltages, as follows:

$$V_{12}-V_{21}+V_{32}-V_{41}=4*I*S_i*B$$

$$V_{33}-V_{14}+V_{43}-V_{24}=4*I*S_j*B+2*I*R_6(R_7-R_5)/(R_5+R_6+R_7)$$

This can also be written in terms of high common mode potential and low common mode potential:

$$Vhi=V12-V21+V32-V41 \ldots \text{at high common mode potential}$$

$$Vlo=V33-V14+V43-V24 \ldots \text{at low common mode potential}$$

Note however, that the combined signal Vlo is not free of offset. The origin of the problem is that the electric potential of the highly conductive opposite face node 16 is not known.

In the first Hall effect region 110 we get:
V1 . . . potential at contact C1 (211) if current I is injected in contact C2 (212) at zero magnetic field
V2 . . . potential at contact C2 (212) if current I is injected in contact C1 (211) at zero magnetic field $$V1-V2=I*\{R3\|(R1+R2)*R1/(R1+R2)--R1\|(R2+R3)*R3/(R2+R3)\}=0$$

However, in the second Hall region 120 we get:
V3 . . . potential at contact C3 (221) if contact C4 (222) is at ground potential at zero magnetic field
V4 . . . potential at contact C4 (222) if contact C3 (221) is at ground potential at zero magnetic field $$V3-V4=I*\{R7\|(R5+R6)*R6/(R5+R6)--R5\|(R6+R7)*R6/(R6+R7)\}=I*R6*(R7-R5)/(R5+R6+R7),$$

which is not equal to zero (as long as there is the usual mismatch between R5 and R7 even though R5 and R7 may be nominally equal).

If we reverse the potentials so that the first effect Hall region 110 is at lower potential than the second Hall effect region 120 (i.e. contact C1 or C2 are connected to ground and the current I is injected into contact C3 or C4) the situation reverses: Then the resistances R1, R2, R3 lead to an offset voltage I*R2*(R1-R3)/(R1+R2+R3) whereas the signals of the second Hall effect region 120 cancel the offset (nearly) perfectly.

That means, we can get information on the mismatch of R1-R3 and R5-R7.

Figure 13A:
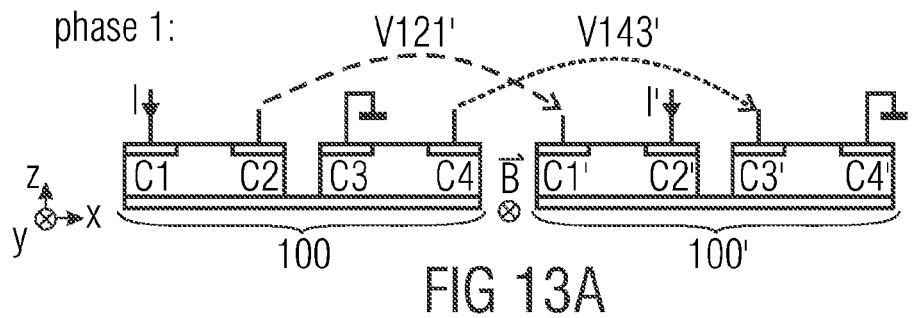
FIGS. 13A to 13N illustrate the different configurations of supply contacts and sense contacts for 14 different clock phases of a spinning current scheme and a vertical Hall sensor comprising two vertical Hall devices, each having two Hall effect regions.
Figure 13B:
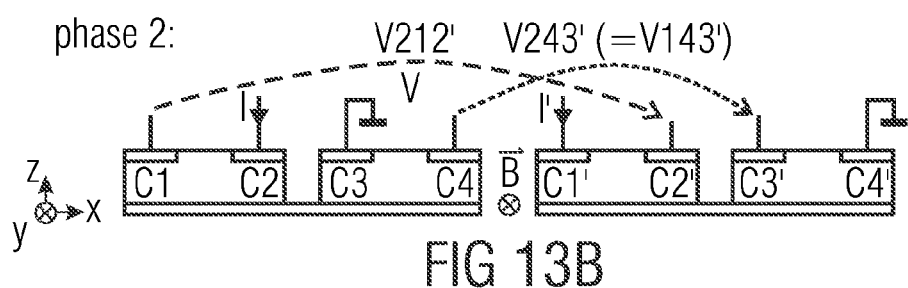
Figure 13C:
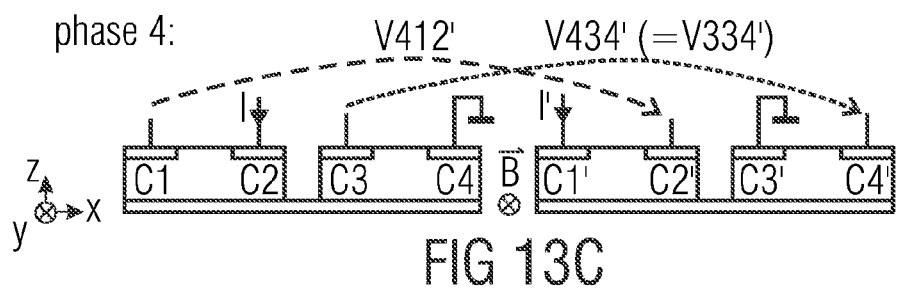
Figure 13D:
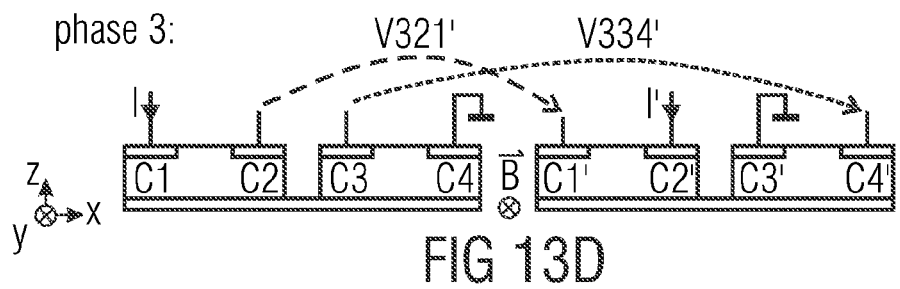
Figure 13E:
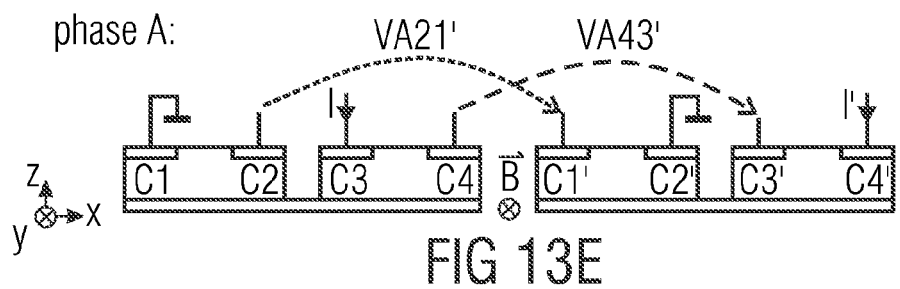
Figure 13F:
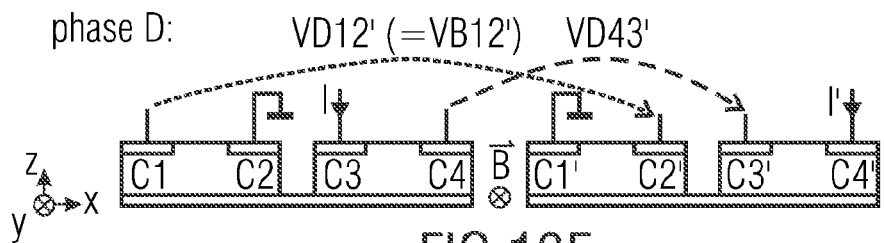
Figure 13G:
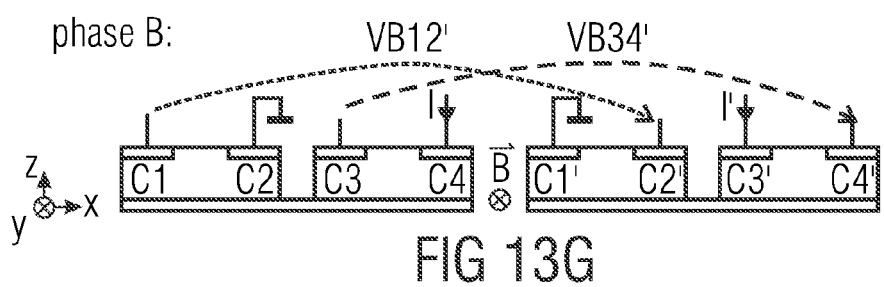
Figure 13H:
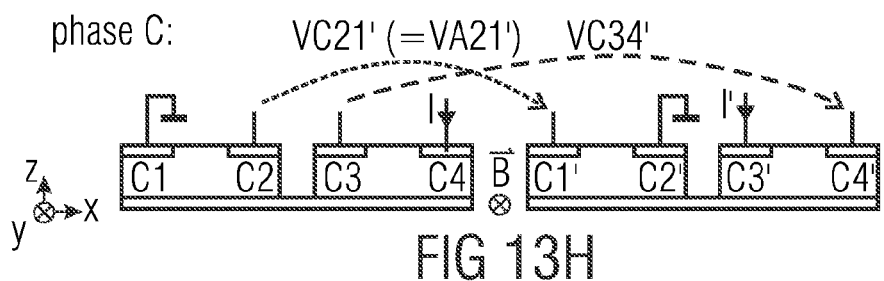
Figure 13I:
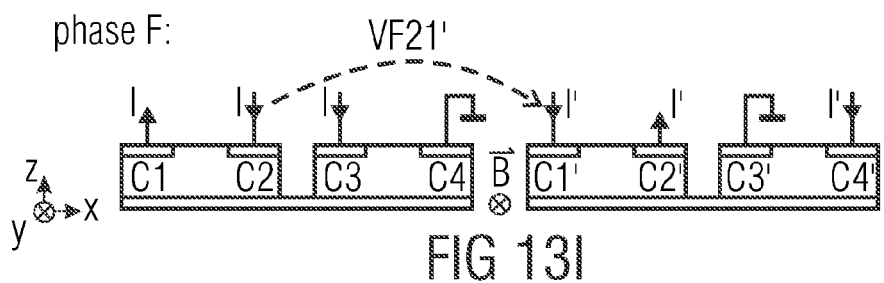
Figure 13J:
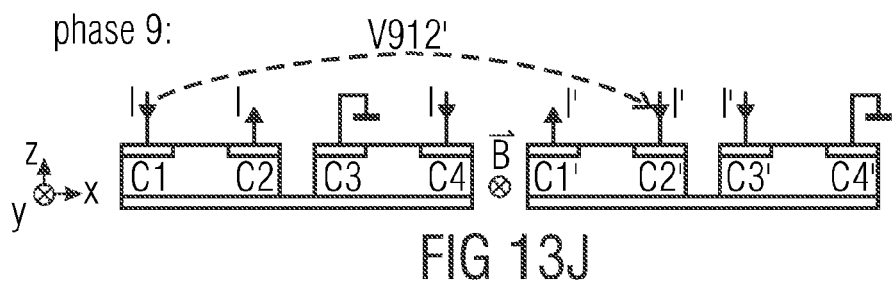
Figure 13K:
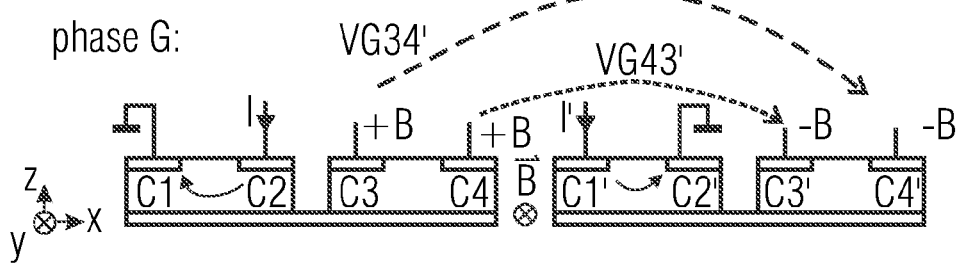
Figure 13L:
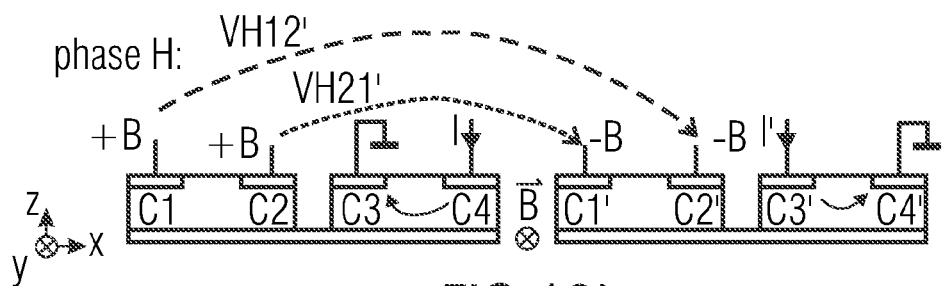
Figure 13M:
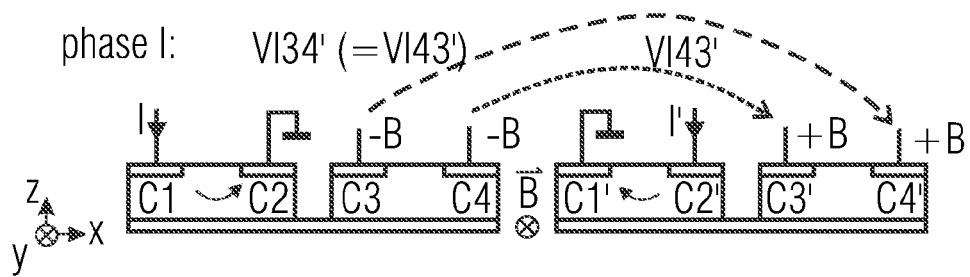
Figure 13N:
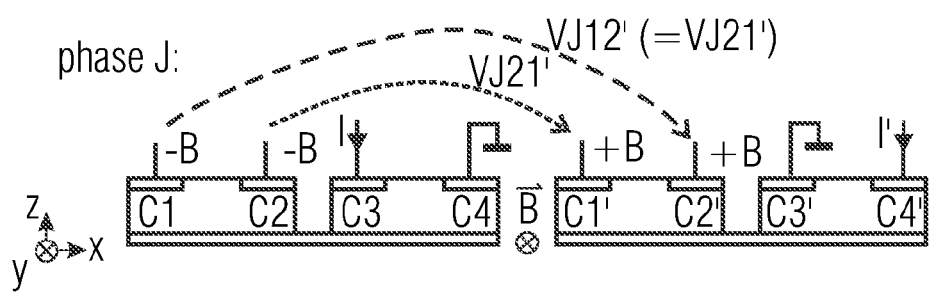

This was explained for a single device (single ended operation), yet it is also possible to operate two devices differentially: then we add a second device 100' (denoted by primed parameters) which is connected in such a way to its own current supply or a common current supply that the sense pins of both Hall regions 110' and 120' show opposite signal dependency than the sense pins of Hall regions 110 and 120 of the first vertical Hall device 100. Example: in an operating phase, C1 is a supply pin into which a current I is injected into the first device. In the same operating phase C2' is a supply pin into which a current I' is injected into the second device 100'. Then the voltage between C2 and C1' is sampled and is processed the same way as the voltage at C2 in single ended operation, FIGS. 13A to 13N schematically illustrate 14 different clock phases of a Hall sensor comprising two vertical Hall devices 100 and 100' that are operated in a differential mode. Typically, the two vertical Hall devices 100, 100' are oriented parallel to each other, yet it is also possible to place them in an angled manner so that one device responds to a component $B_Y$ of the magnetic field that is parallel to the y-direction, and the other vertical Hall device responds to a component $B_x$ of the magnetic field that is parallel to the x-direction or to combinations thereof. In configurations in which the Hall sensor is configured to sense a single component of the magnetic field only, this component will simply be referred to by the letter "B" in the sequel. The parameters and elements of the second device 100' are denoted by primed reference signs: e.g., the current, injected in the first device 100 is called I, whereas the current injected in the second device 100' is called I' (I and I' may be the same or have equal magnitude, but this is not necessarily so). In the following, the numbering or the order of appearance of the phases, such as "phase I" or "phase B" does not denote any sequential order. Rather, they are merely labels that refer to certain biasing conditions of the vertical Hall devices 100 and 100'.

The phases can be executed in any sequential order and the order of FIGS. 13A to 13N gives one possible example. The sense voltages shown in FIGS. 13A to 13N follow the following nomenclature: the first character "V" stands for "voltage", the second character can be a digit or a letter and indicates the clock phase of the spinning current scheme; the third character is a digit between 1 and 4 indicating the sense contact at the first vertical Hall device 100 that is used in connection with the sense voltage of interest, and the fourth character is a primed digit between 1 and 4 indicating the sense contact of the second vertical Hall device 100' that is used in connection with the sense voltage of interest. For example, V121' stands for the voltage that is sensed during clock phase 1 between the second contact C2 of the first vertical Hall device 100 and the first contact C1' of the second vertical Hall device 100'.

Operating Phase 1 (FIG. 13A):

Current I injected into C1, C2 floating, C3 at ground, C4 floating.

Current I' injected into C2', C1' floating, C4' at ground, C3' floating.

Voltage between C2 and C1':

$$V121 = I*\{R1*R3/(R1+R2+R3)+R5\|(R6+R7)+Si*By\} - I'*\{R1'*R3'/(R1'+R2'+R3')+R7'\|(R5'+R6')+Sj'*By\}$$

Voltage between C4 and C3':

$$V143' = I*\{R5*R6/(R5+R6+R7)-Sj*By\} - I'*\{R6'*R7'/(R5'+R6'+R7')+Sj'*By\}$$

Operating Phase 2 (FIG. 13B):

Current I injected into C2, C1 floating, C3 at ground, C4 floating.

Current I' injected into C2', C1' floating, C4' at ground, C3' floating.

Voltage between C1 and C2':

$$V212' = I*\{R1*R3/(R1+R2+R3)+R5\|(R6+R7)-Si*By\} - I'*\{R1'*R3'/(R1'+R2'+R3')+R7'\|(R5'+R6')+Si'*By\}$$

Voltage between C4 and C3':

$$V243' = I*\{R5*R6/(R5+R6+R7) - Sj*By\} -$$
$$- I'*\{R6'*R7'/(R5'+R6'+R7') + Sj'*By\} =$$
$$= V143'$$

Operating Phase 3 (FIG. 13D):

Current I injected into C1, C2 floating, C4 at ground, C3 floating.

Current I' injected into C2', C1' floating, C3' at ground, C4' floating.

Voltage between C2 and C1':

$$V321' = I*\{R1*R3/(R1+R2+R3)+R7\|(R5+R6)+Si*By\} - I'*\{R1'*R3'/(R1'+R2'+R3')+R5'\|(R6'+R7')-Si'*By\}$$

Voltage between C3 and C4':

$$V334' = I*\{R6*R7/(R5+R6+R7)+Sj*By\} - I'*\{R5'*R6'/(R5'+R6'+R7')-Sj'*By\}$$

Operating Phase 4 (FIG. 13C):

Current I injected into C2, C1 floating, C4 at ground, C3 floating.

Current I' injected into C2', C1' floating, C3' at ground, C4' floating.

Voltage between C2 and C1':

$$V412' = I*\{R1*R3/(R1+R2+R3)+R5\|(R6+R7)-Si*By\} - I'*\{R1'*R3'/(R1'+R2'+R3')+R5'\|(R6'+R7')+Si'*By\}$$

Voltage between C3 and C4':

$$V434' = I*\{R6*R7/(R5+R6+R7) + Sj*By\} -$$
$$I'*\{R5'*R6'/(R5'+R6'+R7') - Sj'*By\}$$
$$= V334'$$

Thus we can combine the following signals which are free of offset (in this linear theory):

$$V121' - V212' = 2*(I*Si+I'*Si')*By$$

$$V321' - V412' = 2*(I*Si*By+I'*Si')*By$$

Moreover we can combine the following signals which are not free of offset:

$$V334' - V143' = I*\{R6*R7/(R5+R6+R7)-R5*R6/(R5+R6*+R7)\}++I'*\{R6'*R7'/(R5'+R6'+R7')--R5'*R6'/(R5'*R6'*+R7')\}+2*I*Sj*By+2*I'*Sj'*By$$

$$V434' - V241' = I*\{R6*R7/(R5+R6+R7)-R5*R6/(R5+R6*+R7)\}+I'*\{R6'*R7'/(R5'+R6'+R7')--R5'*R6'/(R5'+R6'+R7')\}++2*I*Sj*By+2*I'*Sj'*By$$

Moreover we can combine the signals over all four operating phases:

$$Vhi = V121' - V211' + V321' - V411' \ldots \text{ at high common mode potential}$$

$$Vlo = V334' - V143' + V434' - V243' \ldots \text{ at low common mode potential}$$

The following Table 1 gives a survey of the signals. The left column gives the signal, e.g. in the 1$^{st}$ line V121' which means the signal between C2 and C1' in phase 1. It is identical to $$I*R1*R3/(R1+R2+R3)++I*R5\|(R6+R7)--I'*R1'*R3'/(R1'+R2'+R3')--I'*(R5'+R6')\|R7'--(I+I')*B*cc$$

where cc is some positive constant and Rx∥Ry denotes the resistance value of the parallel circuit of Rx and Ry. An abbreviated notation is used in Table 1: For example, instead of writing R1*R3/(R1+R2+R3), the abbreviated notation "13/123" is used, and Instead of writing R5∥(R6+R7) the abbreviated notation "5∥67" is used.

TABLE 1

| V | +I* resistance-terms | +I'* resistance-terms | +B terms |
| --- | --- | --- | --- |
| 121' | 13/123 + 5 ∥ 67 | −1'3'/1'2'3' − 5'6' ∥ 7' | +I + I' |
| 143' | 56/567 | −6'7'/5'6'7' | −I − I' |
| 212' | 13/123 + 5 ∥ 67 | −1'3'/1'2'3' − 5'6' ∥ 7' | −I − I' |
| 321' | 13/123 + 56 ∥ 7 | −1'3'/1'2'3' − 5' ∥ 6'7' | +I + I' |
| 334' | 67/567 | −5'6'/5'6'7' | +I + I' |
| 412' | 13/123 + 56 ∥ 7 | −1'3'/1'2'3' − 5' ∥ 6'7' | −I − I' |
| 912' | 12/123 + 56/567 | −2'3'/1'2'3' − 6'7'/5'6'7' | +I + I' |
| 921' | −23/123 + 56/567 | 1'2'/1'2'3' − 6'7'/5'6'7' | +I + I' |
| A21' | 12/123 | −2'3'/1'2'3' | −I − I' |
| A43' | 57/567 + 1 ∥ 23 | −5'7'/5'6'7' − 1'2' ∥ 3' | +I + I' |
| B12' | 23/123 | −1'2'/1'2'3' | +I + I' |
| B34' | 57/567 + 12 ∥ 3 | −5'7'/5'6'7' − 1' ∥ 2'3' | −I − I' |
| C34' | 57/567 + 1 ∥ 23 | −5'7'/5'6'7 − 1'2' ∥ 3' | −I − I' |
| D43' | 57/567 + 12 ∥ 3 | −5'7'/5'6'7' − 1' ∥ 2'3' | +I + I' |
| F21' | 23/123 + 67/567 | −1'2'/1'2'3' − 5'6'/5'6'7' | −I − I' |

It can be seen in Table 1 that some offset voltages in some clock phases are identical to other offset voltages in other clock phases so that these clock phases can cancel the offset if their signals are added or subtracted such that their B-terms (i.e., terms that depend on the magnetic field B) add up. Table 2 indicates which sense voltages have identical I*resistance-terms and I'*resistance-terms (sense voltages appearing on one line in Table 2) and hence can be used to cancel or reduce the offset by adding or subtracting them.

TABLE 2

| V121' | ← identical resistance terms → | V212' |
| --- | --- | --- |
| V321' | ← identical resistance terms → | V412' |

TABLE 2-continued

| VA43' | ← identical resistance terms → | VC34' |
|---|---|---|
| VB34' | ← identical resistance terms → | VD43' |

For example, V212'−V121'−2*cc*(I+I')*B because all other terms 13/123+5∥67 and −1'3'/1'2'3'−5'∥6'7' cancel.
Of course it is possible to compute $$V212'-V121'++k1*(V412'-V321')++k2*(VB34'-VD43')++k3*(VC34'-VA43')$$

with k1, k2, k3 arbitrary. In case the signal path effectively integrates over the signals in the phases the two corresponding phases in each line of table 2 need to be exactly equally long in time, yet this duration may differ from the duration of other two corresponding phases.
The other signals can be added up like this:
+k4*(−V334'+VF21'−VB12'), with k4 arbitrary as in the following Table 3:

TABLE 3

| −334' | −67/567 | 5'6'/5'6'7' | −I − I' |
|---|---|---|---|
| F21' | 23/123 + <u>67/567</u> | −1'2'/1'2'3' − <u>5'6'/5'6'7'</u> | −I − I' |
| −B12' | −23/123 | 1'2'/1'2'3' | −I − I' | and: +k5*(V141'−V912+VA21'), with k5 arbitrary, as in the following Table 4:

TABLE 4

| 143' | <u>56/567</u> | −6'7'/5'6'7' | −I − I' |
|---|---|---|---|
| −912' | −12/123 − <u>56/567</u> | +2'3'/1'2'3' + <u>6'7'/5'6'7'</u> | −I − I' |
| A21' | 12/123 | −2'3'/1'2'3' | −I − I' |

In Table 3 and Table 4, those terms that are substantially identical in different sense voltages are underlined or bold, respectively, in order to facilitate an identification of the different pairings. For example, in Table 3 it can be seen that the term "−67/567" of the sense voltage −V334' in clock phase 3 cancels with the term "67/567" of the sense voltage VF21' in clock phase F. On the other hand, the term "23/123", which also appears in the sense voltage VF21', may be cancelled by adding the sense voltage VB12' of clock phase B. Hence, as can be seen in Tables 3 and 4, adding three sense voltages of three different clock phases in a specific manner substantially cancels the various offset-relevant terms in these three sense voltages, but increases the B-field-relevant terms. This cancellation scheme of offset-relevant terms in three or more sense voltages may be understood as a circular swap in a sense that more than two sense voltages are needed in order to substantially cancel all offset-relevant terms.

On the basis of Tables 1, 2, 3, and 4, it can now be understood how a substantially offset-free total signal may be obtained, namely as:

Offset free total signal=(V212'−V121')+k1*(V412'−V321')++k2*(VB34'−VD43')+k3*(VC34'−VA43')++k4*(−V334'+VF21'−VB12')++k5*(V143'−V912'+VA21')

with k1, k2, k3, k4, k5 arbitrary. In particular one can choose k1=k2=k3=k4=k5=1, which gives Offset free total signal=−V121'+V143'+V212'−V321'−−V334'+V412'−V912'+VA21'−−VA43'−VB12'+VB34'+VC34'−−VD43'−VF21'.

Although any sequential order of sampling and adding up these terms is possible, the preferred one is to first add up two terms, which are in the same brackets in the one but last equation and then add two further terms which are in the same further bracket. E.g. start with V212'−V121' and then add V412'−V231') etc. . . . .

In the above shown sequence some signals appear twice (V143'=V243' and V334'−V434' and VA21'=VC21' and VB12'=VD12'). These are all signals at the lower common mode potential (whose common mode potential is closer to ground than to the positive supply rail). If the signals in each of the phases are sampled, these specific signals appear twice, which is equivalent to a weighting factor 2. One can discard these signals at their second appearance, yet this wastes electric power. Alternatively, since VF21'−V334'−VB12' is offset free and also V143'−V912'+VA21' is offset free this means, that we also have to sample VF21' and V912' twice. Alternatively we can also multiply VF21' and V912' by two. In a different system the summing of all signals is done by integration over time: in this case the duration of phases 1 and 2 should typically be exactly equal in order to cancel the offset proportional to current I in V212'−V121'. But this results in V143' to have twice the duration of V212' because it appears at the low common mode in both phases 1 and 2. Therefore also phases 9 and F have to last twice as long as phase 1.

In the above Table 1 there is one line 921', which is not used in the total signal. It is only given as an example that there are many other different biasings and signals possible and they might be used to cancel the offset in combinations analogous to the ones given. The combinations given above all have the advantage that they respond to the magnetic field—in contrast to this, one may also construct signals that are independent on magnetic fields (or have only very small magnetic sensitivity) but still carry some information on the offset (e.g. we can take any of our signals above for the $1^{st}$ device and exchange ground pin with sense pin and supply pin with other sense pin in the $2^{nd}$, primed device: then the differential voltage has roughly zero magnetic sensitivity). These signals can also be added or subtracted to others to construct a combination of signals void of offset. In this way it is possible to construct dozens of combinations that serve the same purpose: cancel the offset in the total signal while still having a reasonably good magnetic sensitivity.

FIGS. 14A and 14B show a table containing the different terms for 27 sense signals that can be sensed in 14 different clock phases. FIG. 14A covers the clock, phases 1, 2, 3, 4, A, B, and a part of C. FIG. 14B covers the clock phases C (partly), D, G, H, I, J, 9, and F. Each line of the table corresponds to one sense signal. The first column indicates the line number. The second column contains the designation of the sense signal, such as "$V_{121}$". The third and fourth columns contain the resistance-related terms for the first vertical Hall device 100. The fifth column contains the magnetic field-dependent term of the first vertical Hall device 100. The sixth and seventh column, contains the resistance-related, terms for the second vertical Hall device 100'. The eighth column contains the magnetic field-dependent term of the second vertical Hall device 100'. For clock phases G, H, I, and J, four additional magnetic sensitivities $S_{ij}$, $S_{ji}$, $S_{ij}'$, and $S_{ji}'$ have to be considered (all positive).

Figure 15:
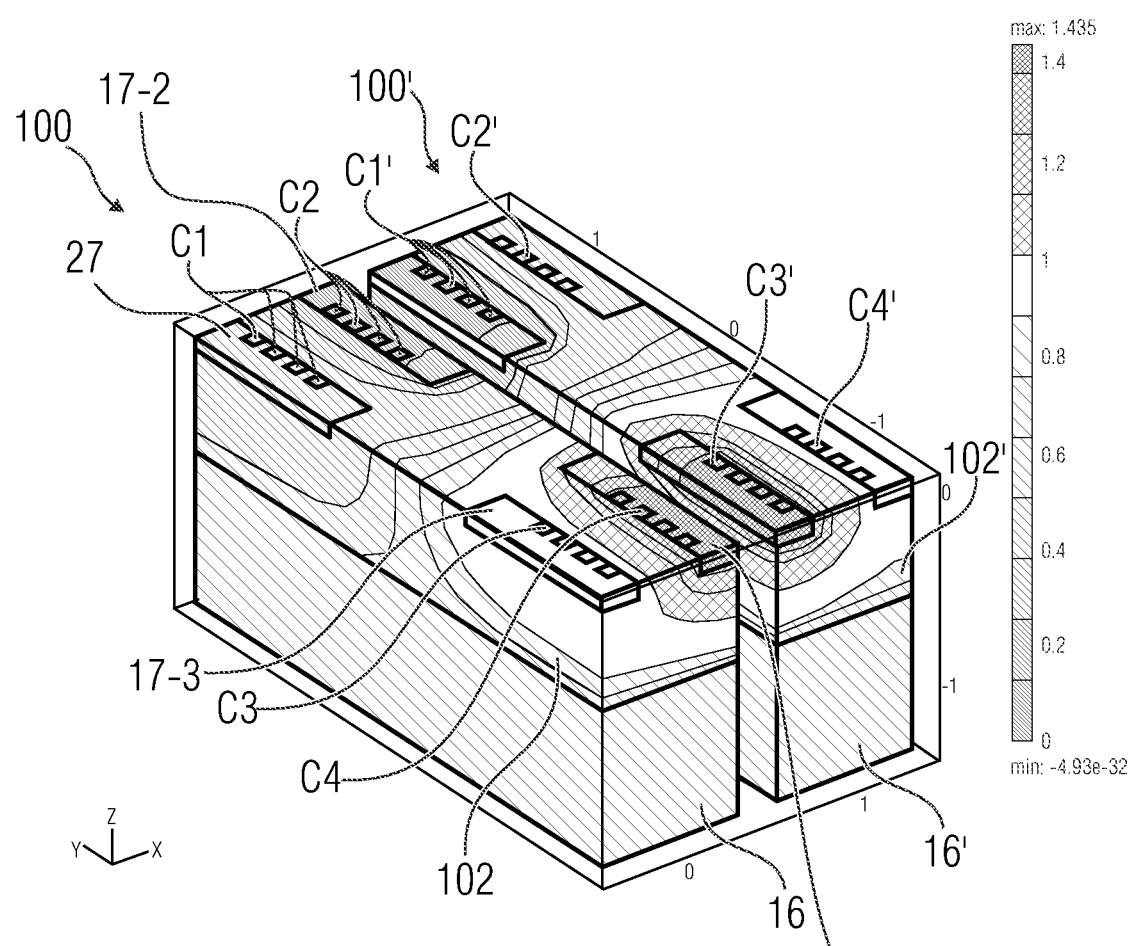
FIG. 15 illustrates in a schematic, three-dimensional view the electric potential in the two vertical Hall devices of a sensing arrangement with two highly conductive opposite face nodes, where the contacts are located near the corners of the Hall tubs of the two vertical Hall devices.

FIG. 15 shows a schematic, perspective view of a sensing arrangement comprising a vertical Hall device 100 and a further vertical Hall device 100'. In FIG. 15 the electric potential determined by means of numerical simulation is graphically illustrated. The vertical Hall device 100 comprises a Hall tub 102, an opposite face highly conductive node 16 (e.g. a nBL) and four contacts C1 to C4 which are arranged at the surface of the Hall tub 102 at the corners of the brick-shaped Hall tub 102. The highly conductive node 16 is an n-buried layer in the case of an n-type doping of the Hall effect region and the highly conductive node is a p-buried layer in the case of a p-type doping of the Hall effect region. The further vertical Hall device 100' has a similar configuration and is typically congruent and/or symmetric to the vertical Hall device 100. The further vertical Hall device 100' comprises a Hall tub 102', a highly conductive opposite face layer 16', and four contacts C1' to C4' arranged at the surface and in the four corners at the surface of the Hall tub 102'.

The potential distribution within the two vertical Hall devices 100 and 100' is illustrated in FIG. 15 for the case in which +1.435 V is applied to contacts C4 and C3', whereas contacts C2 and C1' are grounded. In the Hall tub 102 the major portion of the current flows from contact C4 to the highly conductive opposite face node 16, i.e. In vertical direction. Then it flows in the highly conductive opposite face node 16 in. y-direction (along the longitudinal side of the device). Finally it flows upward from the highly conductive opposite face node 16 to contact C2. Both contacts C3 and C1 can be used to tap a Hall voltage. In this operating phase, the highly conductive opposite face node 16 is a functional part of the device: if the highly conductive opposite face node 16 were missing, the device would not work well anymore. In the further vertical Hall device 100', basically the same happens: from contact C3' the current flows substantially vertically through the highly conductive opposite face node 16', where it flows in y-direction, until it leaves the highly conductive opposite face node 16' and flows substantially upward to contact C1'.

In the embodiment schematically illustrated in FIG. 15 each of the contacts C1 to C4 and C1' to C4' comprises four point-shaped contacts portions arranged along a line that is parallel to the longitudinal axis of the tubs 102 and 102' and the y-axis (other numbers of point-shaped contact portions than four portions are possible, as well, e.g. three, five, or even more contact portions). In FIG. 15 and the subsequent FIG. 16, for some of the contacts, only one point-shaped contact portion is indicated by a reference line to the corresponding reference sign, e.g. contacts C1 and C2, for the sake of clarity of representation. Nevertheless, the other point-shaped contact portions also belong to the corresponding contact. A large part of each contact C1 to C4, C1' to C4' is overlapped by a medium-doped well 27, 17-2, 17-3, 17-4. For example, a large part of contact C3 overlaps with the medium-doped well 17-3. Indeed, the four point-shaped contact portions of contact C3 are partly embedded in the medium-doped well 17-3. Although not explicitly indicated by corresponding reference signs, the further vertical Hall effect device 100' also comprises four medium-doped wells for the four contacts C1' to C4'. The reason for this arrangement is that the medium doped wells (e.g. 17-2) are implanted through the four small openings C2 and their depth is lower if the openings C2 are smaller, it is advantageous to have a low depth of medium doped wells, because this enhances the magnetic sensitivity.

Figure 16:
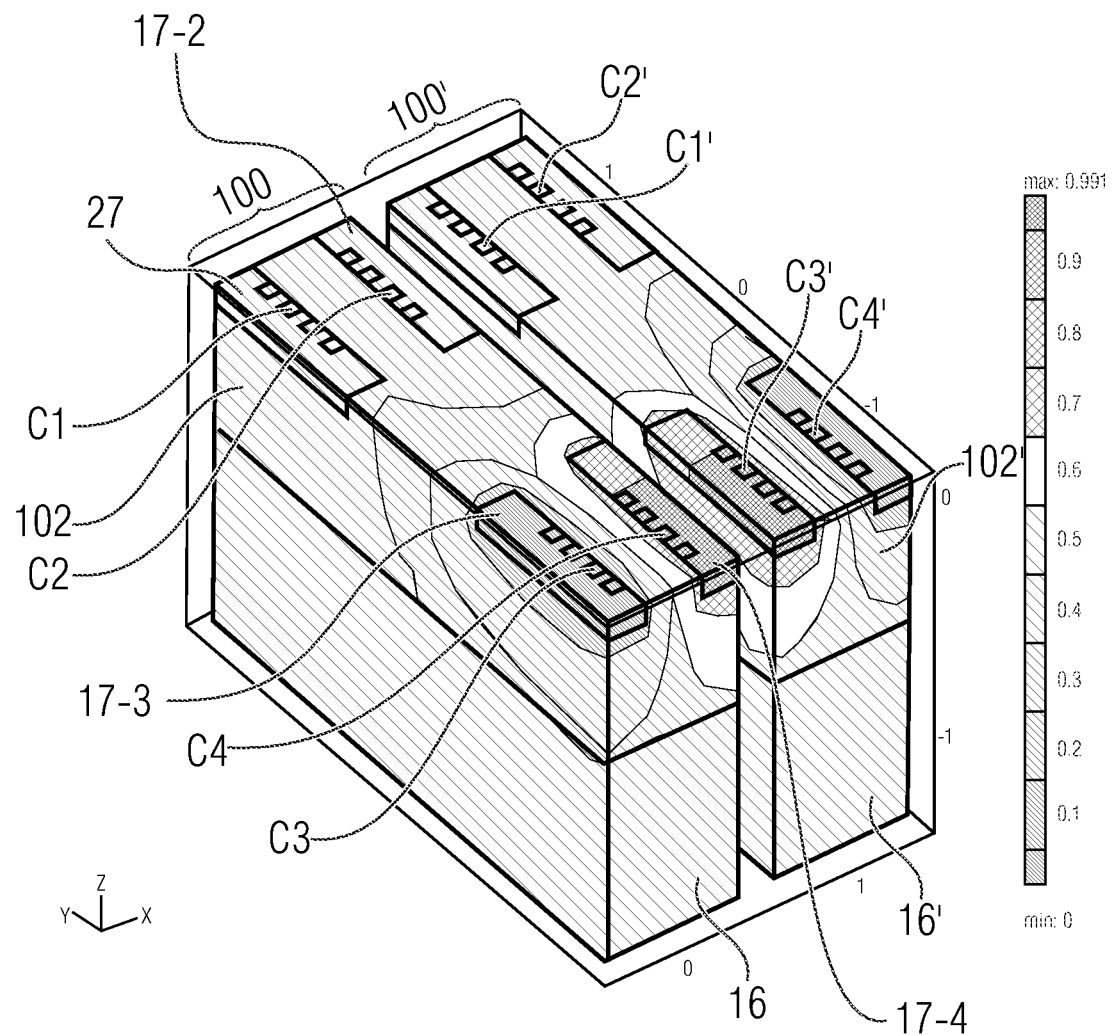
FIG. 16 illustrates in a schematic, three-dimensional view the vertical Hall device from FIG. 15 during a different clock phase of the spinning current scheme.

Note that the device or sensing arrangement can also be operated in modes where no current flows through the opposite face layer(s) 16, 16', yet the opposite face layer(s) is/are still an important functional part, because in these modes it/they serve as voltage sense lines. This happens when neighboring contacts are used as supply terminals as schematically illustrated in FIG. 16, where current is injected in contact C4 and contact C3 is grounded (clock, phase H). A current is also injected in contact C3' and contact C4' is also grounded, in this case the current in each Hall tub 102, 102' flows in an approximate semicircle from contact C4 to contact C3 (from contact C3' to contact C4' in the further vertical Hall device 100') and the potential of the opposite face layers 16, 16' is modulated by the magnetic field in y-direction. Since the opposite face layers 16, 16' are not accessible directly, its electric potential may be tapped by use of contacts C1, C2 and, C1', C2' respectively. Yet, these contacts C1, C2, C1', C2' are not connected to the opposite face layers 16, 16' with a low ohmic resistance so that the noise performance in this mode is expected to be rather poor.

Note that in clock phase H illustrated in FIG. 16, a major portion of the electric current flows a relatively short distance from contact C4 to contact C3 in the Hall tub 102 of vertical Hall device 100, so that only a very weak electric current flows in the far end of the Hall tub 102 beneath the contacts C1 and C2.

In configurations in which the opposite face layer(s) 16, 16' is/are used to conduct electric current, typically a major portion (>30%, sometimes and/or preferably >90%) of the current flows via the opposite face layer(s).

While FIGS. 15 and 16 show a four-contact vertical Hall device, it is also possible to propose a three-contact vertical Hall device that uses the opposite face layer 16 or 16' to conduct current. While the three-contact vertical Hall device is similar to the four-contact vertical Hall device shown in FIGS. 15 and 16, one difference is that the three-contact vertical Hall device has a contact with low ohmic connection to the opposite face layer and with preferably no (or at least very weak) ohmic connection to the other two contacts. Corresponding embodiments are described below in connection with, for example, FIGS. 55 to 66.

Figure 17:
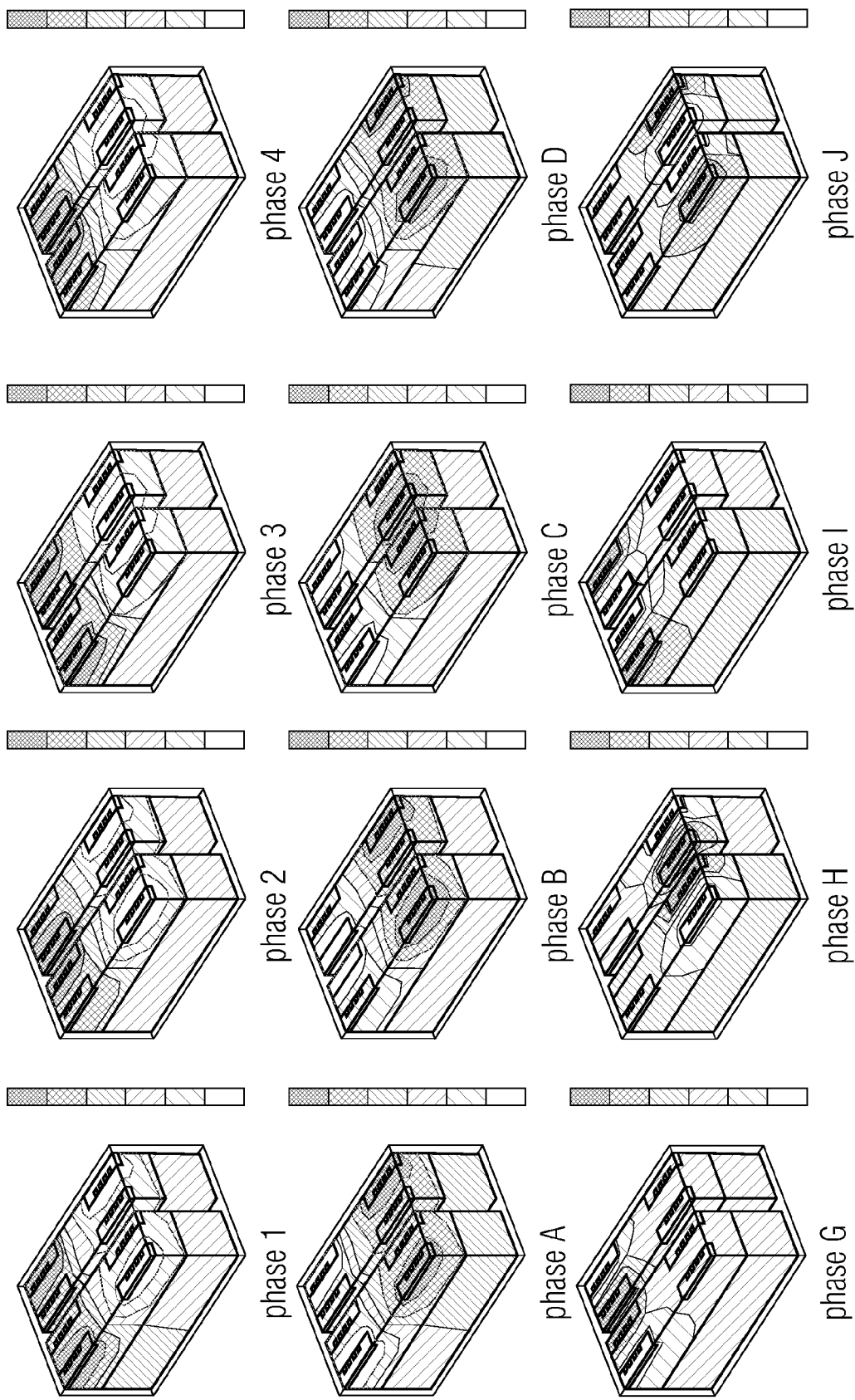
FIG. 17 shows a survey of three-dimensional views of twelve selected clock phases from the table in FIGS. 14A and 14B.
Figure 18:
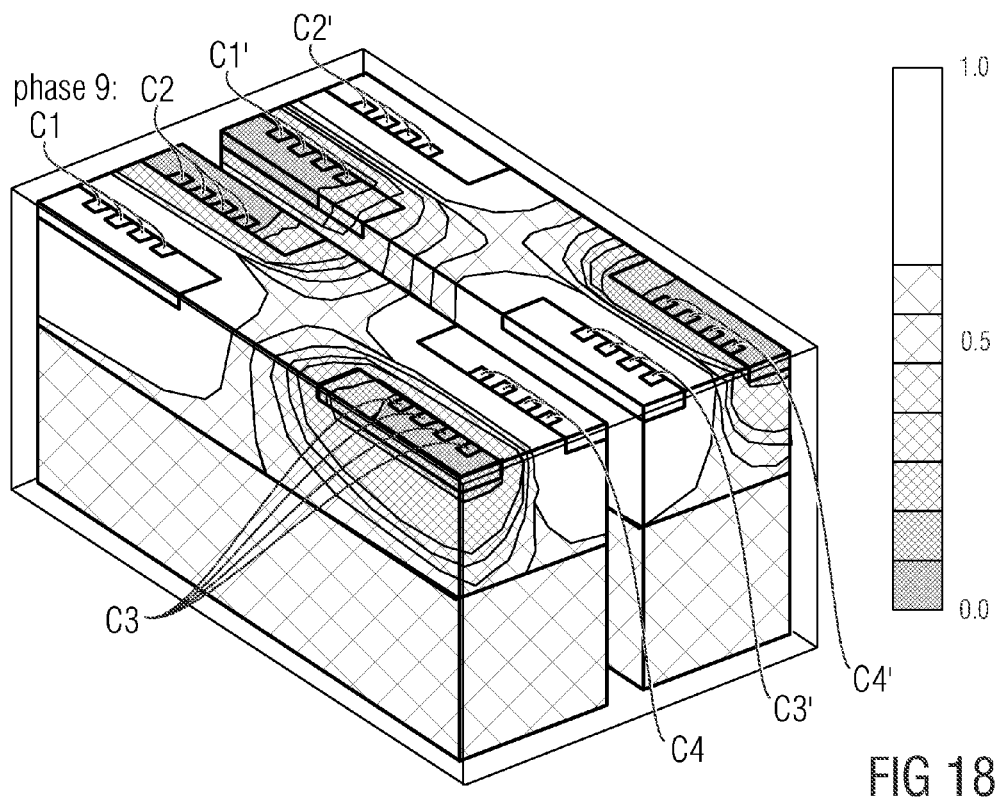
FIG. 18 illustrates a schematic, three-dimensional view of the vertical Hall device from FIG. 15 during clock phase 9.

FIG. 17 shows a survey of twelve clock phases 1, 2, 3, 4, A, B, C, D, G, H, I, and J of a sensing arrangement comprising a first vertical Hall device 100 and a second vertical Hall device 100'. Furthermore, the results of corresponding numerical simulations are illustrated in FIG. 17, FIG. 18 illustrates a schematic, three-dimensional view of the vertical Hall device from FIG. 15 during clock phase 9. The electric potential determined by means of a numerical simulation is illustrated in FIG. 18. An electric current I is injected at contacts C1, C4, C2', and C3' and withdrawn at contacts C2 and C1'. Contacts C3 and C4' are at reference potential (grounded). A dense cross hatching pattern corresponds to a low electric potential (approximately reference potential) and no hatching corresponds to a high electric potential. In each of the vertical Hall devices 100, 100', the contacts at which the electric current 1 is injected are diagonal to each other: contact C1 is diagonal to contact C4, contact C2' is diagonal to contact C3'.

Figure 19:
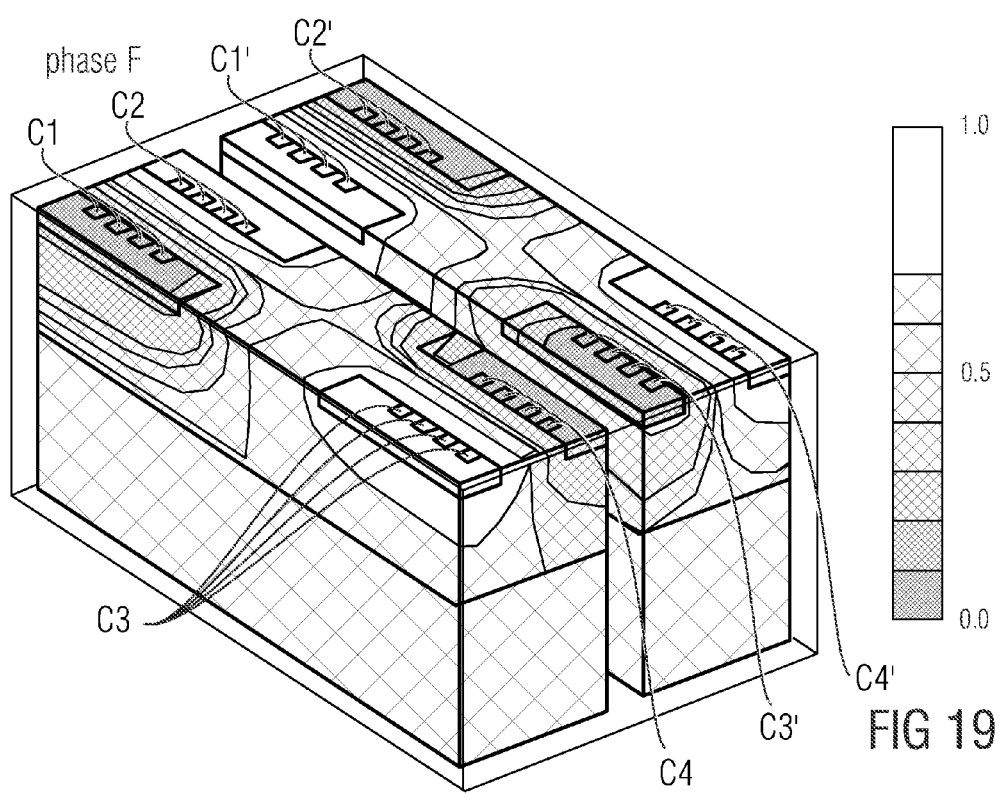
FIG. 19 illustrates in a schematic, three-dimensional view the vertical Hall device from FIG. 15 during clock phase F.

FIG. 19 illustrates in a schematic, three-dimensional view the vertical Hall device from FIG. 15 during clock phase F. Clock phase F is substantially inverse to clock phase 9: the electric current I is injected at contacts C2, C3, C1', and C4' and withdrawn at contacts C1 and C2'. Contacts C4 and C3' are at reference potential.

Figure 37:
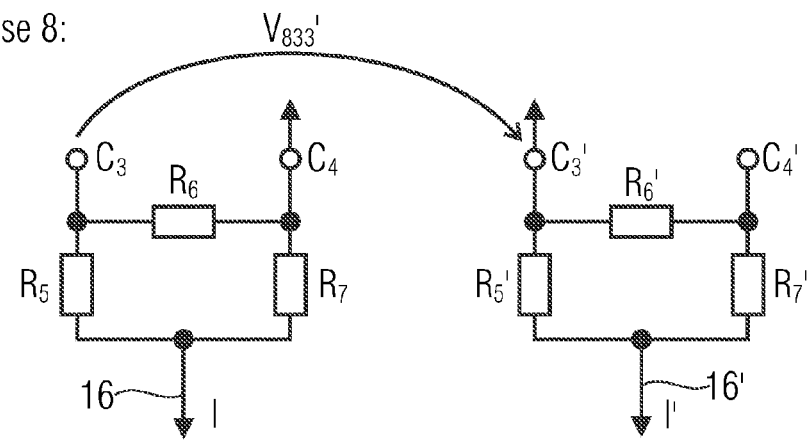
FIG. 37 shows an equivalent circuit diagram of a double-device vertical Hall sensor and corresponding calculations for a phase 8 of the spinning current scheme.
Figure 38:
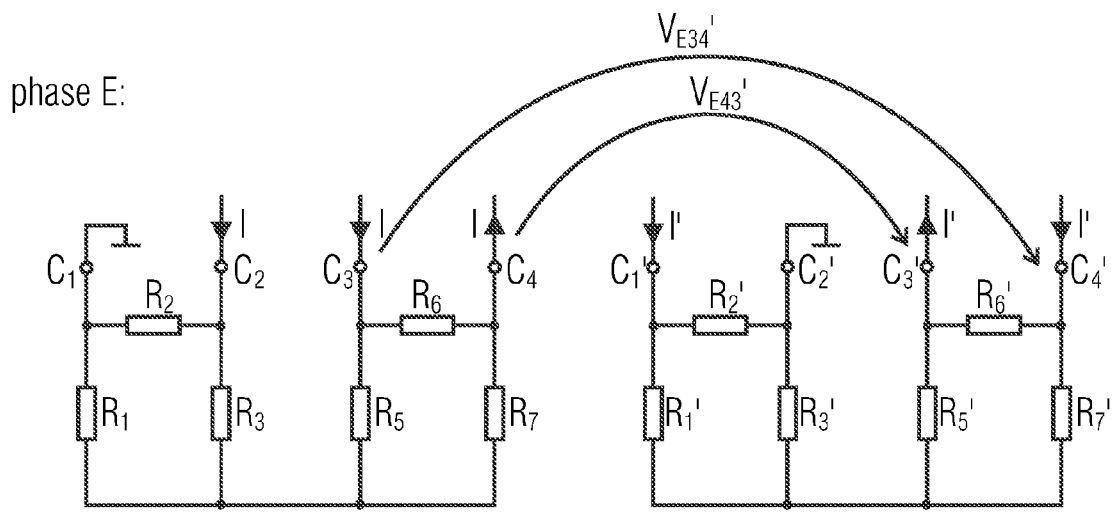
FIG. 38 shows an equivalent circuit diagram of a double-device vertical Hall sensor and corresponding calculations for a phase E of the spinning current scheme.

FIGS. 20 to 38 illustrate further details of the clock phases 1 to 4 (FIGS. 20 to 23), A to D (FIGS. 24 to 27), G to J (FIGS. 28 to 31), 9 (FIG. 32), F (FIG. 33), 5 to 8 (FIGS. 34 to 37), and E (FIG. 38). Each of FIGS. 20 to 38 shows at least a schematic circuit diagram and equations for the sense signals that can be acquired during the corresponding clock phase. Some of the FIGS. 20 to 38 further show a schematic cross section of the vertical Hall device 100 and the further vertical Hall device 100'.

How to Combine the Phases to a Spinning Current Sequence in an Optimum Way:

We have to add the lines (i.e., the sense signals) of the table in FIGS. 14A and 14B in such a way that both signals per phase are used and none is discarded.

Example

We can add the $1^{st}$ and the $3^{rd}$ line to obtain $V_{121'} - V_{212'} = 2(IS_t + I'S_{t'})B_y$, which is free of offset. However, the phases 1 and 2 provide two additional signals in the $2^{nd}$ and $4^{th}$ line. We can subtract both, which gives zero offset but also zero magnetic field signal. This is not efficient, because we used electric power for the devices and we get no useful output for these two signals, if we add the $2^{nd}$ and the $4^{th}$ line, we have a signal but also a strong offset. In order to get rid of the offset we may additionally use lines 19 and 20 (=phases H). If we add lines 2, 4, 19, and 20 we get $-V_{143'}-V_{243'}+V_{H12'}+V_{H21'}=2(IS_j+I'S_{j'}+IS_{ji}+I'S_{ji'})B_y$, which is free of offset. Therefore the three phases 1, 2, and H give a full spinning current cycle with two signals that are free of offset, namely $V_{121'}-V_{212'}$ and $+V_{143'}-V_{243'}+V_{H12'}+V_{H21'}$. Of course both signals can be added and the result has still zero offset. This configuration has the particular advantage that all signals (i.e. the signals at low and high common mode potentials) are used and thus the electric power dissipated in the devices is used in an optimum way.

The same holds for phases 3, 4, and J: $V_{321'}-V_{412'}=2(IS_i+I'S_{i'})B_y$, and $V_{334'}+V_{434'}-V_{J12'}-V_{J21'}=2(IS_j+I'S_{j'}+IS_{ji}+I'S_{ji'})B_y$.

The same holds for phases A, C, and G: $V_{A43'}-V_{C34'}=2(IS_j+I'S_{j'})B_y$, and $-V_{A21'}-V_{C21'}+V_{G34'}+V_{G43'}=2(IS_i+IS_{ij}+I'S_i+I'S_{ij'})B_y$.

The same holds for phases B, D and I: $-V_{B34'}+V_{D43'}=2(IS_j+I'S_{j'})B_y$, and $V_{B21'}-V_{D21'}+V_{B4'}+V_{I43'}=2(IS_i+I'S_i+IS_{ij}+I'S_{ij'})B_y$.

Of course we may add up all these signals according to $$(V_{121'}-V_{212'})+c_1(V_{143'}-V_{243'}+V_{H12'}+V_{H21'})+c_2(V_{321'}-V_{412'})+c_3(V_{344'}+V_{434'}-V_{J12'}-V_{J21'})+c_4(V_{434'}+V_{C34'}+c_5(-V_{A21'}-V_{C12'}+V_{G34'}+V_{G43'})++c_6(-V_{B34'}+V_{D34'})+c_7(V_{B21'}+V_{D12'}-V_{I34'}-V_{I43'})$$

with $c_1, c_2, c_3, c_4, c_5, c_6, c_7$ arbitrary, preferably all of the same sign. A particular choice is $c_1=c_2=c_3=c_4=c_5=c_6=c_7=1$.

Note that the common mode potentials of the signals are different: e.g. the common mode of the signal in the $1^{st}$ line is higher than half of the supply voltage, the common mode of the signal in the $2^{nd}$ line is lower than half of the supply voltage, and the common mode of the signal in lines 19 and 20 is even lower (if the same currents I and I' are used). It is possible to lift the common mode of the signals in lines 19 and 20 by some amount. This is readily done by connecting terminals C3 and C4' in phase H to a voltage source instead of ground potential. If the Hall devices exhibit an electrical non-linearity this will change the residual offset of the spinning current scheme and one may trim this extra voltage to such an extent that the residual offset is minimized.

Note that ideally the currents in the two vertical Hall devices 100 and 100' should be identical I=I', yet even if they are not the residual offset vanishes.

Also the current related magnetic sensitivities do not need to be identical for vanishing offset, i.e. $S_i \neq S_i \neq S_j \neq S_j \neq S_{ji} \neq S_{ji} \neq S_{ij} \neq S_{ij'}$ is possible.

Moreover the layout of the devices may be modified: there are four Hall effect regions, each having two contacts (Hall effect region 1 with contacts C1, C2, Hall effect region 2 with contacts C3, C4, Hall effect region. 3 with contacts C1', C2' and Hall effect region 4 with contacts C3', C4'). It is possible to rotate each Hall effect region by an individual angle in the layout (i.e. in the xy-plane). Then the respective signal of this Hall effect region is proportional to some linear combination of Bx and By (not By alone any more). This does not change anything in the residual offset of the device it changes only its sensitivity to Bx-By-magnetic fields. As an example one may rotate Hall effect regions 2 and 4 by 90°; then they respond to Bx-fields instead of By-fields. It is also possible to rotate Hall effect region 1 and 2 by +/−45°; then the potentials at their signal pins are proportional to Bx+/−By. With this method one can realize numerous arrangements.

According to the above description, embodiments described herein relate to at least one of at least three aspects: A first aspect is a vertical Hall device: It has two pairs of terminals in a Hall tub, where the pairs are separated by a distance that is larger than the shorter one of the following two distances: the distance of each contact to a highly conductive short at the opposite face of the Hall tub, or the distance between the two contacts within each pair of contacts.

A second aspect is to operate this device in a differential way: Two devices of identical topology (yet not necessarily identical size and orientation of tub or contacts) are used. The first device is biased in a way to generate a rising signal at positive applied magnetic field. The second device is biased in a different way such as to generate a different signal at positive applied magnetic field. Preferably the second device is biased in a mirror symmetric way such as to generate a failing signal at positive applied magnetic field. Each device has two outputs: one at low common mode potential and one at high common mode potential. The two devices finally render two differential signals: one is the difference of outputs of both devices at high common mode potential and the other one is the difference of outputs of both devices at low common mode potential. The biasing of the two devices has to be done in such a way that the signals at both high and tow common mode potentials vanish or nearly vanish (i.e. they are less than typically 10 mV) at vanishing magnetic field.

A third aspect relates to an operating scheme that injects currents at various nodes in various operating phases and samples differential output voltages. If the differential output voltages are added up properly, offsets are substantially cancelled and the total signal has only a very small zero point error.

The highly conductive opposite face node 16 may be implemented as a highly-conductive layer, such as a n-doped buried layer (nBL). However, a nBL is not the only possible implementation. The proposed vertical Hall device does not depend on a particular type of technology. Rather, at least one further aspect relates to the fact that the vertical Hall device may comprise two Hall effect regions that are coupled basically by a short circuit that typically is not accessible (because it is at the opposite face of the Hall effect regions and possibly even buried).

The short circuit can be made by a semiconducting layer (nBL). Another option for the short circuit can be some buried metallic short, wafer through contacts shorted at the opposite face of the substrate by some means like metal wires, or alternative structures.

Typically, the Hall tub(s) can be formed in an epitaxial layer, but alternatives for this choice are also imaginable. The essential properties of the material of the Hall tub is a large Hall mobility. Preferably the conductivity should not be too high in order to limit the current consumption of the device if operated at usual supply voltages of 0.5 . . . 3V.

It is not important that all four contacts are in the same Hall tub. It might be feasible or even better if two separate Hall tubs would be available that can be connected to each other via their nBLs at their opposite faces. Yet in some of today's semiconductor processes this is not available: If one Hall tub is isolated, its nBL is also cut off in an inevitable manner, which is then not accessible anymore so that the opposite face of this tub cannot be contacted anymore. One possible solution is to make one large Hall tub and place two pairs of contacts in far distance to each other: then each pair is coupled closer to the common nBL than to the other pair of contacts and this serves the purpose: the current flows vertically up/down and not laterally between the pairs of contacts. If there is no conductive path from the 1st pair of contacts to the 2nd pair of contacts except the buried conductive node (opposite face node), the equivalent circuit diagram according to FIG. 8 applies. If however, there is an alternative conductive path between both pairs of contacts (like e.g. in FIGS. 2, 56, and 59) a more general equivalent circuit diagram of this 4-terminal device is needed. Such a circuit diagram is given in the article "Limits of offset cancellation by the principle of spinning current Hall probe", by Udo Ausserlechner. Proc. Of IEEE Sensors, 2004, pages 1117-1120, vol. 3, the entire content of which is incorporated herein by reference.

Of course it is also possible to insert, some isolating diffusions between the two pairs of contacts: e.g. a reverse biased p-well can help to prevent current flowing in a direction from the $1^{st}$ pair of contacts 210 to the $2^{nd}$ pair of contacts 220 without traversing through the nBL 16 (this current would not generate any useful Hall signal and is considered as a loss that, has to be kept small). For such a device, an equivalent circuit diagram according to FIG. 8 applies. Please note that the state of the art knows shallow or semi-shallow/semi-deep reverse biased p-diffusions between contacts, but not between pairs of contacts.

For the contacts one usually needs shallow n+S/D-diffusion or emitter diffusion with doping levels of about $10^{19}/cm^3$ or higher. It is also possible to add further n-tubs like CMOS wells (medium-doped wells) around these shallow diffusions: they are less conductive than the n+S/D but significantly higher conductive than the active Hall region (by at least a factor 10). They may extend deeper into the Hall tub (about 1 . . . 2 µm) and often they are allowed to reach laterally right to the perimeter of the Hall tub (e.g. no spacing from lateral Isolation trench needed). This is advantageous for the magnetic sensitivity of the device. FIGS. 15 and 16 show examples of such further n-tubs (e.g., CMOS wells) 27, 17-2, 17-3, and 17-4.

Figure 20:
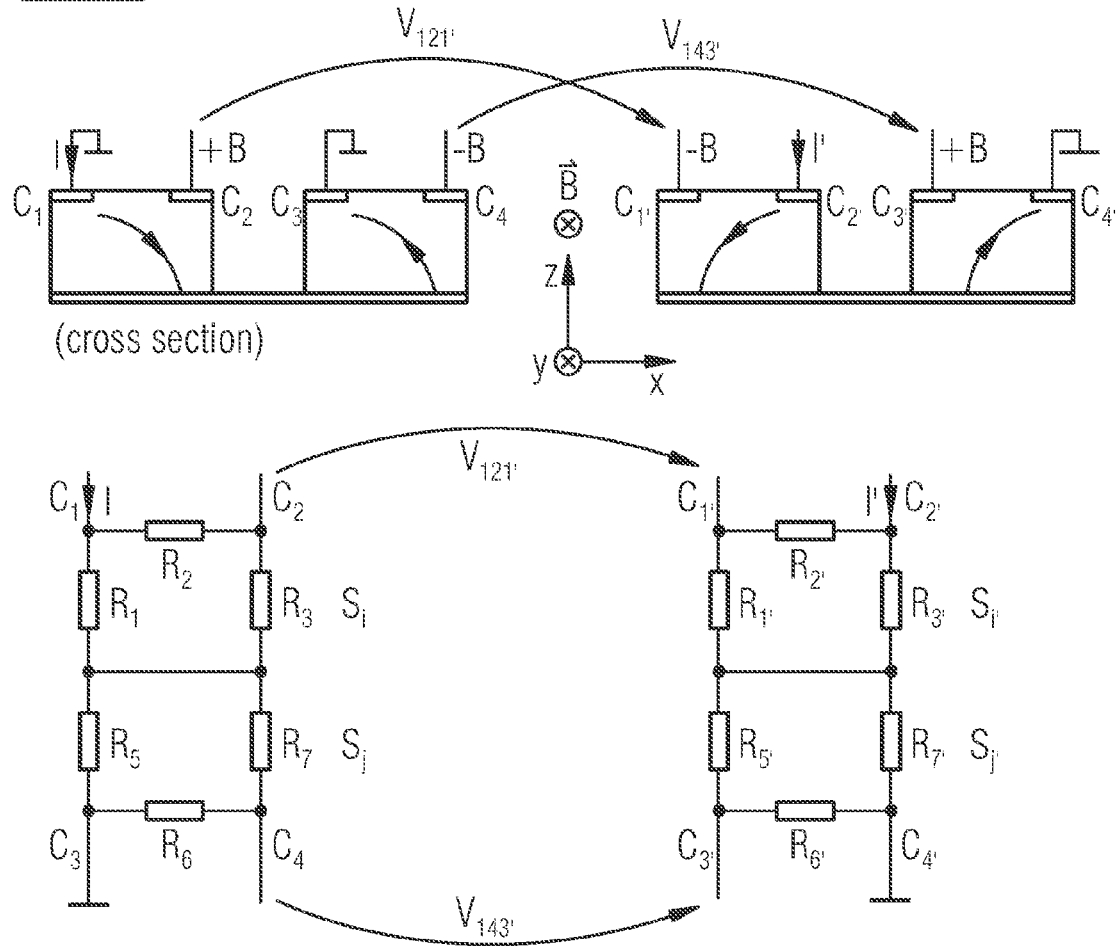
FIG. 20 shows a schematic cross section and an equivalent circuit diagram of a double-device vertical Hall sensor similar to FIG. 13A during a phase 1 of a spinning current scheme.

FIG. 20 shows a schematic cross section and a schematic circuit diagram of a sensing arrangement comprising a vertical Hall device 100 and a further vertical Hall device 100'. The vertical Hall device 100 is represented by a resistor network of six resistors $R_1$, $R_2$, $R_3$, $R_5$, $R_6$ and $R_7$. The resistor network of the vertical Hall device comprises four contacts $C_1$, $C_2$, $C_3$, and $C_4$. The further vertical Hall 100' device is represented in FIG. 20 by a resistor network of six resistors $R_1'$, $R_2'$, $R_3'$, $R_4'$, $R_5'$, $R_6'$, and $R_7'$. The resistor network of the further vertical Hall device 100' also provides four contacts $C_1'$, $C_2'$, $C_3'$ and $C_4'$. The vertical Hall device 100 and the further vertical Hall device 100' may be congruent to each other, but do not necessarily have to. The vertical Hall device and the further vertical Hall device each comprise a first Hall effect region and a second Hall effect region in a semiconductor body, a highly conductive opposite face node, a first pair of contacts, a second pair of contacts, and isolation means between the first Hall effect region and the second Hall effect region. The first Hall effect region of the vertical Hall device is represented in FIG. 17 by the resistors $R_1$, $R_2$, and $R_3$. A current-related sensitivity of the first Hall effect region is denoted by $S_i$. The second Hall effect region of the vertical Hall device is represented by resistors $R_5$, $R_6$ and $R_7$, and its current-related sensitivity is denoted by $S_j$. Regarding the further vertical Hall device, $S_i'$ is the current-related sensitivity of the first Hall effect region of the further vertical Hall device, and $S_j'$ is the current-related sensitivity of the second Hall effect region of the further vertical Hall device. In addition, as mentioned above, for some clock phases further magnetic sensitivities $S_{ij}$, $S_{ji}$, $S_{ij}'$, and $S_{ji}'$ have to be considered, in case these clock phases are used for determining a measurement signal indicative of the magnetic field.

FIG. 20 illustrates the sensing arrangement during a first phase of a spinning current scheme. An electric current I is supplied to the contact $C_1$ of the vertical Hall device. The contact $C_3$ of the vertical Hall device as schematically illustrated in the left part of FIG. 20 is connected to ground so that the electric current I leaves the vertical device via contact $C_3$ (disregarding possible leakage currents). The contacts $C_2$ and $C_4$ are substantially floating and serve as sense contacts.

Turning now to the further vertical Hall device which is schematically illustrated as a circuit diagram in FIG. 20, an electrical current I' is supplied to the further Hall device via contact $C_2'$ and leaves the further vertical Hall device at contact $C_4'$ (again, disregarding possible leakage currents). The sensing arrangement comprising the vertical Hall device and the further vertical Hall device can be operated according to a differential operation by sensing new sense voltages between the vertical Hall device and the further vertical Hall device. A first sense voltage $V_{121'}$ is measured between the contact $C_2$ of the vertical Hall device and the contact $C_1'$ of the further vertical Hall device.

$$V_{121'} = I\left\{R_1 \| (R_2 + R_3)\frac{R_3}{R_2 + R_3} + R_5 \| (R_6 + R_7) + S_i B_y\right\} -$$
$$- I'\left\{R_3' \| (R_1' + R_2')\frac{R_1'}{R_1' + R_2'} + R_7' \| (R_5' + R_6') - S_i' B_y\right\} =$$
$$= I\left\{\frac{R_1 R_3}{R_1 + R_2 + R_3} + R_5 \| (R_6 + R_7) + S_i B_y\right\} -$$
$$- I'\left\{\frac{R_1' R_3'}{R_1' + R_2' + R_3'} + R_7' \| (R_5' + R_6') - S_i' B_y\right\}$$

A second sense voltage $V_{143'}$ is sensed between contact $C_4$ of the vertical Hall device and contact $C_3'$ of the further vertical Hall device.

$$V_{143'} = I\left\{R_5 \| (R_6 + R_7)\frac{R_6}{R_6 + R_7} - S_j B_y\right\} -$$
$$- I'\left\{R_7' \| (R_5' + R_6')\frac{R_6'}{R_5' + R_6'} + S_j' B_y\right\} =$$
$$= I\left\{\frac{R_5 R_6}{R_5 + R_6 + R_7} - S_j B_y\right\} -$$
$$- I'\left\{\frac{R_6' R_7'}{R_5' + R_6' + R_7'} + S_j' B_y\right\}$$

Figure 21:
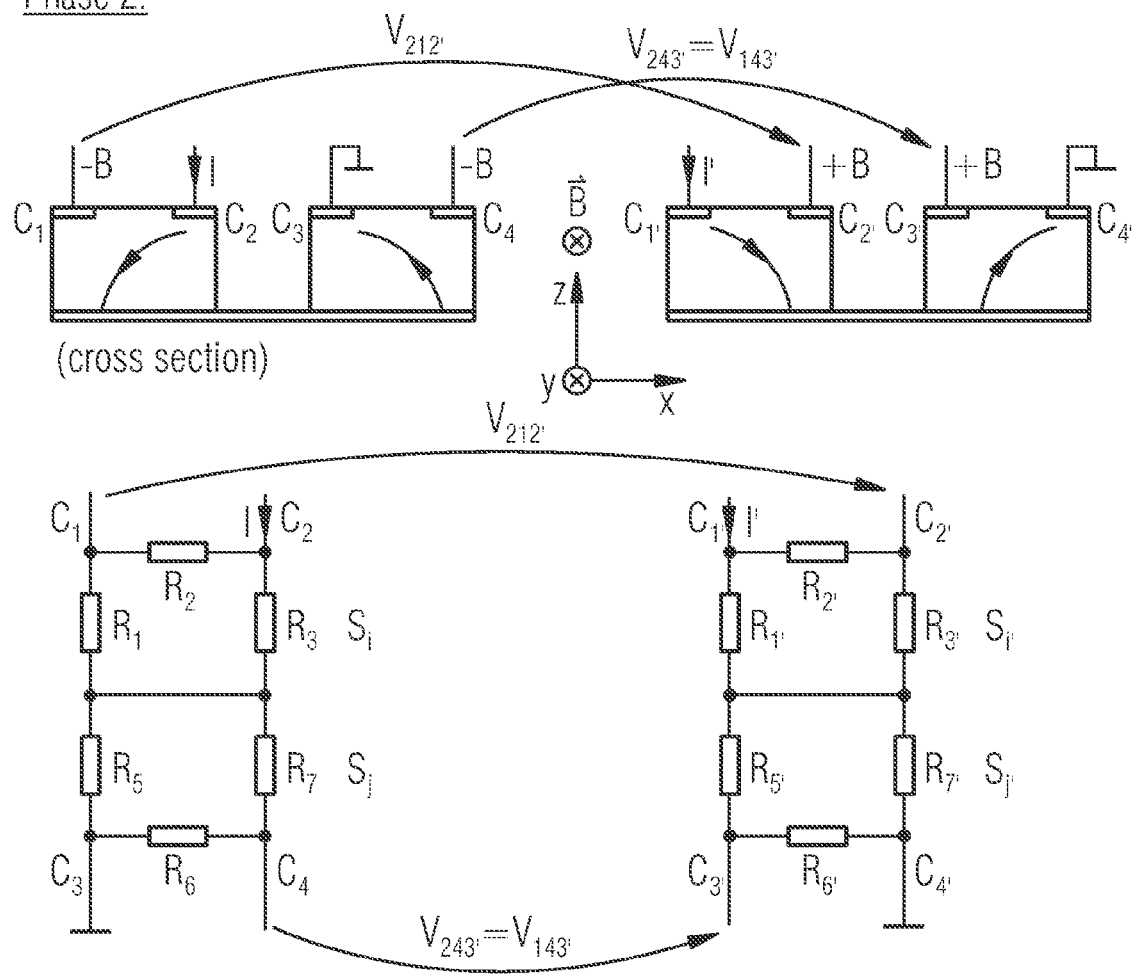
FIG. 21 shows a schematic cross section and an equivalent circuit diagram of a double-device vertical Hall sensor similar to the one in FIG. 13B during a phase 2 of the spinning current scheme.

FIG. 21 illustrates the sensing arrangement during a second phase of the spinning current scheme. Contact $C_3$ of the vertical Hall device and contact $C_4'$ of the further vertical Hall device are still connected to ground, as in phase 1 (FIG. 20). For the vertical Hall device, the electric current I is now supplied via contact $C_2$. For the further vertical Hall device 100' the electric current I' is now supplied via $C_1'$. A first sense voltage (high common mode sense voltage) $V_{212'}$ is sensed between contact $C_1$ of the vertical Hall device and contact $C_2'$ of the further vertical Hall device.

$$V_{212'} = I\left\{R_3 \| (R_1 + R_2)\frac{R_1}{R_1 + R_2} + R_5 \| (R_6 + R_7) + S_i B_y\right\} -$$
$$- I'\left\{R_1' \| (R_2' + R_3')\frac{R_3'}{R_2' + R_3'} + R_7' \| (R_5' + R_6') - S_i' B_y\right\} =$$
$$= I\left\{\frac{R_1 R_3}{R_1 + R_2 + R_3} + R_5 \| (R_6 + R_7) + S_i B_y\right\} -$$

-continued $$-I'\left\{\frac{R'_1 R'_3}{R'_1 + R'_2 + R'_3} + R'_7 \right\| (R'_5 + R'_6) - S'_i B_y\right\}$$

A second sense voltage $V_{243'}$ (low common mode sense voltage) is sensed between contacts $C_4$ and $C_3'$, which is identical to the second sense voltage (low common mode sense voltage) $V_{143'}$ of phase 1 (cf. above equation).

Figure 22:
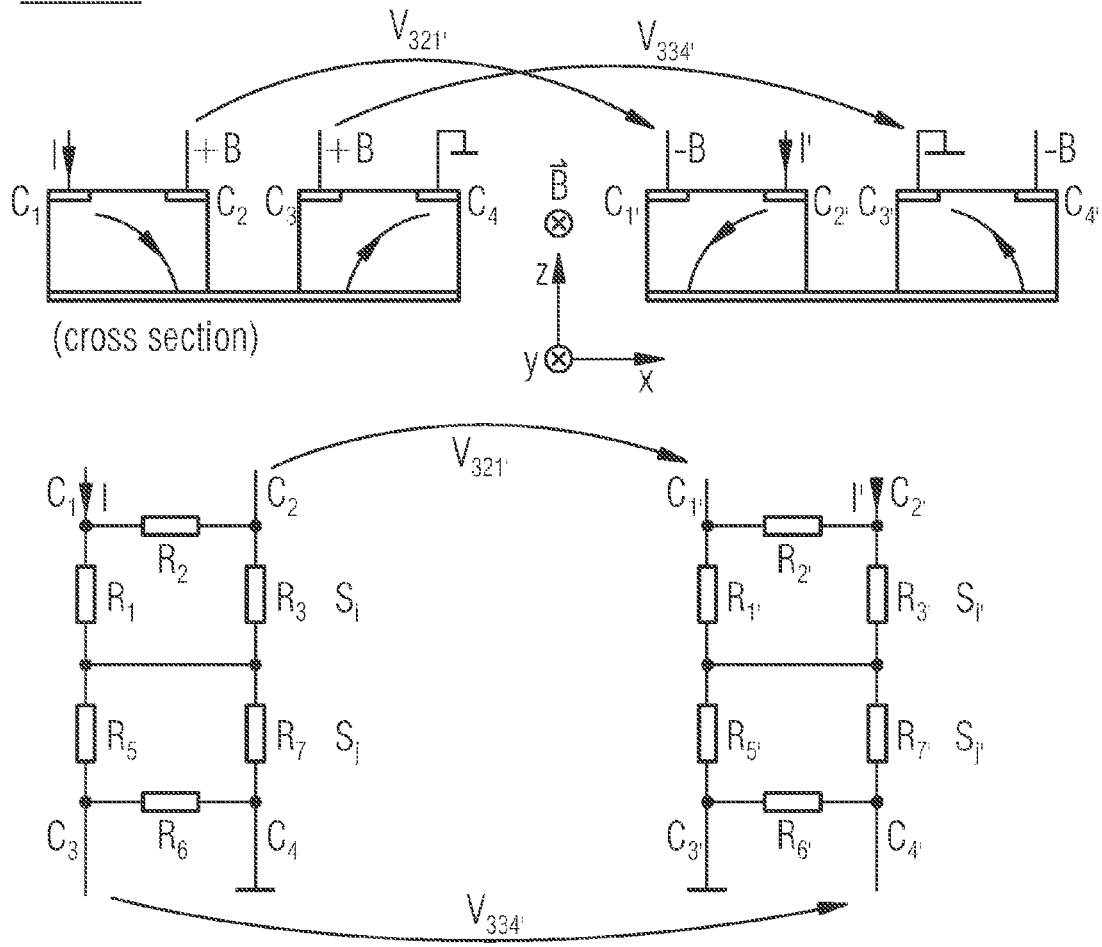
FIG. 22 shows a schematic cross section and an equivalent circuit diagram of a double-device vertical Hall sensor similar to the one shown in FIG. 13D during a phase 3 of the spinning current scheme.

FIG. 22 schematically illustrates the sensing arrangement in circuit diagram form during a third phase of the spinning current scheme. The electric current I is fed to the vertical Hall device via contact $C_1$ and leaves the vertical Hall device at contact. $C_4$ which is connected to ground. The electric current I' is fed to the further vertical Hall device via contact $C_2'$ and leaves the further vertical Hall device via contact $C_3'$, which is connected to ground. A first sense voltage $V_{321'}$ (high common mode) is sensed between contacts $C_2$ and $C_1'$.

$$V_{321'} = I\left\{R_1 \| (R_2 + R_3)\frac{R_3}{R_2 + R_3} + R_7 \| (R_5 + R_6) + S_i B_y\right\} -$$

$$-I'\left\{R'_3 \| (R'_1 + R'_2)\frac{R'_1}{R'_1 + R'_2} + R'_5 \| (R'_6 + R'_7) - S'_i B_y\right\} =$$

$$= I\left\{\frac{R_1 R_3}{R_3 + R_2 + R_3} + R_7 \| (R_5 + R_6) + S_i B_y\right\} -$$

$$-I'\left\{\frac{R'_1 R'_3}{R'_1 + R'_2 + R'_3} + R'_5 \| (R'_6 + R'_7) - S'_i B_y\right\}$$

A second sense voltage $V_{334'}$ (low common mode) is sensed between contacts $C_3$ and $C_4'$.

$$V_{334'} = I\left\{R_7 \| (R_5 + R_6)\frac{R_6}{R_5 + R_6} + S_j B_y\right\} -$$

$$-I'\left\{R'_5 \| (R'_6 + R'_7)\frac{R'_6}{R'_6 + R'_7} - S'_j B_y\right\} =$$

$$= I\left\{\frac{R_6 R_7}{R_5 + R_6 + R_7} + S_j B_y\right\} -$$

$$-I'\left\{\frac{R'_5 R'_6}{R'_5 + R'_6 + R'_7} - S'_j B_y\right\}$$

Figure 23:
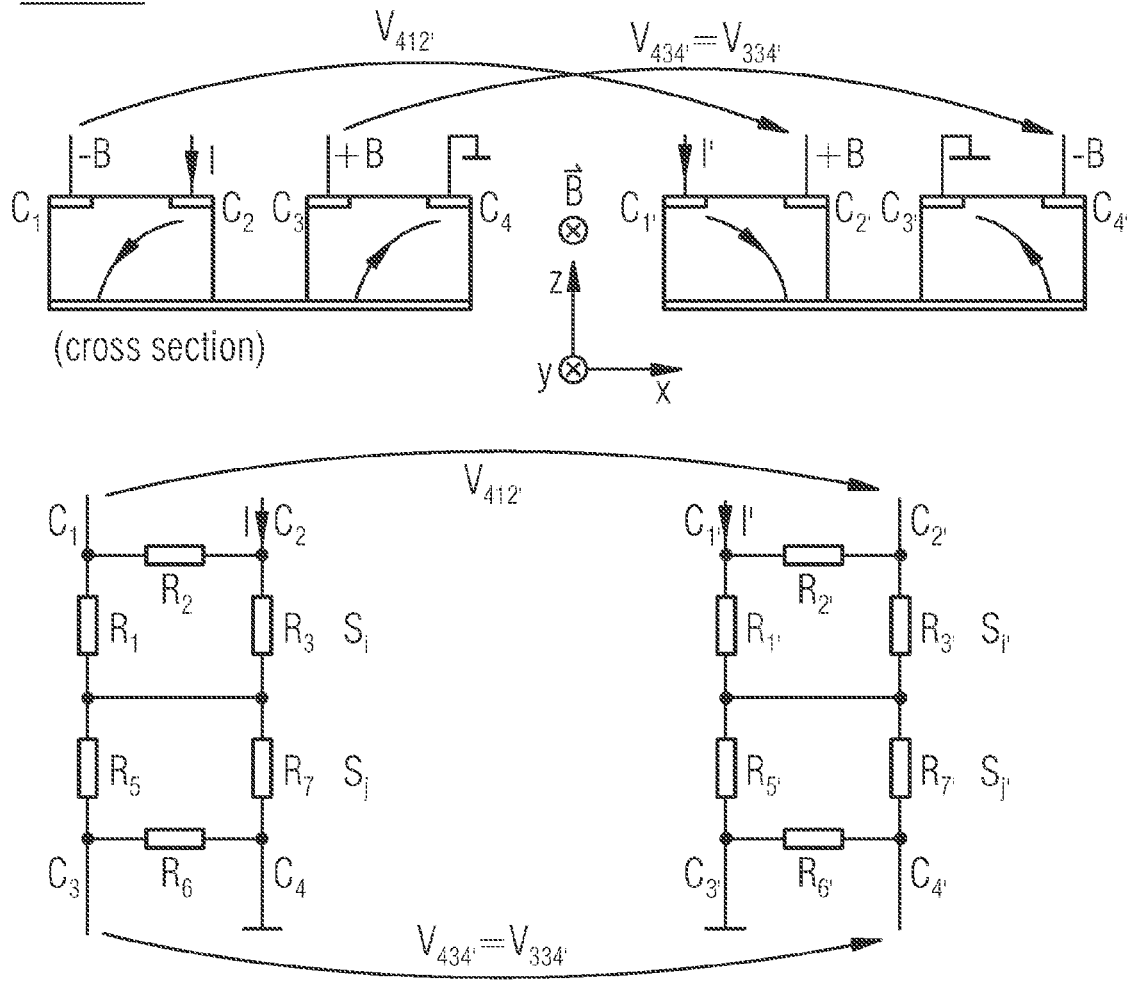
FIG. 23 shows a schematic cross section and an equivalent circuit diagram of a double-device vertical Hall sensor similar to the one shown in FIG. 13C during a phase 4 of the spinning current scheme.

FIG. 23 shows a schematic circuit diagram of the sensing arrangement during a fourth phase of the spinning current scheme. For the vertical Hall device the contacts $C_2$ and $C_4$ function as supply contacts, and the contacts $C_1$ and $C_3$ function as sense contacts. For the further vertical Hall device 100' the contacts $C_1'$ and $C_3'$ function as supply contacts, and the contacts $C_2'$ and $C_4'$ function as sense contacts. A first sense voltage $V_{412'}$ (high common mode) is sensed between contacts $C_1$ and $C_2'$.

$$V_{412'} = I\left\{R_3 \| (R_1 + R_2)\frac{R_1}{R_1 + R_2} + R_7 \| (R_5 + R_6) - S_i B_y\right\} -$$

$$-I'\left\{R'_1 \| (R'_2 + R'_3)\frac{R'_3}{R'_2 + R'_3} + R'_5 \| (R'_6 + R'_7) + S'_i B_y\right\} =$$

$$= I\left\{\frac{R_1 R_3}{R_1 + R_2 + R_3} + R_7 \| (R_5 + R_6) - S_i B_y\right\} -$$

$$-I'\left\{\frac{R'_1 R'_3}{R'_1 + R'_2 + R'_3} + R'_5 \| (R'_6 + R'_7) + S'_i B\right\}$$

A second sense voltage $V_{434'}$ (low common mode) is sensed between contacts $C_3$ and $C_4'$.

$$V_{434'} = V_{334'} = I\left\{R_7 \| (R_5 + R_6)\frac{R_6}{R_5 + R_6} + S_j B\right\} -$$

$$-I'\left\{R'_5 \| (R'_6 + R'_7)\frac{R'_6}{R'_6 + R'_7} - S'_j B\right\} =$$

$$= I\left\{\frac{R_6 R_7}{R_5 + R_6 + R_7} + S_j B\right\} -$$

$$-I'\left\{\frac{R'_5 R'_6}{R'_5 + R'_6 + R'_7} - S'_j B\right\}$$

The sense signals obtained during the four clock phases 1 to 4 which have been described above can be combined with each other. For example, when subtracting sense voltage $V_{212'}$ obtained in clock phase 2 from sense voltage $V_{121'}$ obtained in clock phase 1, it can be seen that the resistance-dependent terms substantially cancel so that the difference is substantially equal to $$V_{121'} - V_{212'} = +2 \cdot I \cdot S_i \cdot B + 2 \cdot I' \cdot S_i' \cdot B$$

In a similar manner, the resistance-dependent terms cancel in the difference of the two sense voltages $V_{321'}$ and $V_{412'}$ obtained during clock phases 3 and 4, respectively:

$$V_{321'} - V_{412'} = +2 \cdot I \cdot S_i \cdot B + 2 \cdot I' \cdot S_i' \cdot B$$

On the other hand, the resistance-dependent terms do not completely cancel out in a difference of the sense voltages $V_{334'}$ and $V_{143'}$:

$$V_{334'} - V_{143'} = I\left\{\frac{R_6 R_7}{R_5 + R_6 + R_7} - \frac{R_5 R_6}{R_5 + R_6 + R_7} + 2 \cdot S_j \cdot B\right\} -$$

$$-I'\left\{\frac{R'_5 R'_6}{R'_5 + R'_6 + R'_7} - \frac{R'_6 R'_7}{R'_5 + R'_6 + R'_7} - 2 \cdot S'_j \cdot B\right\}$$

However, the difference of the sense voltages $V_{434'}$ and $V_{243'}$ is substantially identical to the difference of the sense voltages $V_{334'}$ and $V_{143'}$:

However, the attempt to exploit this by determining a difference signal along the line of $V_{434'} - V_{243'} - V_{334'} + V_{143'}$ results in a mutual cancellation of the magnetic field-dependent terms, as well.

In FIGS. 24 to 31 which are described now, eight further clock phases are graphically illustrated which can be used to provide sense signals containing resistance-dependent terms that may be used for cancelling resistance-dependent terms in other clock phases white preserving or even constructively superposing the magnetic field-dependent terms.

FIG. 24 shows a schematic cross section and a schematic circuit diagram of the sensing arrangement during a phase A of the spinning current scheme. For the first vertical Hall device 100 the contacts $C_3$ and $C_1$ function as supply contacts, and the contacts $C_2$ and $C_4$ function as sense contacts. In other words, an electric current I is fed to the vertical Hall device 100 via contact $C_3$. An electric current I' is fed to the further vertical Hall device 100' via contact $C_4'$. A sense voltage $V_{A21'}$ is measured between contacts $C_2$ and $C_1'$. Another sense voltage $V_{A43'}$ is measured between contacts $C_4$ and $C_3'$. The schematic cross section in FIG. 24 shows the vertical Hall device 100 during phase A of the spinning current scheme. The approximate current flow directions within the first Hall effect region 110 and the second Hall effect region 120 are schematically illustrated by arrows. The sense contact C4 is at the left side of the current streamlines so that the electric potential at contact C4 increases with increasing magnetic field, as indicated by the expression "+B". The contact C2 is at the right side of the current streamlines (when moving with the current streamlines) so that the electric potential at contact C2 falls with a rising magnetic field, as indicated by "−B". For the further vertical Hall device 100' the contacts $C_4'$ and $C_2'$ function as supply contacts, and the contacts $C_1'$ and $C_3'$ function as sense contacts.

$$V_{A21'} = I\left\{R_1 \| (R_2+R_3)\frac{R_2}{R_2+R_3} - S_iB_y\right\} - $$
$$-I'\left\{R_3' \| (R_1'+R_2')\frac{R_2'}{R_1'+R_2'} + S_i'B_y\right\}$$

$$V_{A43'} = I\left\{R_5 \| (R_6+R_7)\frac{R_7}{R_6+R_7} + R_1 \| (R_2+R_3) + S_iB_y\right\} - $$
$$-I'\left\{R_7' \| (R_5'+R_6')\frac{R_5'}{R_5'+R_6'} + R_3' \| (R_1'+R_2') - S_j'B_y\right\}$$

Figure 25:
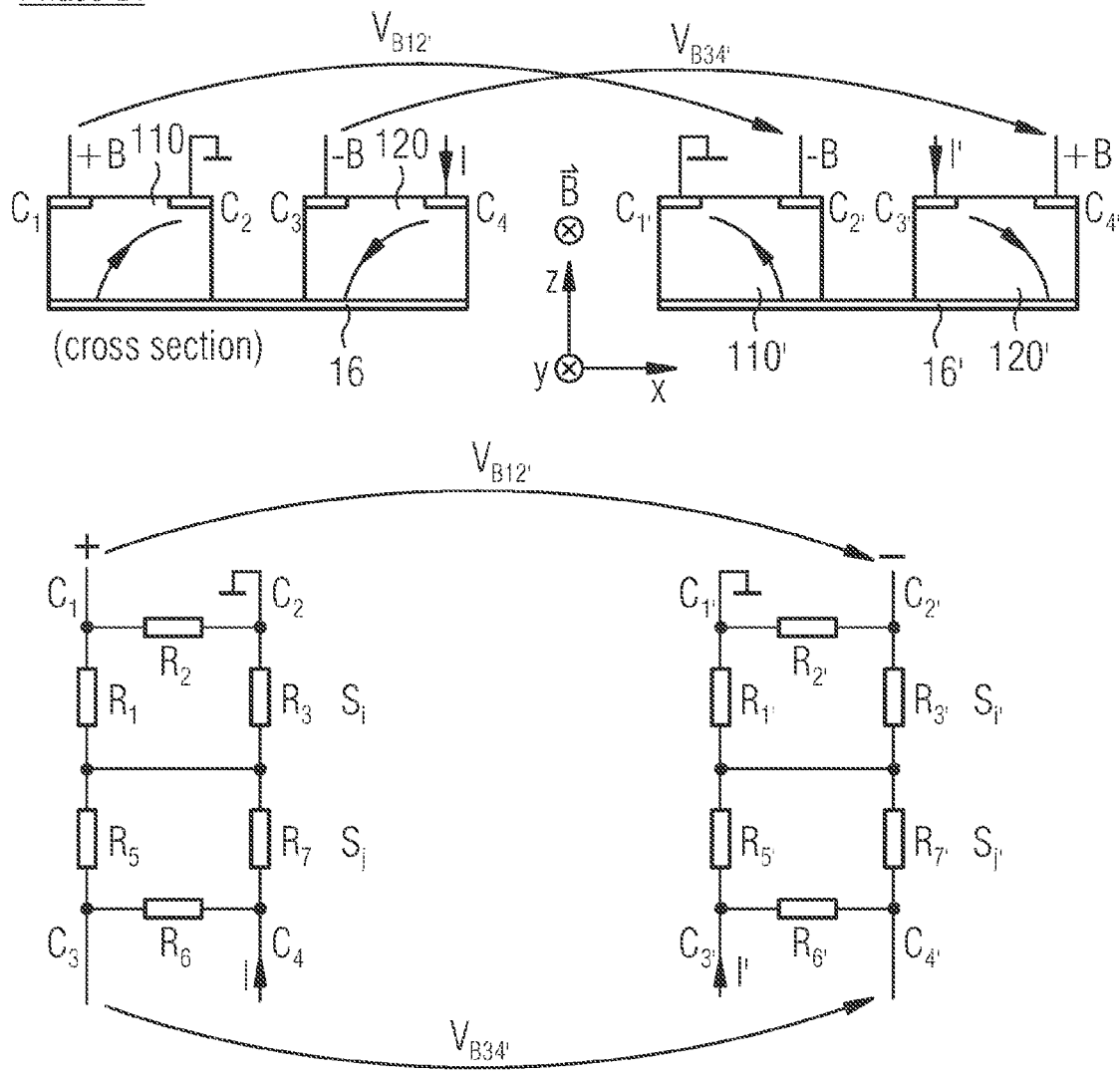
FIG. 25 shows a schematic cross section and an equivalent circuit diagram of a double-device vertical Hall sensor similar to the one shown in FIG. 13G during a phase B of the spinning current scheme.

FIG. 25 shows a schematic cross section and a schematic circuit diagram of the sensing arrangement during a phase B of the spinning current scheme. For the first vertical Hall device 100 the contacts $C_4$ and $C_2$ function as supply contacts, and the contacts $C_1$ and $C_3$ function as sense contacts. For the further vertical Hall device 100' the contacts $C_3'$ and $C_1'$ function as supply contacts, and the contacts $C_2'$ and $C_4'$ function as sense contacts. A first sense voltage $V_{B12'}$ (low common mode) is sensed between contacts $C_1$ and $C_2'$.

$$V_{B12'} = I\left\{R_3 \| (R_1+R_2)\frac{R_2}{R_1+R_2} + S_iB_y\right\} - $$
$$-I'\left\{R_1' \| (R_2'+R_3')\frac{R_2'}{R_2'+R_3'} - S_i'B_y\right\}$$

A second sense voltage $V_{B34'}$ (high common mode) is sensed between contacts $C_3$ and $C_4'$.

$$V_{B34'} = I\left\{R_7 \| (R_5+R_6)\frac{R_5}{R_5+R_6} + R_3 \| (R_1+R_2) - S_jB_y\right\} - $$
$$-I'\left\{R_5' \| (R_6'+R_7')\frac{R_7'}{R_6'+R_7'} + R_1' \| (R_2'+R_3') + S_i'B_y\right\}$$

Figure 26:
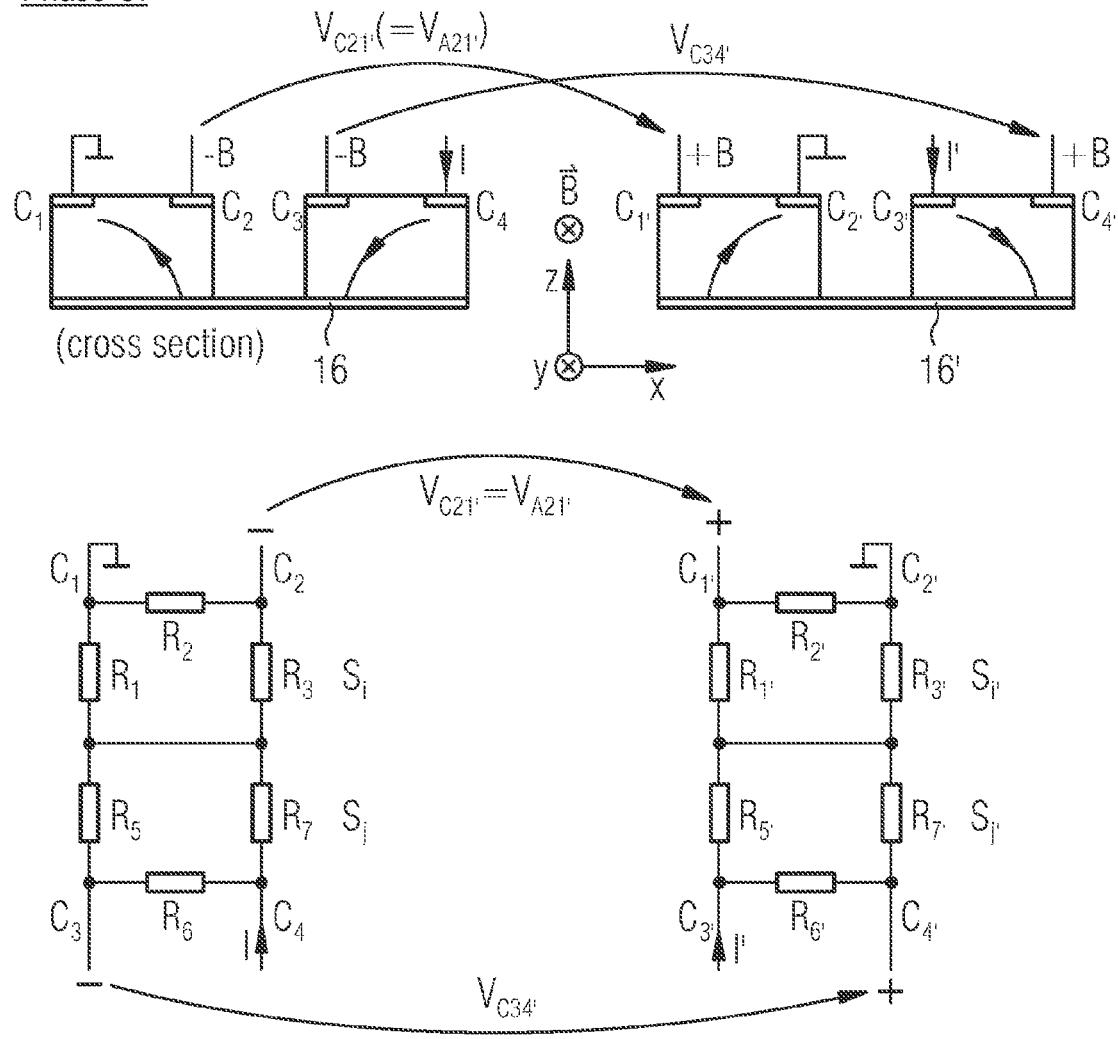
FIG. 26 shows a schematic cross section and an equivalent circuit diagram of a double-device vertical Hall sensor similar to the one shown in FIG. 13H during a phase C of the spinning current scheme.

FIG. 26 shows a schematic cross section and a schematic circuit diagram of the sensing arrangement during a phase C of the spinning current scheme. For the first vertical Hall device 100 the contacts $C_4$ and $C_1$ function as supply contacts, and the contacts $C_2$ and $C_3$ function as sense contacts. For the further vertical Hall device 100' the contacts $C_3'$ and $C_2'$ function as supply contacts, and the contacts $C_1'$ and $C_4'$ function as sense contacts. A sense voltage $V_{C34'}$ is sensed between contacts $C_3$ and $C_4'$.

$$V_{C34'} = I\left\{R_7 \| (R_5+R_6)\frac{R_5}{R_5+R_6} + R_1 \| (R_2+R_3) - S_jB_y\right\} - $$
$$-I'\left\{R_5' \| (R_6'+R_7')\frac{R_7'}{R_6'+R_7'} + R_3' \| (R_1'+R_2') + S_j'B_y\right\}$$

Another sense voltage $V_{C21'}$ in clock phase C corresponds to sense voltage $V_{A21'}$ obtained during clock phase A.

Figure 27:
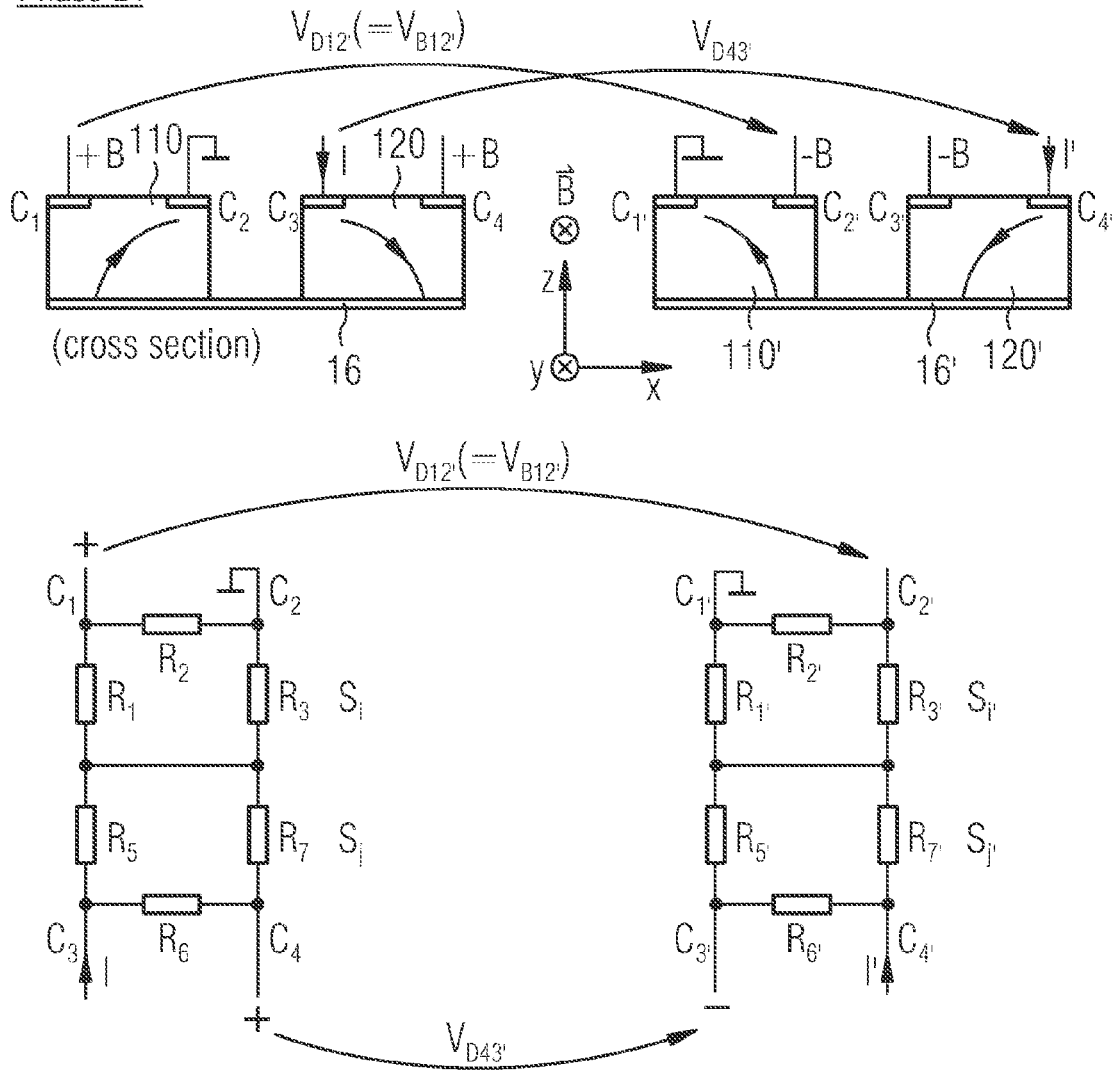
FIG. 27 shows a schematic cross section and an equivalent circuit diagram of a double-device vertical Hall sensor similar to the one shown in FIG. 13F during a phase D of the spinning current scheme.

FIG. 27 shows a schematic cross section and a schematic circuit diagram of the sensing arrangement during a phase D of the spinning current scheme. For the first vertical Hall device 100 the contacts $C_3$ and $C_2$ function as supply contacts, and the contacts $C_1$ and $C_4$ function as sense contacts. For the further vertical Hall device 100' the contacts $C_4'$ and $C_1'$ function as supply contacts, and the contacts $C_2'$ and $C_3'$ function as sense contacts. A first sense voltage $V_{D12'}$ is sensed between contacts $C_1$ and $C_2'$ and corresponds to sense voltage $V_{B12'}$:

$$V_{D12'} = I\left\{R_3 \| (R_1+R_2)\frac{R_2}{R_1+R_2} + S_iB_y\right\} - $$
$$-I'\left\{R_1' \| (R_2'+R_3')\frac{R_2'}{R_2'+R_3'} - S_i'B_y\right\}$$

A second sense voltage $V_{D43'}$ is sensed between contacts $C_4$ and $C_3'$:

$$V_{D43'} = I\left\{R_3 \| (R_6+R_7)\frac{R_7}{R_6+R_7} + R_3 \| (R_1+R_2) - S_iB_y\right\} - $$
$$-I'\left\{R_7' \| (R_5'+R_6')\frac{R_5'}{R_5'+R_6'} + R_1' \| (R_2'+R_3') + S_j'B_y\right\}$$

FIG. 28 shows a schematic cross section and a schematic circuit diagram of the sensing arrangement during a phase G of the spinning current scheme. For the first vertical Hall device 100 the contacts $C_2$ and $C_1$ function as supply contacts, and the contacts $C_3$ and $C_4$ function as sense contacts. For the further vertical Hall device 100' the contacts $C_1'$ and $C_2'$ function as supply contacts, and the contacts $C_3'$ and $C_4'$ function as sense contacts. A first sense voltage $C_{G34'}$ is sensed between contacts $C_3$ and $C_4'$:

$$V_{G34'} = I\left\{R_2 \| (R_1+R_3)\frac{R_1}{R_1+R_3} + S_{ij}B_y\right\} - $$
$$-I'\left\{R_2' \| (R_1'+R_3')\frac{R_3'}{R_1'+R_3'} - S_{ij}'B_y\right\}$$

A second sense voltage $V_{G43'}$ is sensed between contacts $C_4$ and $C_3'$. It turns out that both sense voltages $V_{G34'}$ and $V_{G43'}$ are equal, i.e. $V_{G34'}=V_{G43'}$. The explanation is that the second Hall effect regions 120 and 120' are substantially inactive (i.e. no current flows over R5, R7, R5', R7'). Note that the contacts can also be scrambled so that the voltages VG33' and are measured. They are identical to $V_{G34'}=V_{G43'}$.

Figure 29:
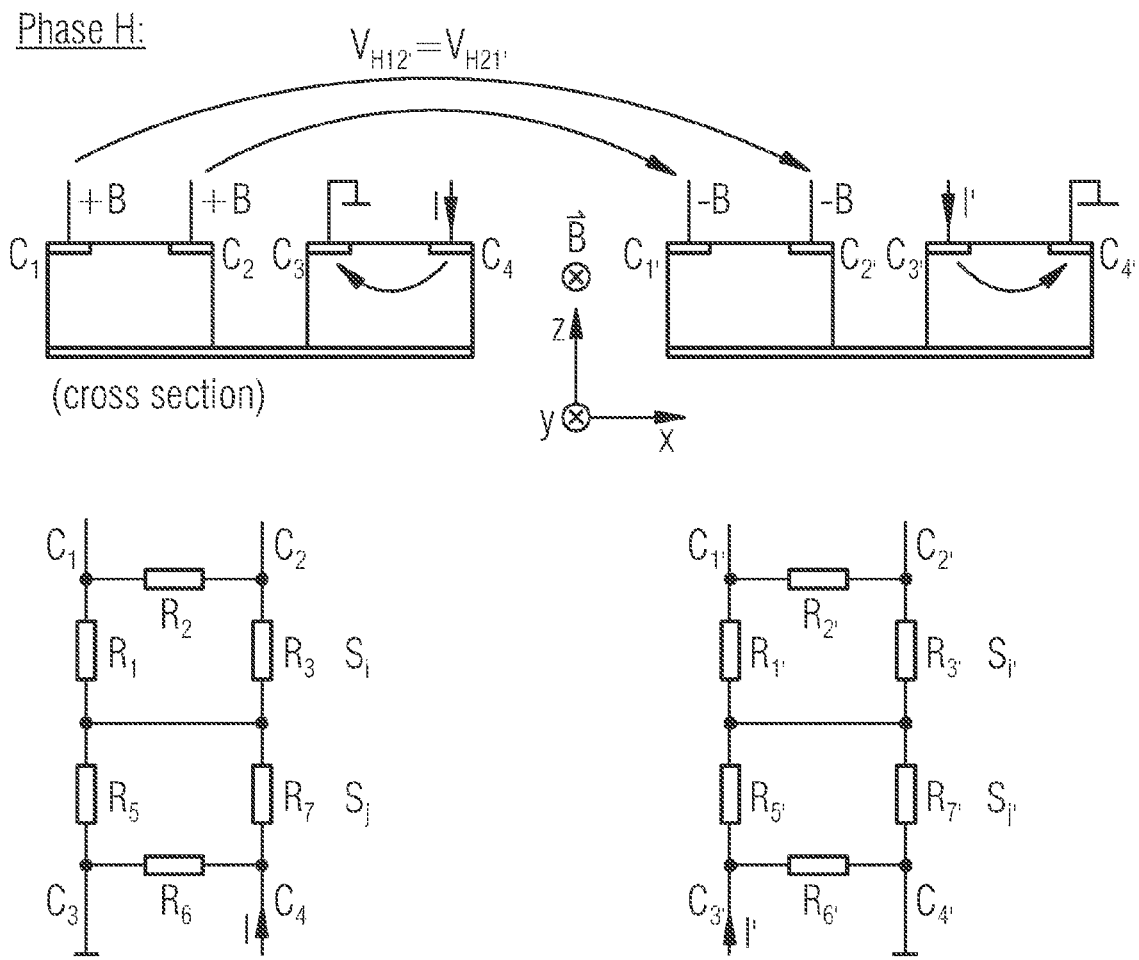
FIG. 29 shows a schematic cross section and an equivalent circuit diagram of a double-device vertical Hall sensor similar to the one shown in FIG. 13L during a phase H of the spinning current scheme.

FIG. 29 shows a schematic cross section and a schematic circuit diagram of the sensing arrangement during a phase H of the spinning current scheme. For the first vertical Hall device 100, the contacts $C_4$ and $C_3$ function as supply contacts, and the contacts $C_1$ and $C_2$ function as sense contacts. For the further vertical Hall device 100' the contacts $C_3'$ and $C_4'$ function as supply contacts, and the contacts $C_1'$ and $C_2'$ function as sense contacts. A first sense voltage $V_{H12'}$ is sensed between contacts $C_1$ and $C_2'$ and a substantially equal second sense voltage $V_{H12'}$ is sensed between contacts $C_2$ and $C_1'$:

$$V_{H12'} = V_{H21'}$$

$$= I\left\{R_6 \| (R_5 + R_7)\frac{R_5}{R_5 + R_7} + S_{ij}B_y\right\} -$$

$$- I'\left\{R_6' \| (R_5' + R_7')\frac{R_7'}{R_5' + R_7'} - S_{ij}'B_y\right\}$$

FIG. 30 shows a schematic cross section and a schematic circuit diagram of the sensing arrangement during a phase I of the spinning current scheme. For the first vertical Hall device 100, the contacts $C_1$ and $C_2$ function as supply contacts, and the contacts $C_3$ and $C_4$ function as sense contacts. For the further vertical Hall device 100' the contacts $C_1'$ and $C_2'$ function as supply contacts, and the contacts $C_3'$ and $C_4'$ function as sense contacts. A first sense voltage $V_{I34'}$ is sensed between contacts $C_3$ and $C_4$, and a substantially equal second sense voltage $V_{I43'}$ is sensed between contacts $C_4$ and $C_3$:

$$V_{I34'} = V_{I43'}$$

$$= I\left\{R_2 \| (R_1 + R_3)\frac{R_3}{R_1 + R_3} - S_{ij}B_y\right\} -$$

$$- I'\left\{R_2' \| (R_1' + R_3')\frac{R_1'}{R_1' + R_3'} + S_{ij}'B_y\right\}$$

FIG. 31 shows a schematic cross section and a schematic circuit diagram of the sensing arrangement during a phase J of the spinning current scheme. For the first vertical Hall device 100, the contacts $C_3$ and $C_4$ function as supply contacts, and the contacts $C_1$ and $C_2$ function as sense contacts. For the further vertical Hall device 100' the contacts $C_4'$ and $C_3'$ function as supply contacts, and the contacts $C_1'$ and $C_2'$ function as sense contacts. A first sense voltage $V_{J12'}$ is sensed between contacts $C_1$ and $C_2$, and a substantially equal second sense voltage $V_{J21'}$ is sensed between contacts $C_2$ and $C_1$:

$$V_{J12'} = V_{J21'}$$

$$= I\left\{R_6 \| (R_5 + R_7)\frac{R_7}{R_5 + R_7} - S_{ij}B_y\right\} -$$

$$- I'\left\{R_6' \| (R_5' + R_7')\frac{R_5'}{R_5' + R_7'} + S_{ij}'B_y\right\}$$

Figure 33:
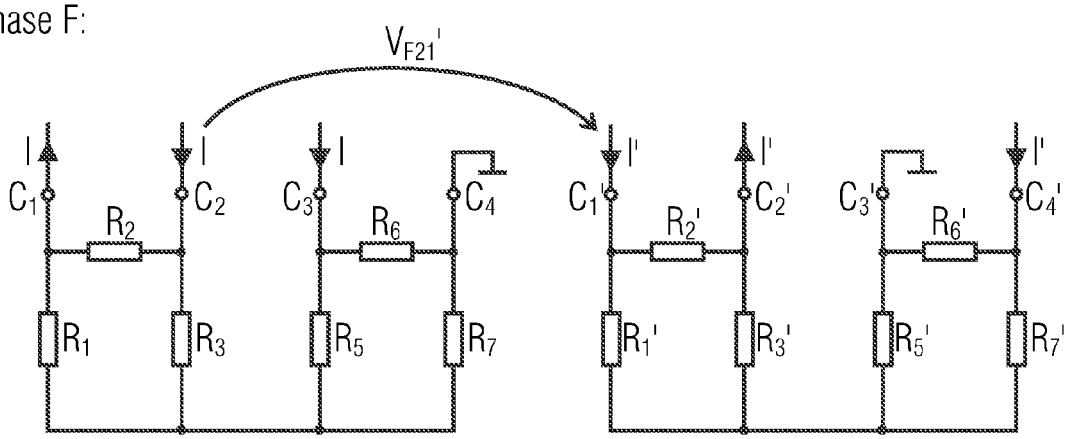
FIG. 33 shows an equivalent circuit diagram of a double-device vertical Hall sensor during a phase F of the spinning current scheme.

FIG. 32 shows a schematic circuit diagram of the sensing arrangement during a clock phase 9 of the spinning current scheme. Clock phase 9 and also clock phase F which is illustrated in FIG. 33 differ from most of the other clock phases in that all four contacts are used to supply or withdraw electric current to/from the Hall effect regions 110, 120, 110', and 120'.

During clock phase 9, an electric current I is supplied to contact $C_1$ and an equal further electric current I is supplied to contact $C_4$ of the first vertical Hall device 100. An electric current I is withdrawn at contact $C_2$. Contact $C_3$ is connected to the reference potential, and as the current balance of the first vertical Hall device 100 has to be zero, a further electric current I' necessarily leaves the second Hall effect region 120 via contact $C_3$. An electric current I' is also supplied to each of the contacts $C_2'$ and $C_3'$ of the further vertical Hall device 100'. An electric current I' leaves the further vertical Hall device 100' at contact $C_1'$. Again, an electric current I' also has to leave the further vertical Hall device 100' at contact $C_4'$ which is connected to the reference potential.

Three sense voltages can be obtained during clock phase 9: $V_{912'}$, $V_{921'}$, and $V_{922'}$:

$$V_{912'} = I\left\{R_6 \|(R_5 + R_7)\frac{R_5}{R_5 + R_7} + R_2\|(R_1 + R_3)\frac{R_1}{R_1 + R_3} - S_{ij}B_y\right\} -$$

$$- I'\left\{R_6'\|(R_5' + R_7')\frac{R_7'}{R_5' + R_7'} + R_2'\|(R_1' + R_3')\frac{R_3'}{R_1' + R_3'} + S_{ij}'B_y\right\}$$

$$V_{921'} = I\left\{R_6 \|(R_5 + R_7)\frac{R_5}{R_5 + R_7} - R_2\|(R_1 + R_3)\frac{R_3}{R_1 + R_3} - S_{ij}B_y\right\} -$$

$$- I'\left\{R_6'\|(R_5' + R_7')\frac{R_7'}{R_5' + R_7'} - R_2'\|(R_1' + R_3')\frac{R_1'}{R_3' + R_3'} + S_{ij}'B_y\right\}$$

$$V_{922'} = I\left\{R_6 \|(R_5 + R_7)\frac{R_5}{R_5 + R_7} - R_2\|(R_1 + R_3)\frac{R_3}{R_1 + R_3} - S_{ij}B_y\right\} -$$

$$- I'\left\{R_6'\|(R_5' + R_7')\frac{R_7'}{R_5' + R_7'} + R_2'\|(R_1' + R_3')\frac{R_3'}{R_1' + R_3'} - S_{ij}'B_y\right\}$$

During clock phase F, an electric current I is supplied to contact $C_2$ and an equal further electric current I is supplied to contacts $C_3$ of the first vertical Hall device 100. An electric current I is withdrawn at contact $C_1$. Contact $C_4$ is connected to the reference potential, and as the current balance of the first vertical Hall device 100 has to be zero (neglecting leakage currents), a further electric current I necessarily leaves the second Hall effect region 120 via contact $C_4$. An electric current I' is also supplied to each of the contacts $C_1'$ and $C_4'$ of the further vertical Hall device 100'. An electric current I' leaves the further vertical Hall device 100' at contact $C_2'$. Again, an electric current I' also has to leave the further vertical Hall device 100' at contact $C_3'$ which is connected to the reference potential.

A sense voltage $V_{F21'}$ can be obtained during clock phase F:

$$V_{F21'} = I\left\{R_6\|(R_5 + R_7)\frac{R_7}{R_5 + R_7} + R_2\|(R_1 + R_3)\frac{R_3}{R_1 + R_3} + S_i B_y\right\} -$$

$$- I'\left\{R_6'\|(R_5' + R_7')\frac{R_5'}{R_5' + R_7'} + R_2'\|(R_1' + R_3')\frac{R_1'}{R_3' + R_3'} - S_i' B_y\right\}$$

For completeness, five further possible clock phases 5 to 8 and E are illustrated in FIGS. 34 to 38 in schematic circuit diagram form. In FIGS. 34 to 37 only the second Hall effect regions 120 and 120' are depicted in schematic circuit diagram form. Obviously one could use the first Hall effect regions instead of the second ones, thereby obtaining 4 additional clock phases. In those Hall effect regions, which are not shown, either one or both contacts can be used to supply the device with electric current.

Figure 34:
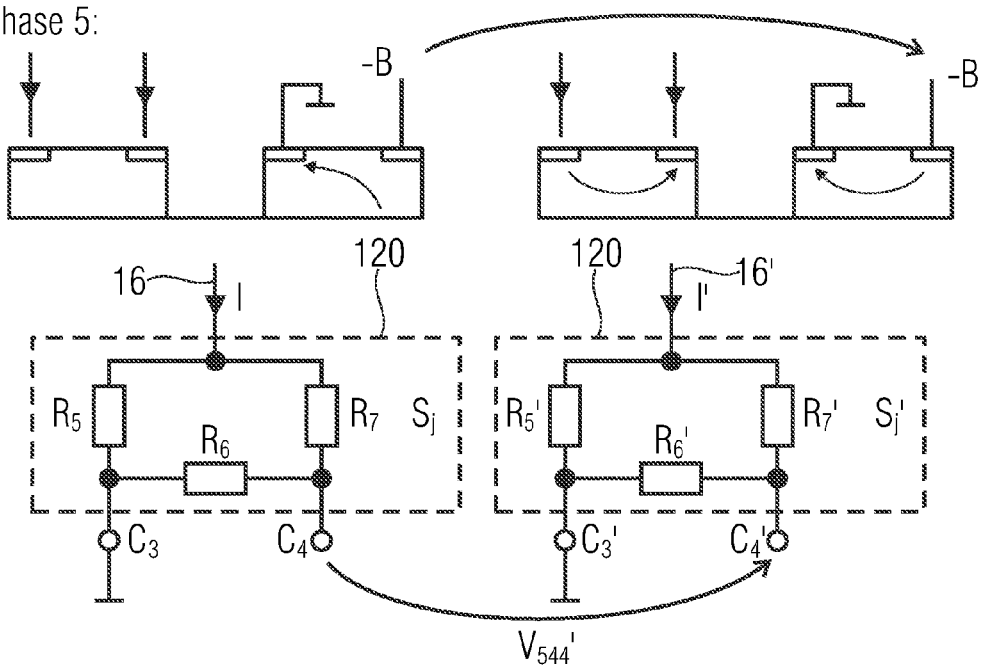
FIG. 34 shows an equivalent circuit diagram and corresponding calculations for a double-device vertical Hall sensor during a phase 5 of the spinning current scheme.

Clock phase 5 is schematically illustrated in FIG. 34. The sense signal $V_{544'}$ of interest is obtained between the second Hall effect regions 120 and 120' of the vertical Hall devices 100, 100'. An electric current I enters the second Hall effect region 120 via the highly conductive, opposite face node 16. For the further vertical Hall effect device 100', an electric current I' enters the second Hall effect region 120' via the highly conductive, opposite face node 16'. The sense voltage $V_{544'}$ is given by $$V_{344'} = I\left\{R_5 \| (R_6 + R_7)\frac{R_6}{R_6 + R_7}\right\} - I'\left\{R_5' \| (R_6' + R_7')\frac{R_6'}{R_6' + R_7'}\right\} =$$

$$= I\frac{R_5 R_6}{R_5 + R_6 + R_7} - I'\frac{R_5' R_6'}{R_5' + R_6' + R_7'}$$

Figure 35:
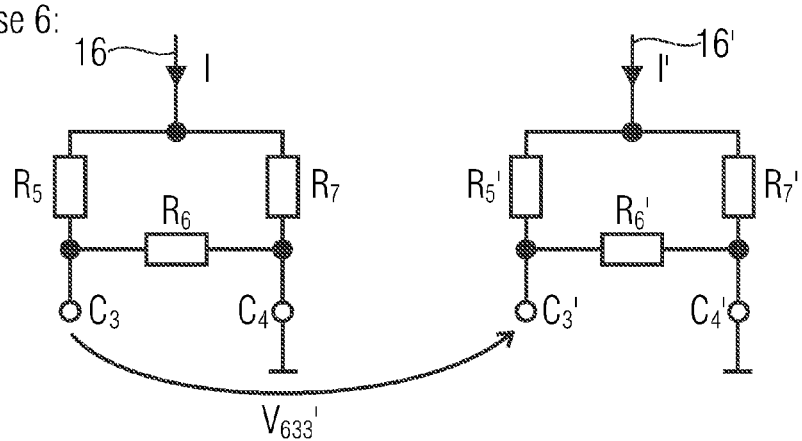
FIG. 35 shows an equivalent circuit diagram of a double-device vertical Hall sensor and corresponding calculations for a phase 6 of the spinning current scheme.

Clock phase 6 is schematically illustrated in FIG. 35. The sense signal $V_{633'}$ of interest is obtained between the second Hall effect regions 120 and 120' of the vertical Hall effect devices 100, 100'. As for clock phase 5, an electric current I enters the second Hall effect region 120 via the highly conductive, opposite face node 16. For the further vertical Hall effect device 100', an electric current I' enters the second Hall effect region 120' via the highly conductive, opposite face node 16'. The sense voltage $V_{633'}$ is given by $$V_{633'} = \left\{R_7 \| (R_5 + R_6)\frac{R_6}{R_5 + R_6}\right\} - I'\left\{R_7' \| (R_5' + R_6')\frac{R_6'}{R_5' + R_6'}\right\} =$$

$$= I\frac{R_6 R_7}{R_5 + R_6 + R_7} - I'\frac{R_6' R_7'}{R_5' + R_6' + R_7'}$$

The sense voltages $V_{143'}$, $V_{544'}$, $V_{633'}$, and $V_{344'}$ from phase 1, phase 5, phase 6, and phase 3, respectively, of the spinning current scheme can be combined in an additive and subtractive manner so that respective resistance terms substantially cancel out. In particular, it is proposed to perform the following combination: $V_{143'} - V_{544'} - V_{633'} + V_{344'}$. With the above introduced shorthand notation, the resistance-related terms responsible for the offset error can be written as:

+56−6'7'−56+5'6'−67+6'7'+67−5'6'.

Moreover, note that the sense voltages $V_{544'}$ and $V_{633'}$ in phases 5 and 6 have no sensitivity to the B-field. Sense voltage $V_{143'}$ has a positive dependency on the B-field and sense voltage $V_{334'}$ has a negative dependency on the B-field.

Figure 36:
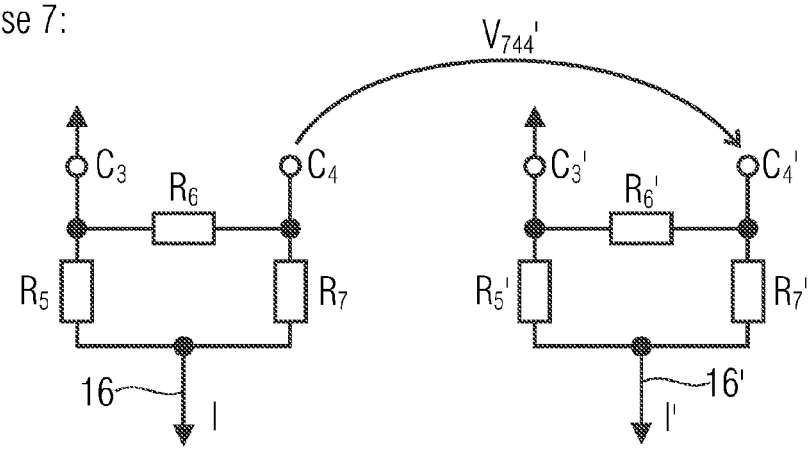
FIG. 36 shows an equivalent circuit diagram of a double-device vertical Hall sensor and corresponding calculations for a phase 7 of the spinning current scheme.

Clock phase 7 is schematically illustrated in FIG. 36. The sense signal $V_{744'}$ of interest is obtained between the second Hall effect regions 120 and 120' of the vertical Hall effect devices 100, 100'. An electric current I leaves the second Hall effect region 120 via the highly conductive, opposite face node 16. For the further vertical Hall effect device 100', an electric current I' leaves the second Hall effect region 120' via the highly conductive, opposite face node 16'. The sense voltage $V_{744'}$ is given by $$V_{744'} = I\left\{R_5 \| (R_6 + R_7)\frac{R_7}{R_6 + R_7}\right\} - I'\left\{R_5' \| (R_6' + R_7')\frac{R_7'}{R_6' + R_7'}\right\} =$$

$$= I\frac{R_5 R_7}{R_5 + R_6 + R_7} - I'\frac{R_5' R_7'}{R_5' + R_6' + R_7'}$$

Clock phase 8 is schematically illustrated in FIG. 37. The sense signal $V_{833'}$ of interest is obtained between the second Hall effect regions 120 and 120' of the vertical Hall effect devices 100, 100'. As in clock phase 7, an electric current I leaves the second Hall effect region 120 via the highly conductive, opposite face node 16. For the further vertical Hall effect device 100', an electric current I' leaves the second Hall effect region 120' via the highly conductive, opposite face node 16'. The sense voltage $V_{833'}$ is given by $$V_{833'} = I\left\{R_7 \| (R_5 + R_6)\frac{R_5}{R_5 + R_6}\right\} - I'\left\{R_7' \| (R_5' + R_6')\frac{R_5'}{R_5' + R_6'}\right\} =$$

$$= I\frac{R_5 R_7}{R_5 + R_6 + R_7} - I'\frac{R_5' R_7'}{R_5' + R_6' + R_7'}$$

Clock phase E is schematically illustrated in FIG. 38. As to the first vertical Hall device 100, an electric current I is injected at contacts $C_2$ and $C_3$, respectively. An electric current I is extracted at contact $C_4$. Contact $C_1$ is connected to the reference potential and due Kirchhoff's Law, also an electric current I has to leave the first Hall effect region 110 via contact $C_1$. Regarding the second vertical Hall device 100', an electric current I' is injected at contacts $C_1'$ and $C_4'$, respectively. An electric current of the same magnitude I' is extracted at contact $C_3'$. Contact $C_2'$ is connected to the reference potential and an electric current I' leaves the first Hall effect region 110' of the second vertical Hall device 100' via this contact $C_2'$. The sense voltage $V_{833'}$ is given by $$V_{E34'} = I\left\{R_2 \| (R_1 + R_3)\frac{R_1}{R_1 + R_3} + R_6 \| (R_5 + R_7)\frac{R_5}{R_5 + R_7} - S_i B_y\right\} -$$

$$- I'\left\{R_2' \| (R_1' + R_3')\frac{R_3'}{R_1' + R_3'} + R_6' \| (R_5' + R_7')\frac{R_7'}{R_7' + R_7'} + S_i' B_y\right\}$$

Figure 39:
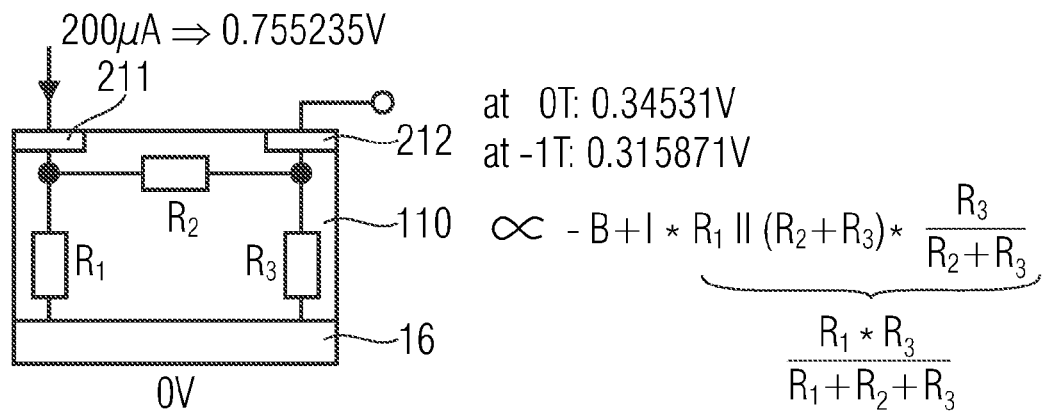
FIG. 39 shows a combination of a schematic cross-section and a simplified equivalent circuit diagram of a vertical Hall effect region, measurement voltages for different magnetic fields, a mathematical expression for calculating the voltage at the sense contacts, while an electric current is fed to a left contact of the vertical Hall effect region.

FIG. 39 shows a schematic cross section of a first Hall effect region 110 to which an electric current of 200 μA is fed via contact 211. For a specific first Hall effect region 110, this current of 200 μA leads to a voltage between the contact 211 and the highly conductive opposite face node 16 of 0.755235V. A voltage that can be sensed at the other contact 212 is a function of the magnetic field component perpendicular to the drawing plane of FIG. 39. Numerical simulation reveals that at a magnetic field of 0 T the voltage of contact 212 against ground, i.e. the highly conductive node 16, is 0.34531V. For a magnetic field of −1 T the voltage between contact 212 and buried, highly conductive node 16 is 0.315871V, in generalized form the voltage between contact 212 and highly conductive opposite face node 16 can be expressed as $$V_2 \propto -B + I \cdot R_1 \| (R_2 + R_3)\frac{R_3}{R_2 + R_3} =$$

$$= -B + I\frac{R_1 R_3}{R_1 + R_2 + R_3}.$$

Figure 40:
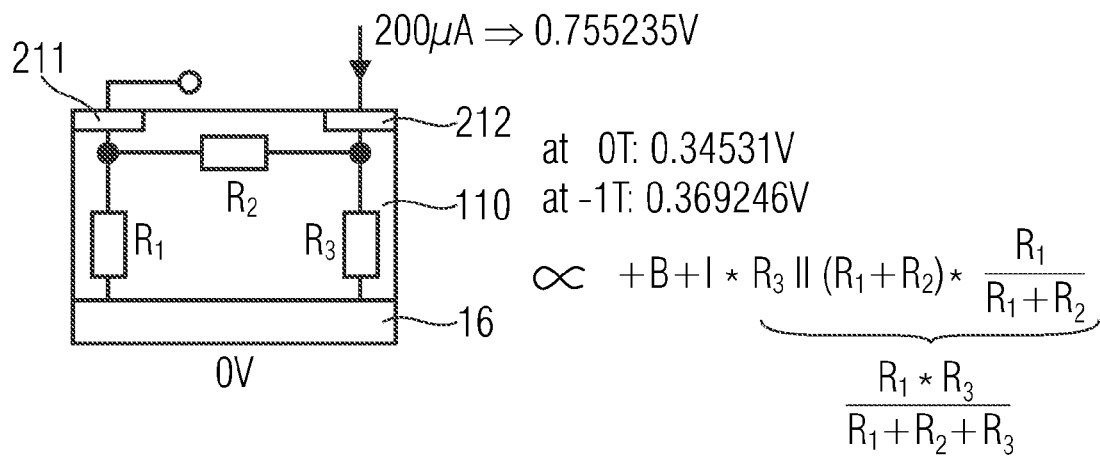
FIG. 40 shows a combination of a schematic cross-section and a simplified equivalent circuit diagram of the vertical Hall effect region similar to FIG. 39, but with the electric current fed to the right contact.

FIG. 40 is similar to FIG. 39 except for that the electric current of 200 μA is fed to the first Hall effect region 110 via contact 212 and a sense voltage is determined between contact 211 and the highly conductive opposite face node 16. As could be expected due to symmetry reasons, the values for the different voltages are the same in FIGS. 39 and 40. However, the sense voltage between contact 212 and the highly conductive opposite face node 16 according to FIG. 39 has a negative dependence on the magnetic field B, whereas the sense voltage between contact 211 and the highly conductive opposite face node 16 according to FIG. 40 has a positive dependence on the magnetic field B.

The above explanations regarding FIGS. 39 to 40 are helpful to understand the phases 5 to 9 and A to F of the spinning current scheme described in connection with FIGS. 34 to 37 (phases 5 to 8), 32 (phase 9), 24 to 28 (phases A to D), 38 (phase E), and 33 (phase F).

In the following figures, the results of various numerical simulations are presented, in particular a distribution of the electric potential within the Hall effect region(s) and the current streamlines within the Hall effect region(s).

In terms of a model concept, the highly conductive opposite face layer 16, 16' (e.g. an n-doped buried layer, nBL) may be thought of as acting like a mirror. One may imagine that instead of the presence of the highly conductive opposite face node 16, 16', the vertical Hall device is mirrored downward. For example, an implementation in which the Hall effect regions are 6 µm deep, they would be 12 µm deep according to the imagined model concept. In addition, the lower contact would be at an electric potential of −1V. In this manner it also becomes clear why the common mode potential of the sense contacts is close to 0V.

When studying the magnetic sensitivity $S_u$ as a function of a distance between the supply contact and the sense contact, it turns out that, for a particular design of the vertical Hall device, the supply voltage-related magnetic sensitivity $S_u$ is maximal for a distance of 2 µm for a depth of the Hall region of 6 µm. Thereby the contacts were supposed to be 0.7 µm long in the direction perpendicular to the magnetic field.

Figure 41:
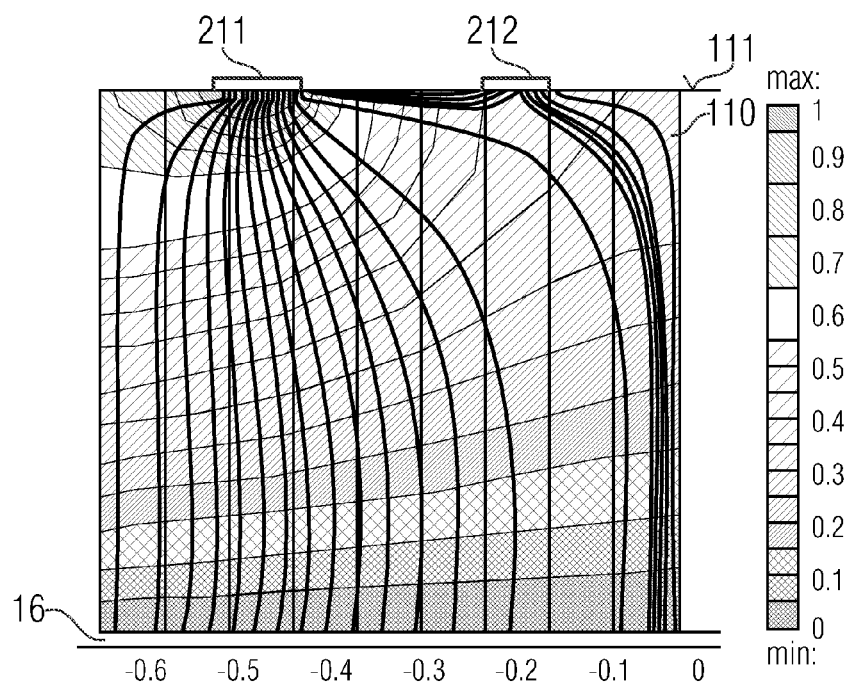
FIG. 41 illustrates the electric potential in a cross-section of a vertical Hall effect region as a result of a numerical, simulation.

FIG. 41 shows a cross section of a Hall effect region in which the electric potential and the current streamlines obtained from the numerical simulation are illustrated. The first pair of contacts 211 and 212 is arranged at the surface 11 of the Hall effect region 110, which is depicted in FIG. 41 in a representative manner. As a simplifying assumption the n+S/D-diffusions of the contacts were assumed to be infinitely thin and infinitely conductive. FIG. 41 and the following figures, as well as the corresponding descriptions, can also be applicable to other Hall effect regions within the vertical Hall device or the sensing arrangement. Contact 211 functions as a supply contact and is at an electric potential of 1V in the example depicted in FIG. 41. The highly conductive opposite face node 16 is at an electric potential of 0V, i.e. ground potential. The contact 212 functions a sense contact and is substantially floating. Since the contact 212 has a higher conductivity than the Hall effect region 110, a number of current streamlines passes through the contact 212 in a lateral manner. The units of the geometric scale at the bottom of FIG. 41 is 10 µm. As mentioned above, the Hall effect region 110 is 6 µm deep (distance between surface 11 and highly conductive opposite face node 16). The width of the Hall effect region 110 in the direction perpendicular to the drawing plane is 5 µm. The length of the Hall effect region 110 between left and right boundary is 6.3 µm. The contacts 211 and 212 are arranged in a symmetric manner with respect to the Hall effect region 110. A relatively high supply voltage related magnetic sensitivity of $S_u$=31 mV/V/T (for a single sense contact) can be obtained with the structure shown in FIG. 41. The sense contact 212 has a common mode potential of 41% (see FIG. 42) of the supply voltage (assuming a linear conductivity model). Note that some of the current streamlines do not hit the highly conductive opposite face node 16 perpendicularly, but at an angle, which is due to the Hall effect.

Figure 42:
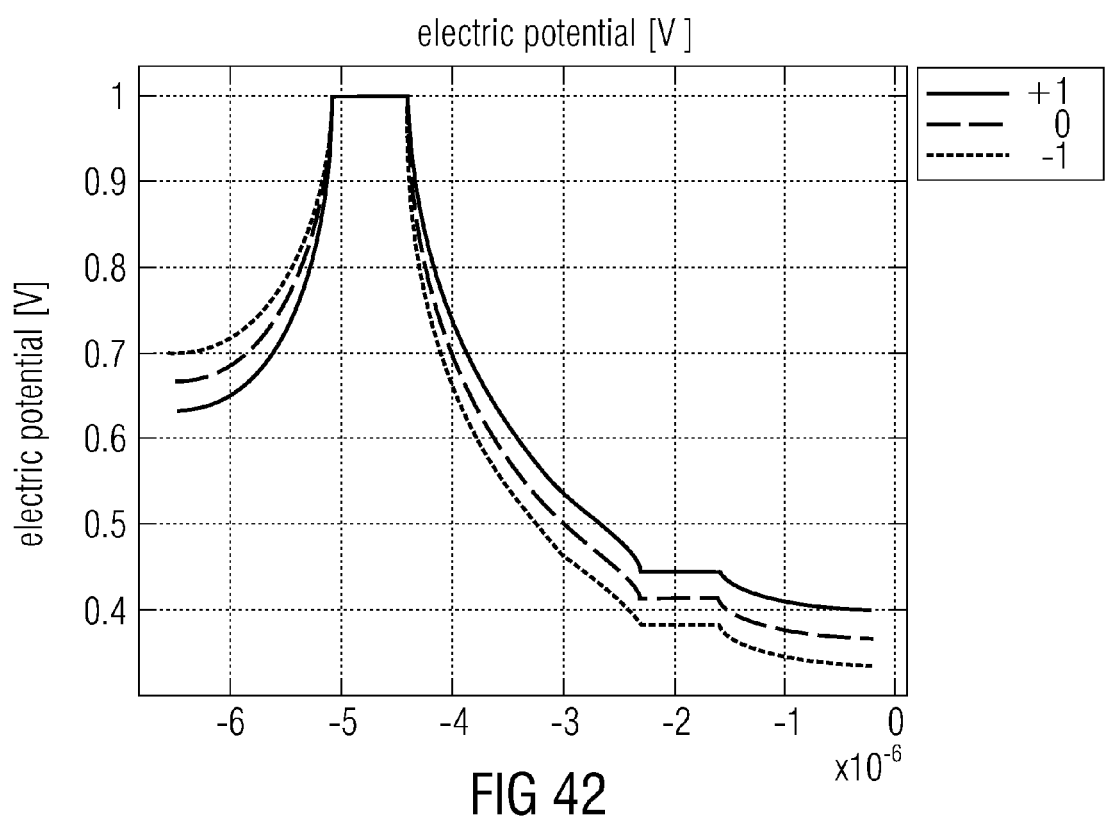
FIG. 42 illustrates the electric potential at the surface of the vertical Hall effect region in FIG. 41 for three different magnetic field strengths.

FIG. 42 shows a graph of the electric potential at the top surface of the Hall effect region 110 in the configuration of FIG. 41. The electric potential at the top surface is shown for three different strengths of the magnetic field B: −1 T, 0 T, and 1 T. It can be seen that the electric potential at the sense contact 212 varies with varying magnetic field.

Figure 43:
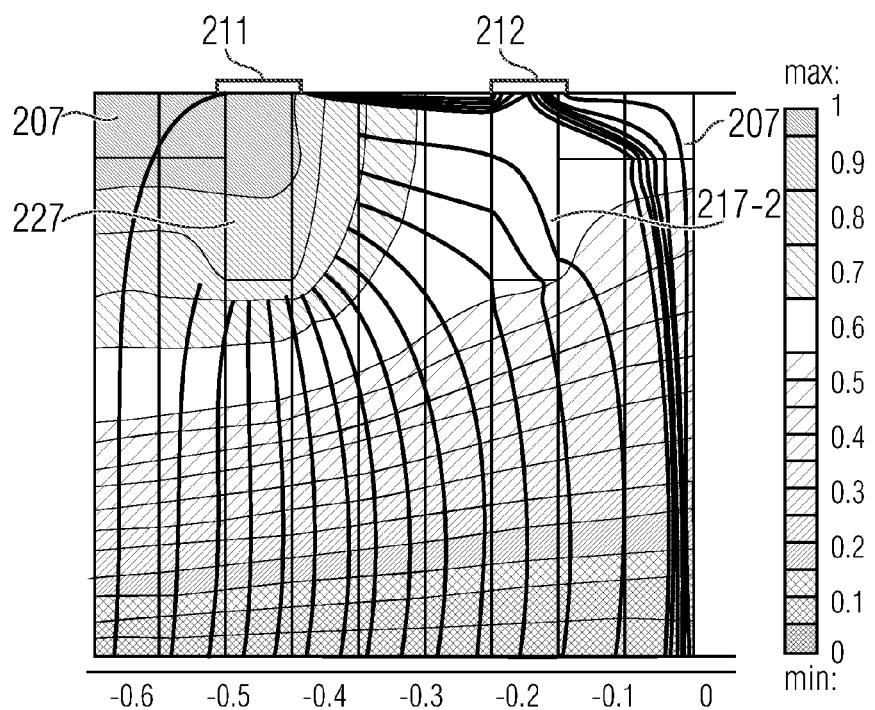
FIG. 43 illustrates the electric potential as a result of a numerical simulation in a cross-section of a vertical Hall effect region comprising n-doped wells and n-source/drain regions beneath the surface contacts.

FIG. 43 shows a schematic cross section through the Hall effect region 110 similar to the configuration of FIG. 41, but additionally comprising n-wells. Under the contacts 211 and 221 the n-wells are 2 µm deep, everywhere else only 0.7 µm deep. The contacts 211 and 221 may be implemented as n+S/D contacts (n⁺-doped source/drain contacts). The n-wells can be regarded as medium-doped wells surrounding the contacts 211 and 221, respectively. Accordingly, a first Hall effect region 110 comprises at least one medium-doped well surrounding or overlapping a contact of the first pair of contacts. In an analog manner, the second Hall effect region 120 can comprise at least one medium-doped well surrounding/overlapping a contact of the second pair of contacts. The medium-doped wells have a doping level that is higher than a doping level of the remainder of the first and second Hall effect regions 110, 120. In some embodiments, the medium-doped can overlap a large portion of the corresponding contact, i.e. the medium-doped well does not completely surround the contact.

According to some embodiments, the two medium-doped wells can extend from the respective surface 11 of the first Hall effect region 110 and the second Hall effect region 120 towards the highly conductive opposite face node 16 for at least 5% of the depth of the first and second Hall effect regions (also possible are: 10%, 15%, 20%, 25%, 30%, 35%, 40%, 50% of the depth, as well as intermediary values). The medium-doped wells are indicated in FIG. 43 by the reference signs 227 for the medium-doped well beneath contact 211 and reference sign 217-2 for the medium-doped well beneath the contact 221. The medium-doped well also comprises a portion 207 that is not as deep as the portions 217-2 and 227. In the illustrated example, this portion 207 is 0.7 µm deep, i.e. approximately 12% of the depth of the Hall region 110. Note that this portion 207 of the medium-doped can extend all the way to the lateral boundary of the Hat effect region 110 in many semiconductor manufacturing technologies, while this is not the case for the contacts 211 and 221, at least in some manufacturing technologies, where it is not possible for the contacts 211, 221 to approach the lateral boundary closely, but a certain margin has to be maintained.

Figure 44:
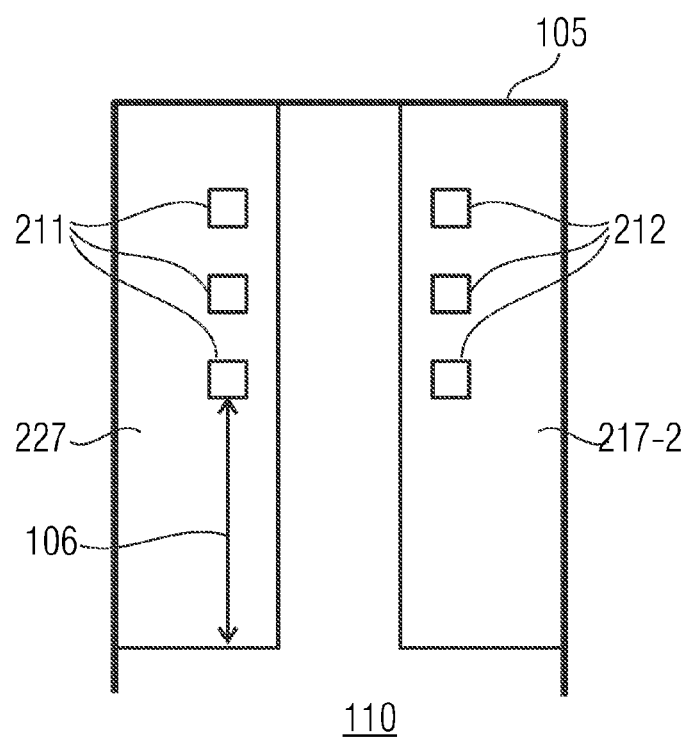
FIG. 44 shows a schematic top view of a Hall effect, region and a plurality of point-shaped contact portions forming a pair of contacts.

For actual implementations it appears reasonable to keep the small n+S/D regions as small as possible (e.g. only designed "point-shaped", e.g. 0.8 µm by 0.8 µm for contacting) so that the deep portions of the n-well are reduced. FIG. 44 shows a schematic top view of the Hall effect region 110 according to some embodiments. The contact 211 comprises three point-shaped contact portions. In the same manner, the contact 221 comprises three point-shaped contact portions. The shallow n-wells 227 and 217-2 extend all the way to the boundary of the Hall effect region 110, which is in the depicted embodiment provided by an end or wall of a p-trench 105. The arrow 106 in FIG. 44 corresponds to a "maximized distance". In particular, the n+S/D regions 211, 221 of the two contact pairs should be spaced apart as much as possible, because there the doping goes deeper in the material than in the nCMOS wells 227, 217-2, which would then cause unnecessary much current to flow not over the nBL, but directly between the two contact pairs in a lateral direction.

Figure 45:
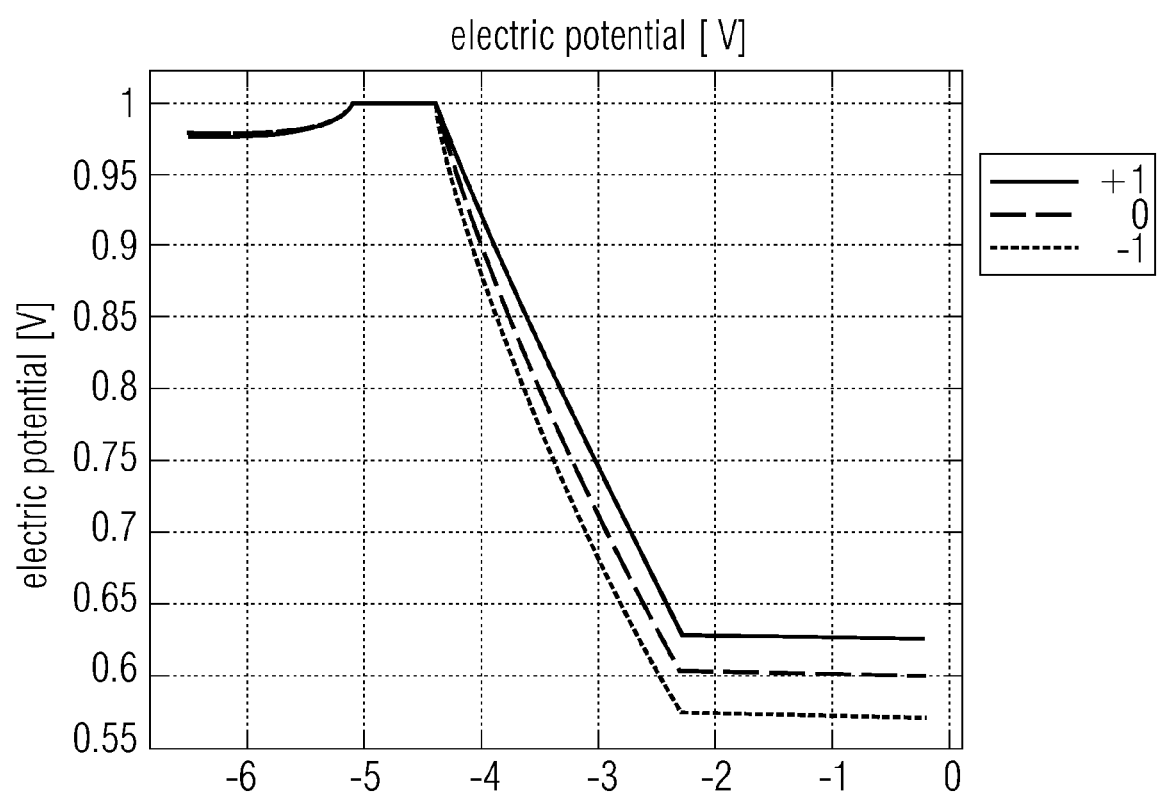
FIG. 45 illustrates the electric potential at the surface of the vertical Hall effect region in FIG. 43 for three different magnetic field strengths.

FIG. 45 shows a graph of the electric potential at the surface 11 of the Hall effect region 110 of the configuration in FIG. 43. The current-related magnetic sensitivity $S_u$=27.1 mV/V/T (single ended) is slightly smaller than that of the configuration shown in FIG. 41. The electric current flowing through the Hall effect region 110 has strongly increased in the configuration of FIG. 43 compared to the configuration of FIG. 41: from 197 µA to 346 µA. This increase of the electric current is due to the deep n-wells 227 and 217-2. The common mode potential is relatively high at approximately 60% of the supply voltage.

Figure 46:
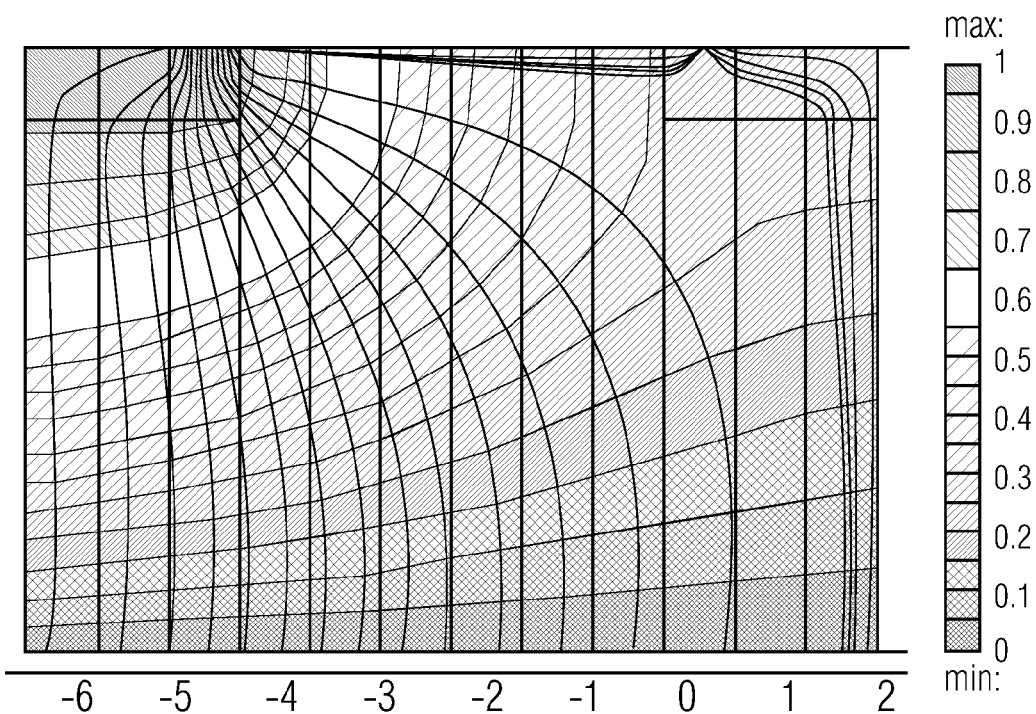
FIG. 46 illustrates the electric potential as a result of a numerical simulation and a cross-section of a vertical Hall effect region having n-doped wells which are less deep because they are implanted through point shaped n+ source/drain regions only.

FIG. 46 show-s a schematic cross section of the Hall effect region including the simulated electric potential and current streamlines of a vertical Hall device that differs from the vertical Hall device shown in FIG. 43 in that the n-wells 227 and 217-2 are only 0.7 μm deep. The supply voltage-related sensitivity could be further increased by 4.2% compared to the configuration shown in FIG. 43, i.e. $S_u$=34.5 mV/V/T (single ended). The common mode potential has decreased to 36% of the supply voltage. The current consumption is significantly lower for the configuration shown in FIG. 46 compared to the configuration shown in FIG. 43: 293 μA in the case of the FIG. 46 instead of 369 μA for the configuration shown in FIG. 43.

Figure 47:
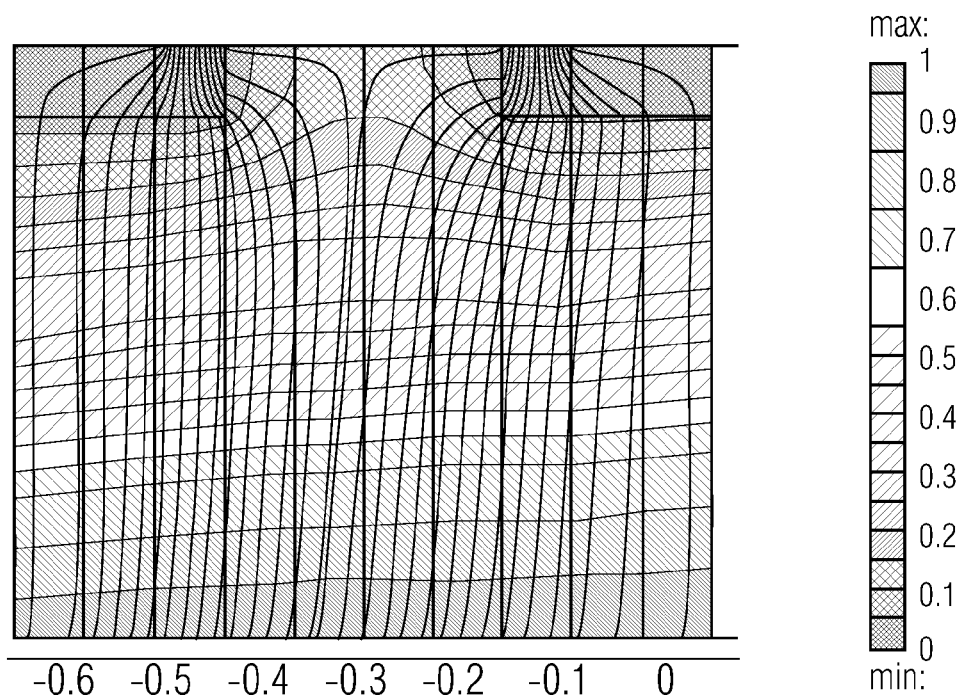
FIG. 47 illustrates the electric potential as a result of a numerical simulation in a cross-section of a vertical Hall effect region operated in a Ui-forcing mode.

FIG. 47 shows a cross section of a Hall effect region of a vertical Hall device that is operated in a so called Ui-forcing mode. Ui-forcing mode means that all potentials are fixedly clamped and that the electric currents in the sense terminals function as output signals. In FIG. 47 the nBL is clamped to 1V, $C_1$ and $C_2$ are clamped to 0V. FIG. 47 shows the results of the numerical simulation in the form of the electric potential within the Hall effect region and the current streamlines. A magnetic field of −1 T perpendicular to the drawing plane was assumed for the numerical simulation which pushes the current to the left in FIG. 47. Note that the current streamlines leave the highly conductive opposite face node 16 at an angle.

Figure 48:
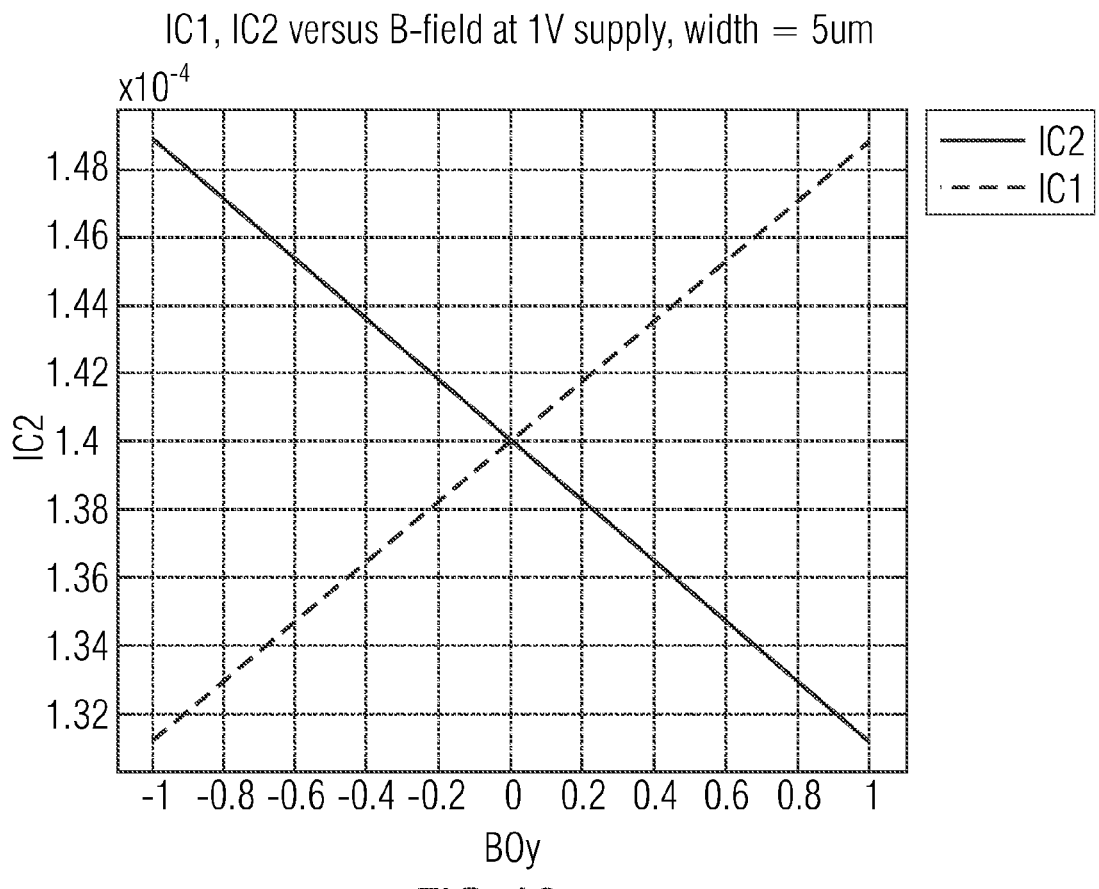
FIG. 48 illustrates a dependency of the electric currents at the contacts C1 and C2 on the magnetic field strength.

FIG. 48 graphically illustrates the electric currents IC1 and IC2 flowing through the contacts $C_1$ and $C_2$, respectively, over the magnetic field in y-direction, i.e. perpendicular to the drawing plane in FIG. 47. It can be seen that the difference current is a linear function of the magnetic field. Furthermore, die sum of the two electric currents IC1 and IC2 is approximately constant: IC1+IC2=280 μA. The resulting sensitivity is S=17.77 μA/T=6.45% (of IC1+IC2) per Tesla. Closer inspection gives a magnetic non-linearity of 17.777/17.705, i.e. 100%+/−0.37% at +/−1 T.

Concluding, it can be said that a maximal supply-voltage related magnetic sensitivity $S_u$ can be obtained in the case of shallow n-wells (0.7 μm deep) for a distance of the contacts of 3.8 μm, given the simulated geometry of the Hall effect region. The contacts have a length of approximately 2.1 μm and extend all the way to the lateral boundaries of the Hall effect region, i.e. to the trench walls in case the Hall effect region is delimited by a trench. In those regions where the n-wells are deep (e.g., 2 μm deep) the distance of the contacts should be slightly larger: approximately 4.2 μm for the simulated geometry of the Hall effect region.

Due to the necessity of providing contacts having finite size (instead of infinitely small contacts) one loses sensitivity. Pure n+S/D contacts lose significantly more sensitivity than contacts having an additional (medium-doped) n-well. It is believed that the reason is that the n+S/D contacts require a larger distance of the p-doped trench that defines the lateral boundary of the Hall effect region (required distance is approximately 1.4 μm according to layout rules for this specific CMOS technology), whereas the n-well regions can extend up to the trench. Note that this condition for the distance between the n+S/D contacts and the p-doped trench depends on the semiconductor manufacturing technology that is used, and can be smaller for different semiconductor manufacturing technologies, or no margin at all might be required between the n+S/D contacts and the trench for some specific semiconductor manufacturing technologies. Furthermore, the current consumption decreases with the presence of an n-well, which might also contribute to an increased sensitivity. In any event, the n-well delivers approximately 23% more sensitivity than pure n+S/D contacts: values up to 70 mV/V/T (differentially) appear to be possible in the linear case (i.e. no velocity saturation taken into account).

Figure 49:
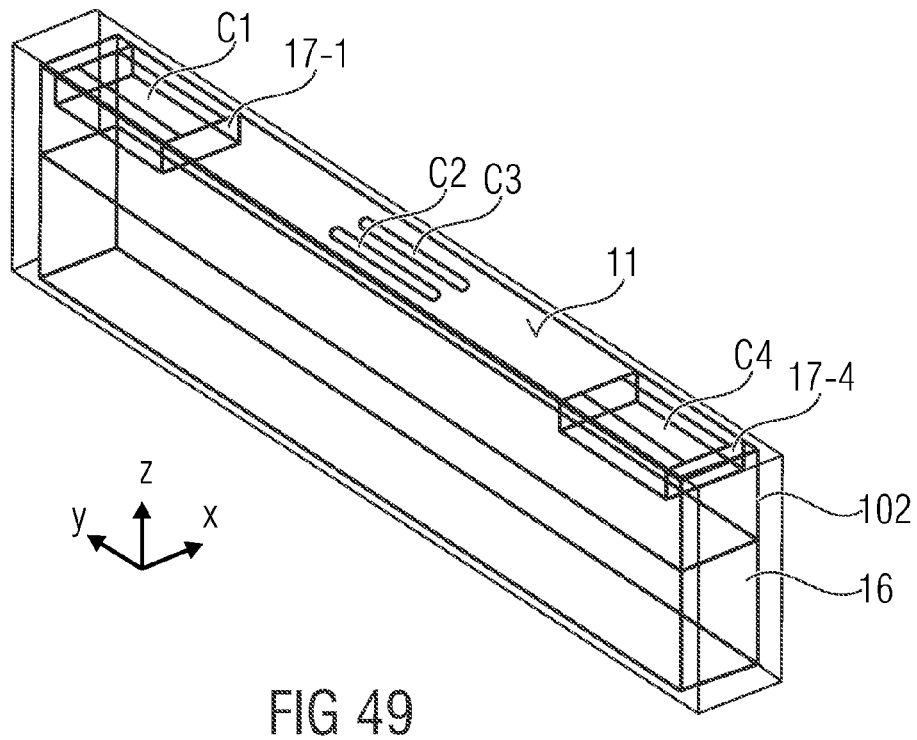
FIG. 49 shows a schematic three-dimensional representation of a vertical Hall device comprising a pair of contacts at a center of the surface of the vertical Hall effect region, and two opposite face node contacts at a left end and a right end, respectively, of the surface of the vertical Hall effect region.

FIG. 49 shows a schematic perspective view of a vertical Hall device according to further possible embodiments. The vertical Hall device comprises a block shaped Hall tub 102, similar to the one of the vertical Hall device in FIG. 2. The Hall tub 102 is elongate. A highly conductive opposite face node 16 is adjacent to an opposite face of the Hall tub 102. Four contacts C1, C2, C3, and C4 are arranged at the surface 11 of the Hall tub 102. The contacts C2 and C3 are located close to a center of the surface 11 of the Hall tub 102. Contacts C2 and C3 are elongate and their respective longitudinal axes are parallel to the longitudinal axis of the Hall tub 102. Furthermore, the contacts C2 and C3 are spaced apart from each other in a direction perpendicular to their longitudinal axes. The contacts C1 and C4 are located at or near a first end and a second end, respectively, of the surface 11 of the Hall tub 102. Contact C1 is embedded in a n-well 17-1 and contact C4 is embedded in a n-well 17-4. If deeper diffusions reaching all the way down to the n-buried layer are available in the technology (like e.g. collector deep sinker) they can be used instead or in addition to the n-well unless they do not require significantly large lateral size. Both contacts C1 and C4 can be shorted with metal lines so that the device has effectively three terminals C1=C4, C2, and C3.

During one clock phase (approximately corresponding to clock phase 2 illustrated in FIG. 10), for example 1V is applied to contact C2, contact C3 is connected to ground, and contacts C1 and C4 function as sense contacts. The internal resistance is $R_i$=1720 ohm. The magnetic sensitivity is $S_u$=29.56 mV/V/T (single-ended) for a magnetic field in the y-direction. The device does not react to $B_x$ and $B_z$ magnetic fields, which is what is desired.

During another clock phase, 1V is applied to contacts C1 and C4, contact C2 is connected to ground, and contact C3 functions as sense contact. The internal resistance is $R_i$=2062 ohm. The supply voltage-related magnetic sensitivity is $S_u$=21.3 mV/V/T (single-ended). This is approximately 28% less than in clock phase 1.

Figure 50:
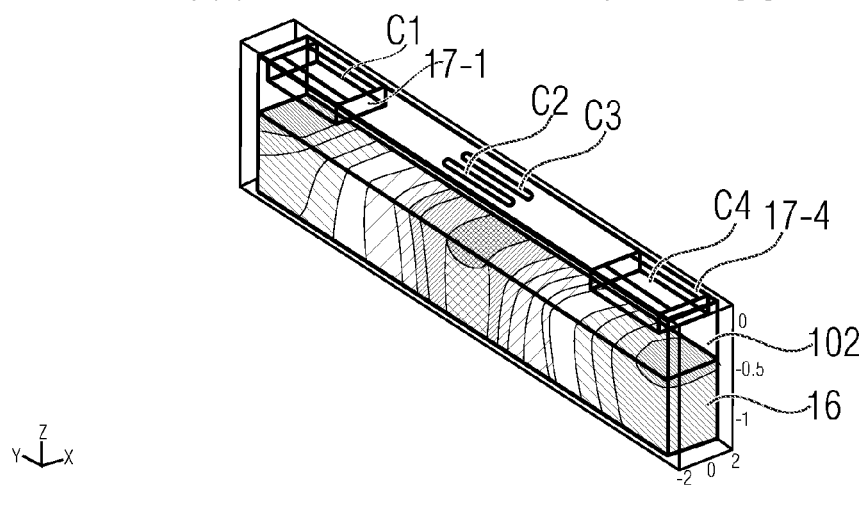
FIG. 50 illustrates the electric potential as a result of a numerical simulation within the highly conductive opposite face node when the opposite face node contacts are connected to a high electric potential and one of the center pair contacts is connected to a low electric potential.

The common mode potential of sense contact C3 is quite low, which could be caused by an insufficient nBL-contacting (which means that the voltage drop between C4 and nBL 16 is too large, namely about 20% of the total supply voltage). FIG. 50 shows the electric potential distribution within the nBL 16. The electric potential of the nBL 16 is between 0.799V and 0.81V: 11 mV of voltage drop within the nBL is acceptable.

Figure 51:
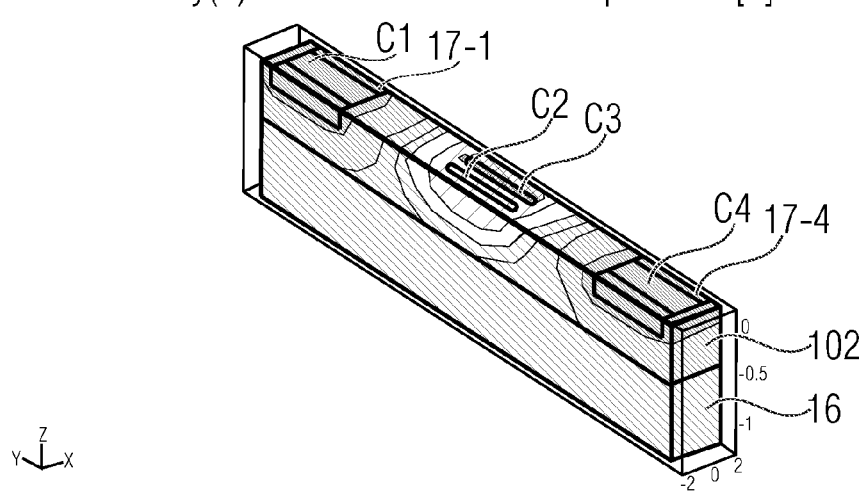
FIG. 51 illustrates in a schematic, three-dimensional view an electric potential in the vertical Hall effect region during a clock phase 3 of the spinning current scheme.

FIG. 51 shows the electric potential within the vertical Hall device during yet another clock phase when 1V is applied at contacts C1 and C4, contact C3 is connected to ground, and contact C2 is the sense contact (approximately corresponding to the configuration of the left Hall device 100 during phase 9 shown in FIG. 32). The magnetic field in y-direction is $B_y$=0 T. The magnetic sensitivity is $S_u$=22.8 mV/V/T (single-ended).

Figure 52:
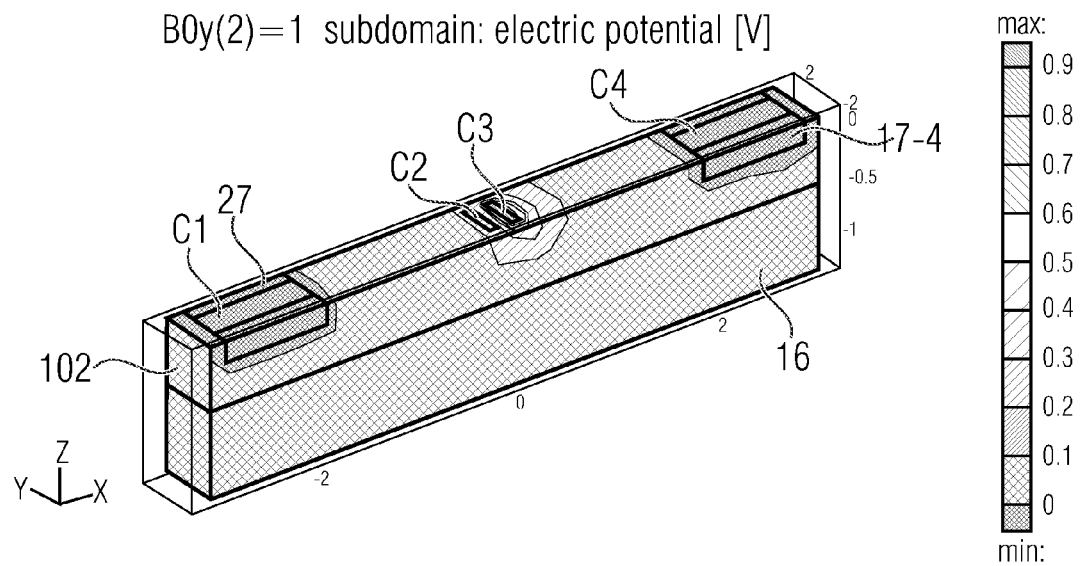
FIG. 52 illustrates in a schematic, three-dimensional view an electric potential in the vertical Hall effect region of another vertical Hall device during a clock phase of the spinning current scheme.

FIG. 52 shows a schematic perspective view of a vertical Hall device in which the electric potential within the Hall tub 102 and the nBL 16 is graphically illustrated. The vertical Hall device shown in FIG. 52 is basically the entire arrangement of FIGS. 49 to 51 rotated by 90°, except for the inner contacts which are not rotated. For the clock phase schematically illustrated in FIG. 52, 1V is applied to contact $C_3$, contacts $C_1$ and $C_4$ are connected to ground, and contact $C_2$ is the sense contact. At the sense contact $C_2$, the electric potential is 0.425467V at zero magnetic field, i.e. B=0 T. When a magnetic field in the y-direction of $B_y$=1 T is applied, the electric potential at the sense contact $C_2$ is 0.399335V. Accordingly, the supply-voltage related magnetic sensitivity is $S_u$+26.1 mV/V/T (single-ended), i.e. approximately 18% larger than previously in FIGS. 49 to 51.

The internal resistance of the vertical Hall device schematically illustrated in FIG. 52 is 4008 Ohm.

Figure 53:
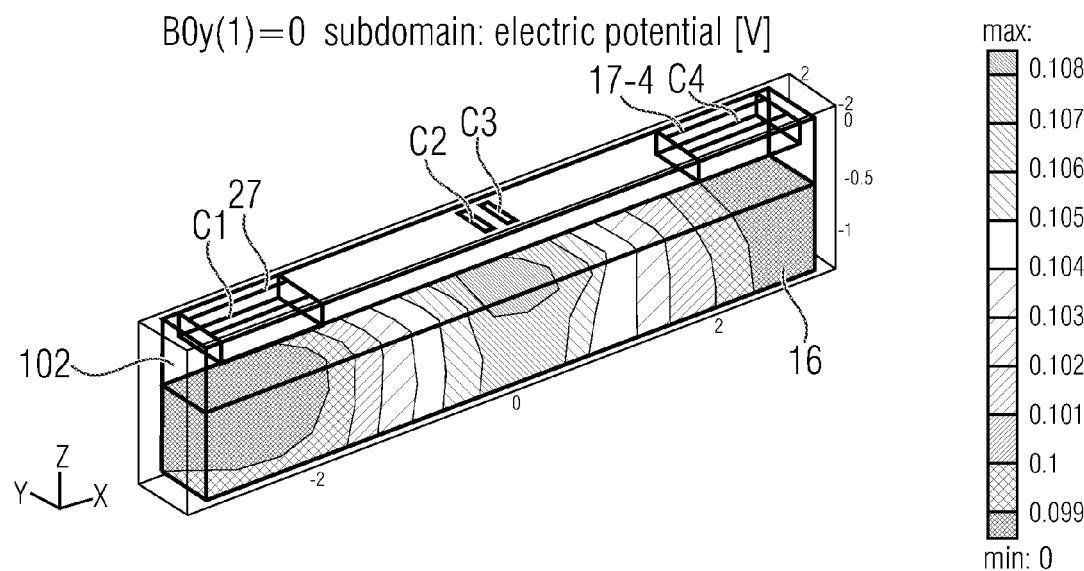
FIG. 53 illustrates in a schematic, three-dimensional view the electric potential in the highly conductive opposite face layer for the clock phase illustrated in FIG. 52.

As schematically illustrated in FIG. 53, the voltage in the nBL, varies between 0.0985V and 0.105V, i.e. a voltage variation of 6.5 mV. The nBL contact is more efficient than previously: only 10% of $V_{supply}$ drop between the nBL 16 and the nBL contact C4.

Figure 54:
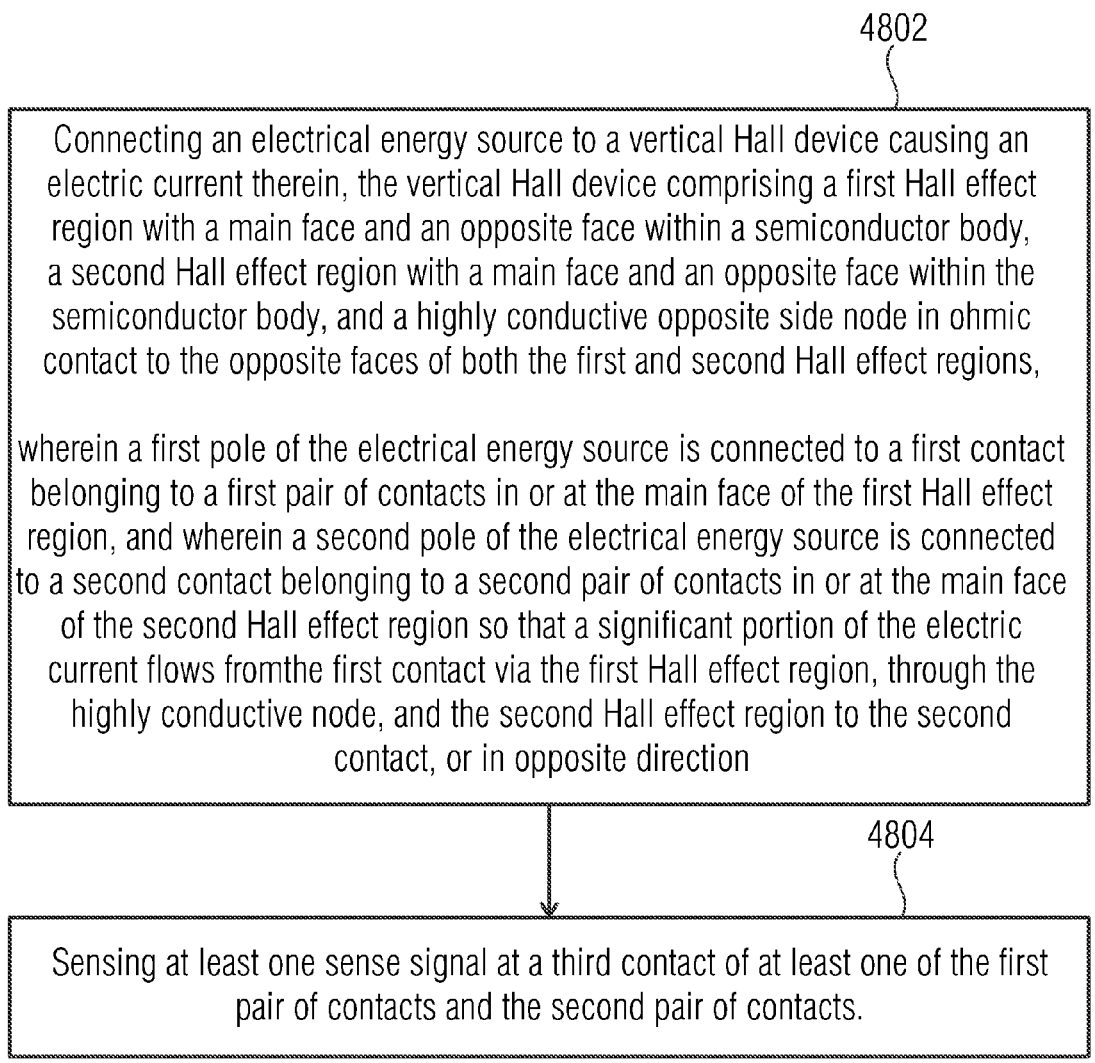
FIG. 54 shows a schematic flow diagram of a method for sensing a magnetic field according to embodiments.

FIG. 54 shows a schematic flow diagram of a method for sensing a magnetic field parallel to a surface of a semiconductor body. The method comprises a step 4802 of connecting an electrical energy source to a vertical Hall device. The vertical Hall device comprises a first Hall effect region within a semiconductor body, a second Hall effect region within the semiconductor body, and a highly conductive opposite face node in ohmic contact to both the first and second Hall effect regions at their respective opposite faces, relative to respective main faces. A first pole of the electrical energy source is connected to a first contact (e.g., contact 211 or C1) belonging to a first pair of contacts in or at a surface of the first Hall effect region. A second pole of the electrical energy source is connected to a second contact (e.g., contact 221 or C3) belonging to a second pair of contacts in or at a surface of the second Hall effect region. A significant portion of the electric current flows from the contact of the first pair via the first Hall effect region, through the highly conductive, opposite face node, and the second Hall effect region to the contact of the second pair, or in opposite direction.

The method also comprises a step 4804 of sensing at least one sense signal at a third contact (e.g., 212 or 222) of at least one of the first pair of contacts and the second pair of contacts.

Optionally, a distance of the contacts of the first pair and of the second pair can be smaller than a depth of the first and second Hall effect region, respectively. Another option would be that the contacts of the first pair and the second pair can be arranged symmetrically with respect to a union of the first and second Hall effect regions. A distance between the first pair and the second pair of contacts can be larger than the depth of the first Hall effect region and also than the depth of the second Hall effect region. In addition or in the alternative, the distance between the two contact pairs can optionally be smaller than the distance of the contacts within the first and/or second pair of contacts. Furthermore, a convex circumscribing contour of the second pair of contacts can be disjoint from a convex circumscribing contour of the first pair of contacts, i.e., no connecting straight line between the contacts of the first pair intersects with one of the contacts of the second pair, and vice versa.

The method can further comprise connecting the electrical energy source or a further electrical energy source to a further vertical Hall device 100' that has substantially the same structure as the vertical Hall device 100. The vertical Hall device 100 and the further vertical Hall device 100' may even be congruent to each other or substantially identical. The further vertical Hall device 100' can be biased in an opposite manner than the vertical Hall device 100 so that a further sense signal sensed at the further vertical Hall device 100' has an opposite dependency on the magnetic field. Two sense signals have an opposite dependency on the magnetic field if one sense signal is rising with rising magnetic field or field component while the other one is falling with the same rising magnetic field or field component.

The method can further comprise connecting the electrical energy source or a further electrical energy source to a further vertical Hall device causing an electric current therein. The further vertical Hall device can comprise a further first Hall effect region, a further second Hall effect region, and a further highly conductive node in ohmic contact to opposite faces of both the first and second further Hall effect regions. The further vertical Hall device can be biased in a manner so that a further sense signal sensed at the further vertical Hall device has an opposite dependency on the magnetic field.

Optionally, a second sense signal can be sensed at a fourth contact (e.g., 222 or 212) belonging to one of the first pair of contacts and the second pair of contacts of the vertical Hall device. Typically, the third contact and the fourth contact belong to different pairs of contacts, e.g., the third contact belongs to the first pair of contacts and the fourth contact belongs to the second pair of contacts. In a similar manner, a further second sense signal can be sensed at the further vertical Hall device, the further second sense signal having an opposite dependency on the magnetic field than the second sense signal. The sense signal and the further sense signal can both have a first common mode potential. A difference of these two signals produces a first differential signal.

Furthermore, the second sense signal and the further second sense signal can both have a second common mode potential. A difference of these two signals produces a second differential signal.

An output signal indicative of the magnetic field can be obtained by combining the first differential signal and the second differential signal.

A step of a spinning current scheme can be performed for the first pair of contacts of the vertical Hall device and for a further first pair of contacts of the further vertical Hall device. At the same time, a connection configuration of the second pair of contacts of the vertical Hall device and of a further second pair of the contacts of the further vertical Hall device is maintained as it is. The method can then comprise: sensing a new sense signal at the first contact of the first, pair of contacts and a new further sense signal at a contact of the further first pair of contacts that previously functioned as a supply contact prior to performing the step of the spinning current scheme. A subsequent signal can then be determined on the basis of at least one of the new sense signal and the new further sense signal, i.e., subsequent signal=f(new sense signal, new further sense signal). In general, terms as "first", "second", "subsequent", "ensuing", "at the same time" do not necessarily denote a chronological sequence, but merely serve for differentiation between clock phase, signals, etc.

The subsequent signal can be subtracted from a previous signal selected from the sense signal, the further sense signal, and the first differential signal, or vice versa, so that offset-related components in the subsequent signal and the previous signal cancel each other at least partially. In this manner a first offset-reduced signal indicative of the magnetic field can be obtained.

The method can be extended further by performing a second step of the spinning current scheme for the second pair of contacts of the vertical Hall device and for the further second pair of the further vertical. Hall device. This time, i.e., during the second step of the spinning current scheme, a connection configuration of the first pair of contacts of the vertical Hall device and of the further first pair of contacts of the further vertical Hall device is maintained in the current configuration.

After the second step of the spinning current scheme has been performed, an ensuing sense signal can be sensed at the second contact and an ensuing further second sense signal at a contact of the further first pair of contacts that previously functioned as supply contacts prior to performing the second step of the spinning current scheme. The method can continue with determining a second subsequent signal on the basis of at least one of the ensuing second sense signal and the ensuing further second sense signal. The second subsequent signal can be subtracted from a second previous signal selected from the second sense signal, the further second sense signal, and the second differential signal (or vice versa, i.e. the second previous signal can be subtracted from the second subsequent signal). As a result, offset-related components in the second subsequent signal and the second previous signal cancel each other at least partially so that a second offset-reduced signal can be obtained, which can then be combined with the second offset-reduced signal.

The method can further comprise buffering at least one of the sense signal, the further sense signal, and the first differential signal to obtain a buffered signal quantity. The action of "buffering" preserves the signal that is sensed during a certain clock phase of the spinning current scheme for later use, in particular for combining, adding, subtracting, etc. the different sense signals obtained during different clock phases from each other. Buffering can also encompass a sampling-and-holding, storing, "feeding to an integrator", an averaging etc. The "buffered signal quantity" can be in particular an integral value (i.e. obtained as result of an integration over a time span) or an average value (i.e. obtained as a result of an average over several sample values) etc.

The method can further comprise performing a step of a spinning current scheme for the first pair of contacts of the vertical Hall device and for a further first pair of contacts of the further vertical Hall device, while maintaining a connection configuration of the second pair of contacts of the vertical Hall device and of a further second pair of the contacts of the further vertical Hall device. Subsequently a new sense signal can be sensed at the contact of the first pair of contacts and a new second sense signal at a contact of the further first pair of contacts that previously functioned as a supply contact prior to performing the step of the spinning current scheme. The method can then continue with determining a new signal quantity on the basis of at least one of the new sense signal and the new second sense signal. Finally, the new signal quantity can be subtracted from the buffered signal quantity, or vice versa, so that offset-related components in the new signal quantity and the buffered signal quantity cancel each other at least partially. In this manner a first offset-reduced signal (or mostly offset-reduced signal) indicative of the magnetic field can be obtained.

In other words, according to some embodiments but not necessarily ail embodiments, when passing from a certain clock phase of the spinning current scheme to an immediately subsequent clock phase, only one pair of contacts per vertical Hall device 100 and 100' is reconfigured by swapping their roles as supply contact and sense contact. The other pair of contacts of the vertical Hall device 100, 100' keeps its configuration which it had during said certain clock phase (i.e. the other pair of contacts has the same configuration regarding which contact is a supply contact and which is a sense contact in the certain clock phase and in the immediately subsequent clock phase).

The method can further comprise buffering at least one of the second sense signal, the further second sense signal, and the second differential signal to a obtain a second buffered signal quantity. A second step of the spinning current scheme can then be performed for the second pair of contacts of the vertical Hall device and for the further second pair of the further vertical Hall device. At the same time, a connection configuration of the first pair of contacts of the vertical Hall device 100 and of the further first pair of contacts of the further vertical Hall device 100' is maintained at its status quo.

A third sense signal can be sensed at the contact of the first pair of contacts and a fourth sense signal can be sensed at a contact of the further first pair of contacts that previously functioned as a supply contact prior to performing the second step of the spinning current scheme. A second new signal quantity can then be determined on the basis of at least one of the third sense signal and the fourth sense signal. The method can further comprise subtracting the second new signal quantity from the second buffered signal quantity, or vice versa, so that offset-related components in the second new signal quantity and the second buffered signal quantity substantially cancel each other at least partially to obtain a second offset-reduced signal. Finally, the first offset-reduced signal can be combined with the second offset-reduced signal.

Figure 55:
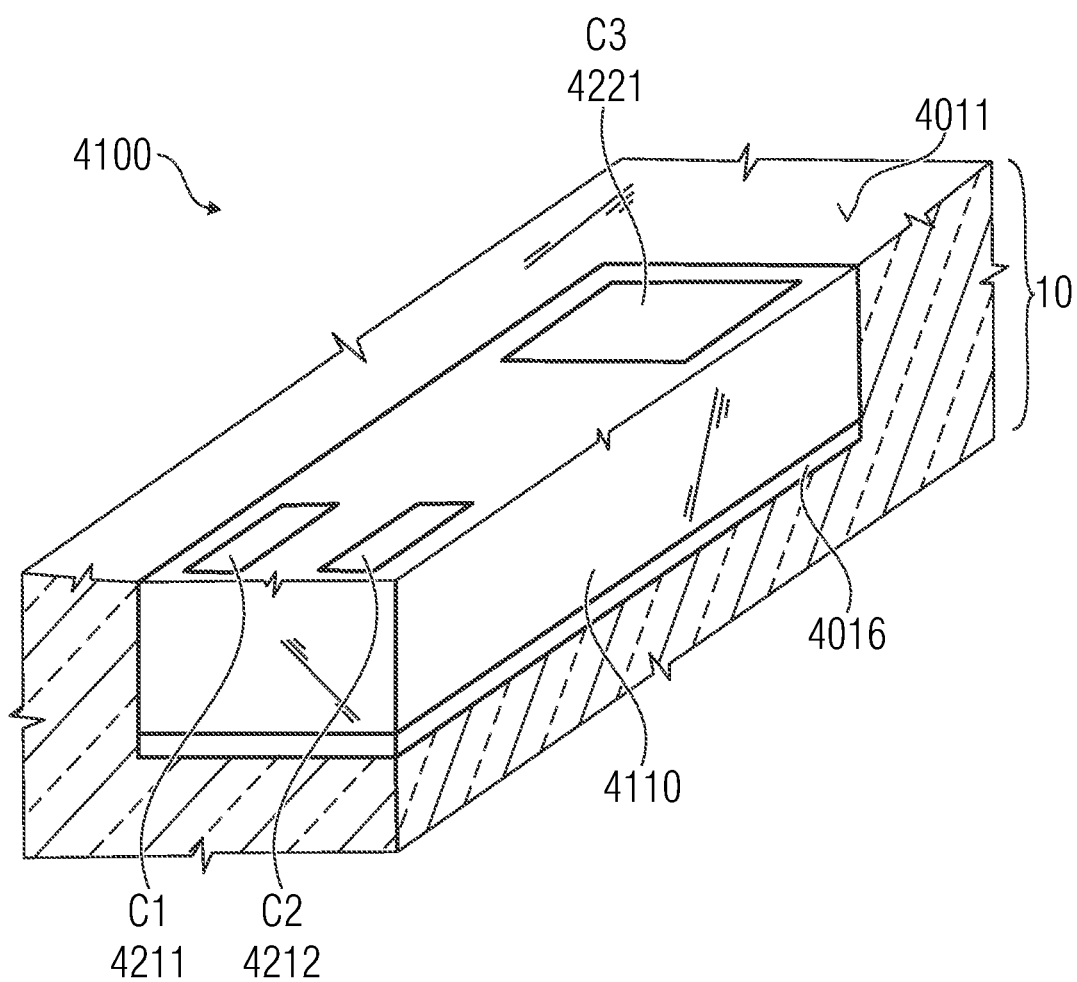
FIG. 55 shows a schematic breakout view of a vertical Hall device comprising a pair of contacts and an opposite face node contact.

FIG. 55 shows a schematic, perspective sectional view of a vertical Hall device 4100 according to at least some embodiments. The vertical Hall device 4100 comprises a Hall effect region 4110 which is arranged within a semiconductor body 10. The semiconductor body 10 has a main surface 4011 and the Hall effect region 4110 has a surface that is parallel to the main surface of the semiconductor body 10. The vertical Hall device 4100 further comprises a highly conductive opposite face node or layer 4016 in the semiconductor body 10, extending in ohmic contact to an opposite face of the Hall effect region 4110 that is opposite to the surface of the Hall effect region 4110. A pair of contacts C1 (4211) and C2 (4212) is arranged in or at the surface of the Hall effect region 4110. The vertical Hall device 4100 also comprises an opposite face node contact C3 (4221) at the main surface of the Hall effect region 4110, wherein a resistance between the opposite face node contact C3 and the highly conductive opposite face node 4016 is smaller than a resistance between any contact C1, C2 of the pair of contacts and the highly conductive opposite face node 4016. In a plan view the opposite face node contact C3 has one of a U-shape and a O-shape. The contacts C1 and C2 are rectangular with their long sides being parallel (not perpendicular) to the long edges of the Hall effect region 4110. The Hall effect region is rectangular, as well. The centers of the contacts C1, C2, and C3 form a triangle, in particular an isosceles triangle. In alternative embodiments, at least: one of the three contacts C1, C2, C3 is not rectangular in plan view, and/or the Hall effect region 4110 is not a rectangle in plan view. Instead, at least one of the contacts and/or the Hall effect region can be circular, oval, triangular, hexagonal, etc. According to further embodiments, the long edges of at least one of the contacts C1, C2, C3 can be perpendicular to the long edge of the Hall effect region 4110.

Figure 56:
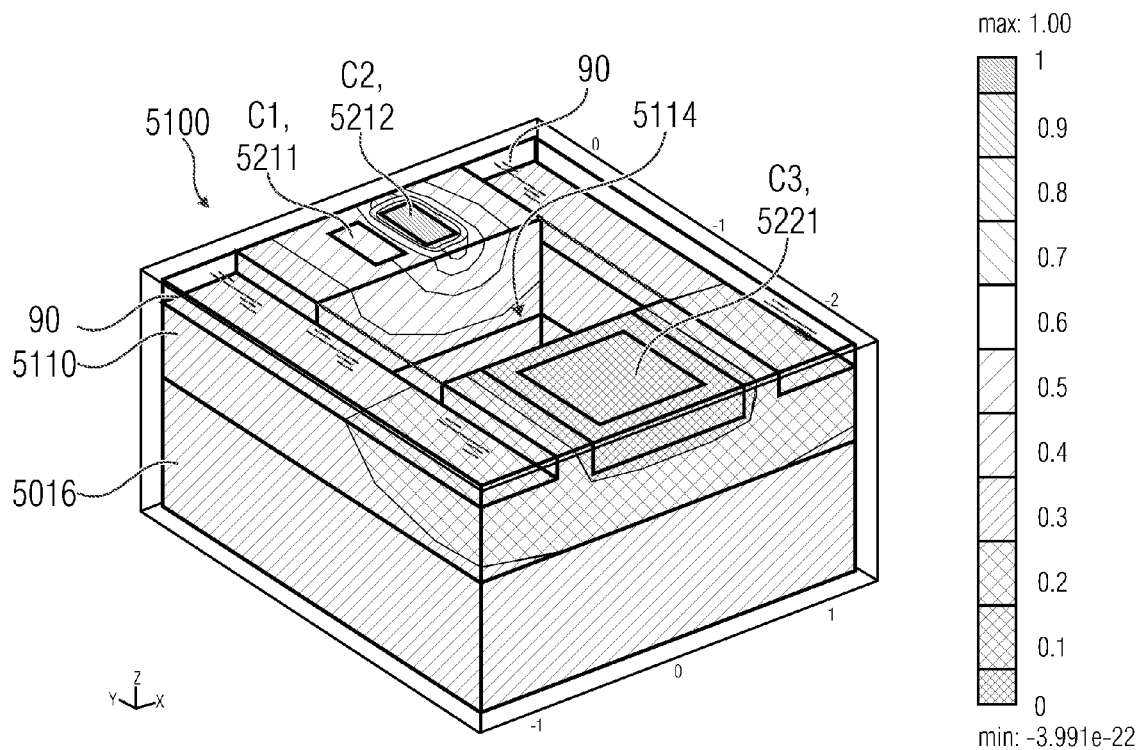
FIG. 56 shows a schematic, three-dimensional view of a ring-shaped Hall effect region and the electric potential therein simulated by means of a numerical simulation.

FIG. 56 shows a schematic, perspective view of a vertical Hall device 5100 according to further embodiments. The vertical Hall device 5100 comprises a Hall effect region 5110 with three contacts C1 (5211), C2 (5212), C3 (5221) on its main side and a highly conductive opposite face node or layer 5016 on the opposite side relative to the main side (typically, this opposite face layer 5016 has same conductivity type as the Hall effect region 5110—preferably n—and they are in ohmic contact with each other so that the opposite face layer or buried layer (BL) 5016 effectively shorts the opposite face of the Hall region 5110). Two contacts C1, C2 are equal in size and shape and they are symmetrically placed w.r.t. the Hall region 5110. The third contact C3 can be different in shape, size, technology, position, alignment. It is designed in such a way that the resistance between the third contact C3 and the BL 5016 is smaller than the resistance between each of the other two contacts C1, C2 and BL 5016. This can be done in various ways, and FIG. 56 schematically illustrates one as an example.

The example of FIG. 56 shows a ring-shaped Hall-region 5110 that is adjacent to an opposite face layer or buried layer 5016 with the same ring shape. The contacts C1, C2, C3 are at opposite (diametrical) branches of the ring: one branch has two rectangular contact regions, which are close together: their spacing should be smaller than the depth of the active Hall region. Their short sides should also be smaller than the depth of the active Hall region 5110 and their long sides should extend across the entire width of the branch of the ring-shaped Hall region 5110 (in the example of FIG. 56, the long side of the two contacts is smaller than the width of the ring, because in many technologies it is not allowed for the contact diffusions to approach the border of the ring nearer than approximately 0.5 µm or similar). The contact diffusions are preferably shallow (0.2 µm deep n+S/D-diffusion), yet they can also consist of several tubs that are partly deeper (e.g. n-CMOS well with about 1.8 µm depth), as long as their depth is less than, for example, half of the depth of the active Hall effect region (e.g. Sum). The ring can be defined by deep p-diffusions which are reverse biased against the active Hall region 5110. Yet they can also be defined by deep isolation trenches. In both cases the Isolation means have to pattern the active Hall region—preferably they do not pattern the opposite face layer 5016, but in many technologies they do (more or less inevitably). In any case it is preferable if the two small contacts C1, C2 are isolated from the larger third contact C3 by a hole 5114 in the ring structure, and by a narrow width of the two other branches of the ring, that do not contain contacts: these branches should be long and narrow so that the majority of the current between one small contact. C1 or C2 and the large contact C3 flows in the opposite face layer 5016 and not in the Hall region. Note that the opposite face layer 5016 has at least 10 (preferably as high as 1000) times better conductivity than the Hall region.

FIG. 56 also shows that the narrow side arms of the ring do not extend up to the surface of the substrate, because there a p-diffusion is provided that can cut off a part on the surface of the Hall region to further reduce its conductivity. In the example of FIG. 56, two relatively shallow p-diffusions 90 are indicated in a transparent, wireframe manner which reduce the effective depth of the Hall effect region 5110 in the area between the pair of contacts C1, C2 and the third contact C3. Ideally one should use a p-diffusion that extends all the way down to the opposite face layer 5016 if such a diffusion is available in the technology: then it forces the current to go through the opposite face layer 5016.

Moreover it can be also advantageous if the branch of the ring has two deep p-isolations in the corners of the ring: they should force the current of one small contact to go vertically down and spread only underneath the other small contact C1 or C2 (where the signal is tapped)—the p-isolation should avoid dial the current spreads at two opposite sides of the supply contact, where if is useless. This is schematically illustrated in FIG. 57.

Figure 57:
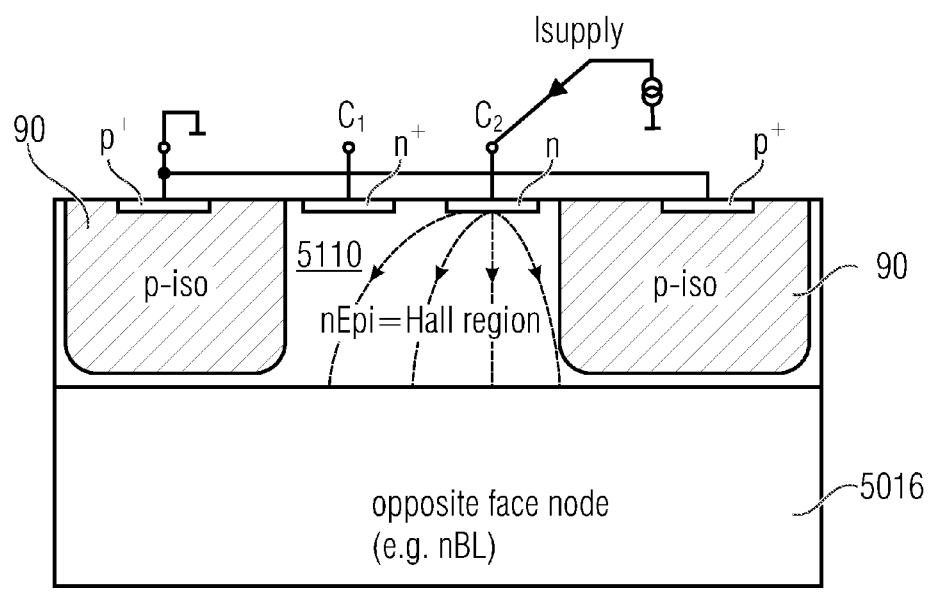
FIG. 57 shows a cross-section through the branch of the ring-shaped Hall effect region in FIG. 56 that carries the two small contacts C1, C2 in a spinning current phase where C2 acts as supply terminal and C1 acts as sense terminal.

FIG. 57 schematically shows a cross section through this branch of the ring that carries the two small contacts C1, C2 in a spinning current phase where C2 acts as supply terminal and C1 acts as signal terminal: Current I supply is injected into C2 and flows vertically downward through the Hall region 5110 into the opposite face layer 5016, as schematically indicated by the dashed current streamlines. There the current streamlines enter at right angles (in case of vanishing magnetic field) due to the much higher electrical conductivity of the opposite face node 5016. The deep p-isolation tubs 90 are shown to the left and to the right and it is seen that the right p-isolation tub 90 avoids spreading of the current streamlines to the right. Thus, more current spreads to the left, which is available for current flow and there the Hall signal develops right underneath the signal terminal (sense contact) C2 and can be tapped there.

Referring back to FIG. 56, the electric potential distribution is illustrated in FIG. 56 in a spinning current cycle where one small contact (here: C2) is at high-potential (+1V) while the large opposite face layer contact is at ground (0V) and the other small contact (here: C1) is floating: it has about 0.5V potential in the absence of magnetic fields (common mode potential), depending on the ratio of lateral spacing to the high contact C2 and the vertical spacing to the opposite face layer 5016.

Figure 58:
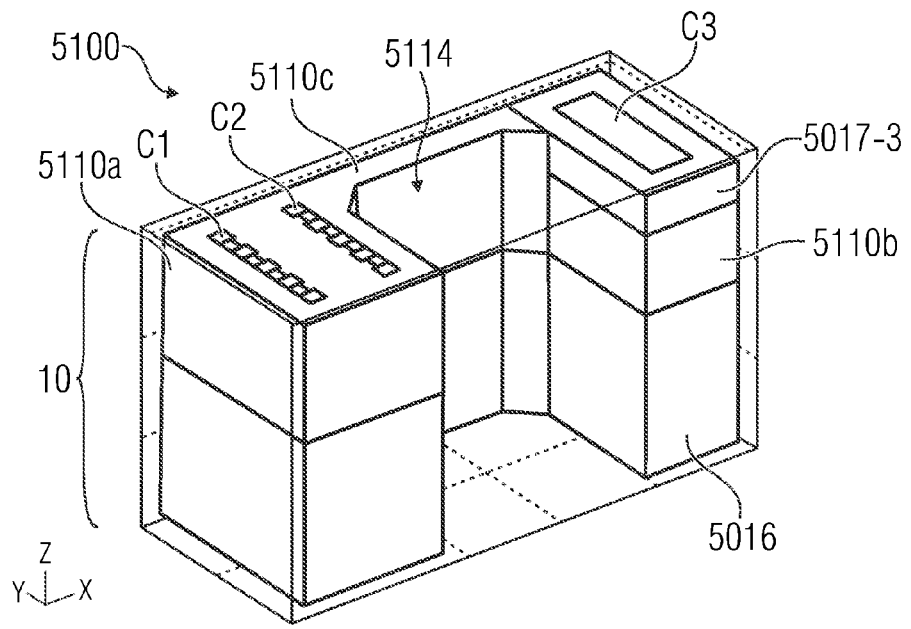
FIG. 58 illustrates a schematic, three-dimensional view of a vertical Hall device having a Hall effect region with a first section, a second section, and a connecting section.

Another embodiment of a vertical Hall device 5100 is shown in FIG. 58. The contacts C1, C2, and C3 are implemented as n+S/D diffusions. The contact C3 is embedded in a n-CMOS well 5017-3. The vertical Hall device 5100 also comprises an active n-Hall-region 5110 (e.g. epitaxial layer) and the highly conductive opposite face node or layer (nBL) 5016. In plan view, all contacts C1, C2, and C3 are elongated with at least one of their long sides, edges, and axes in parallel.

At the left side we have the active Hall region 5110 which contains the two contacts C1 and C2 having approximately the shape of long strips in y-direction (with wider parts that are used to make contacts to metal one there). The two strips C1, C2 are facing each other. At the right hand side we have a large contact this is the BL contact C3. Its main purpose is to establish a low ohmic connection between main face contact C3 and BL 5016. The BL contact C3 is separated from the active Hall region 5110 by a slim branch 5114 whose purpose is to avoid any current flow via the epitaxial layer between C1 and the BL-contact or between C2 and the BL-contact: instead substantially all current should flow through the BL 5016.

The vertical Hall device 5100 in FIG. 58 may be operated in three phases:

Phase 1: C1 and BL-contact C3 are supply contacts, whereas the signal is tapped at C2
Phase 2: C2 and BL-contact C3 are supply contacts, whereas the signal is tapped at C1
Phase 3: C1 and C2 are supply contacts, whereas the signal is tapped at the BL-contact C3

In phase 3 there is no notable current flowing through the BL 5016—nevertheless the BL-contact C3 should be low ohmic in order to minimize the output resistance of the device and thus the noise.

In other words, the vertical Hall device 5100 comprises the Hall effect region 5110 in a semiconductor body 10, wherein the Hall effect region 5110 comprises a first section 5110a, a second section 5110b, and a connecting section 5110c between the first section 5110a and the second section 5110b. The vertical Hall device 5100 further comprises the highly conductive opposite face node 5016 in ohmic contact to both the first and the second sections 5110a, 5110b of the Hall effect region 5110 in the semiconductor body 10 and thus providing a highly conductive connection between the first and second sections 5110a, 5110b compared to the connecting section 5110c. A pair of contacts C1, C2 is arranged in or at a surface of She first section 5110a of the Hall effect region 5110. An opposite face node contact C3 is arranged in or at a surface of the second section 5110b of the Hall effect region 5110.

Figure 59:
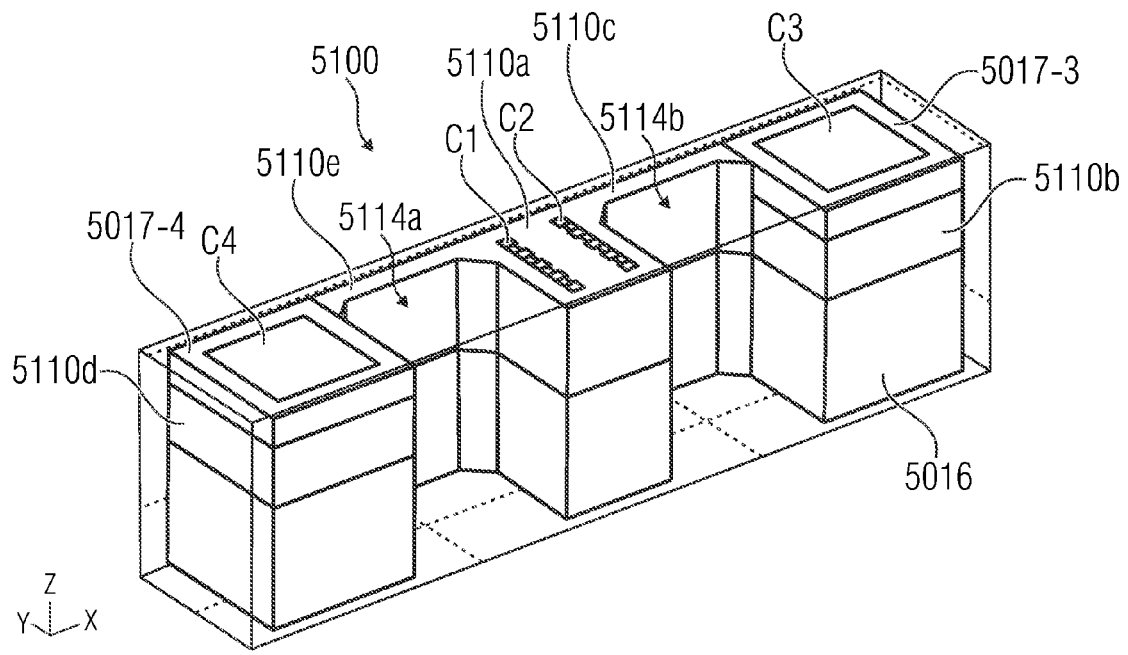
FIG. 59 illustrates a schematic, three-dimensional view of a vertical Hall device having a Hall effect region with a first section, a second section, a third section, and two connecting sections.

It is possible to extend the device as schematically illustrated in FIG. 59 in which the vertical Hall device comprises a further contact C4 that is symmetric to the contact C3. The further contact C4 is embedded in a n-well 5017-4 similar to the n-well 5017-3. Further contact C4 is arranged in or at the surface of a fourth section 5110*d* of the Hall effect region 5110 which is connected to the central first section 5110*a* by a further connecting section 5110*e*. A further hole or trench 5114*b* is located between the first section 5110*a*, the fourth section 5110*d*, and the further connecting section 5110*e*.

Of course one can also mirror the left BL-contact C4 plus its narrow trench 5114*b* on the xz-plane. The trench may connect the active Hall region at other corners or midway between corners in order to increase the degree of symmetry of the device.

Figure 60:
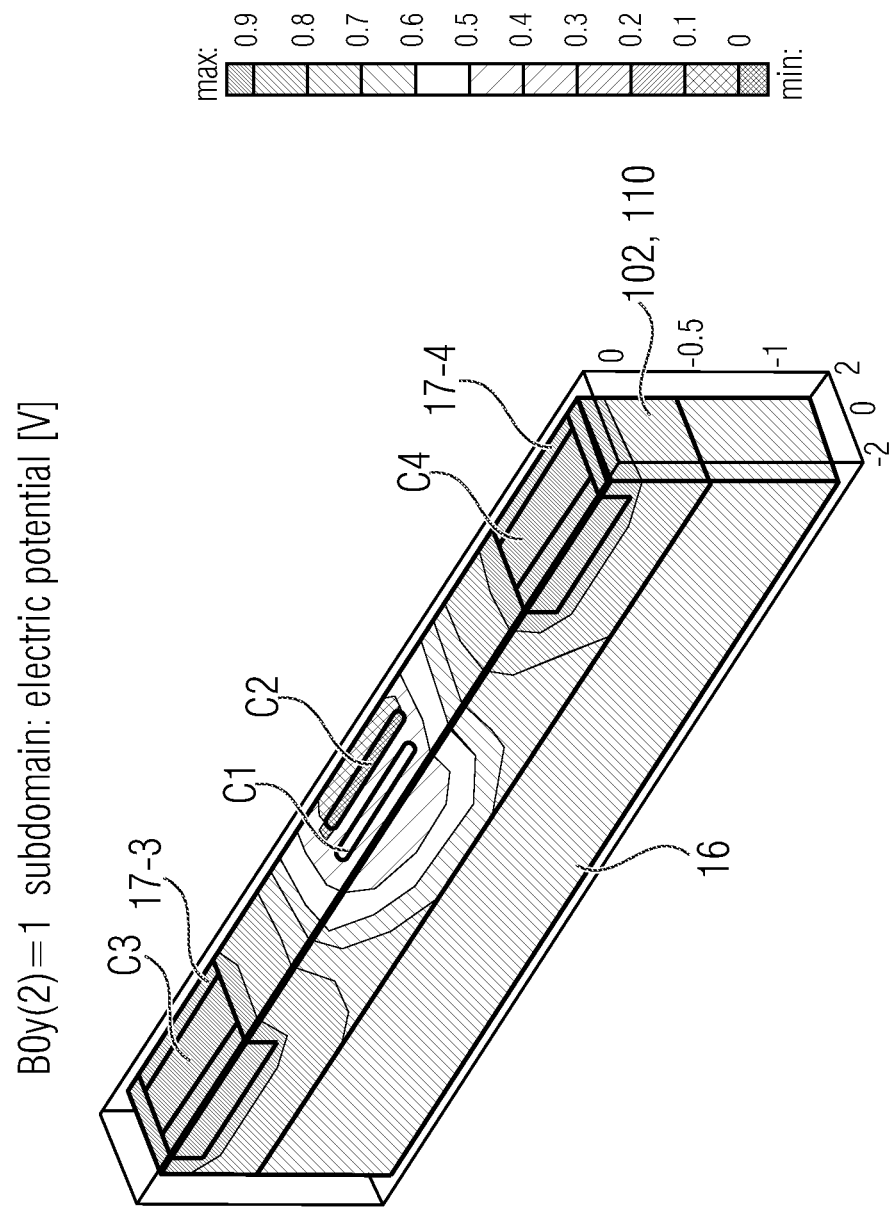
FIG. 60 illustrates a schematic, three-dimensional view of a vertical Hall effect region and the electric potential therein obtained by means of a numerical simulation during a particular clock phase of the spinning current scheme.

From this principle the topology can be modified slightly in order to make it simpler: FIG. 60 shows a slim rectangular structure with two slim contacts C1, C2 facing each other in the center of the device. Since the Hall region 110 (here coinciding with Hall tub 102) is slim, it avoids current spreading to the right of the right contacts or to the left of the left contact, thereby concentrating substantially all current below the signal terminal C1 (if C2 is used as supply terminal). The current again enters vertically at substantially right angles in the BL 16 and flows inside the BL 16 to the two big BL-contacts C3, C4 at the ends of the device (both BL-contacts C3, C4 could be shorted so that the device has only three contacts finally).

Figure 61:
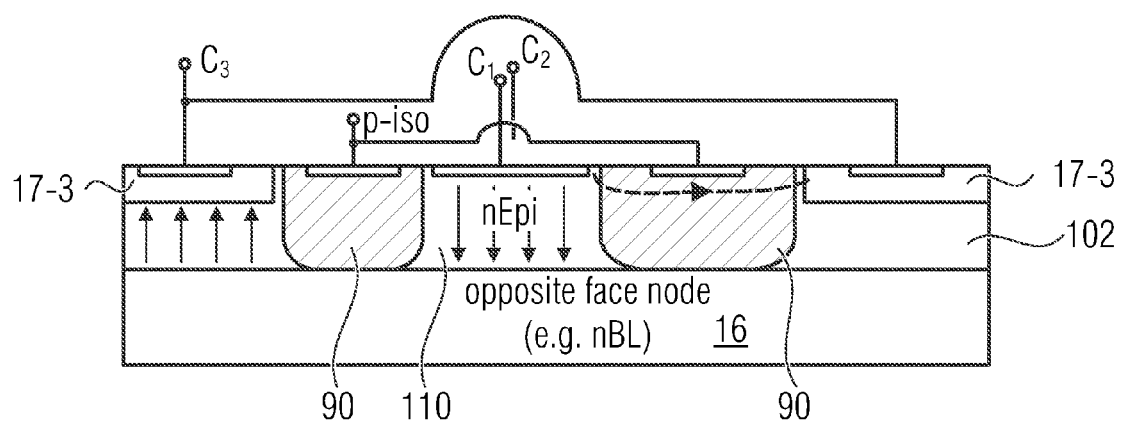
FIG. 61 shows a schematic cross-section of a vertical Hall device comprising deep p-doped isolations that avoid direct lateral current flow from the center pair contacts C1, C2 to the opposite face node contact C3.

The spacing between inner contacts C1, C2 and BL-contacts C3, C4 should be large enough, to ensure that no current is flowing sideways from C1 or C2 to the BL-contacts C3, C4 through the Hall region 110. FIG. 61 shows a cross-section of the device in the yz-plane through C1: it also shows how the deep p-isolation 90 avoids direct lateral current flow from C1, C2 to the BL-contact C3 (as indicated by the dashed arrow in FIG. 61): to this end the p-isolation 90 is reverse biased—i.e. it is connected to a potential that is less or equal to the smallest potential in the Hall region 110.

Of course, if the technology has no deep p-isolation tubs 90 available, one can also use p-isolation tubs that do not extend down to the nBL 16: then they only narrow the channel between active Hall region below C1, C2 and BL-contact(s) C3 and/or C4. If we increase the lateral distance accordingly we can still achieve good suppression of lateral current flow between C1, C2 and C3.

One can also use collector deep diffusion or similar structures for contact C3 to have a low ohmic connection between C3 and the BL 16.

It is possible to skip one or both BL-contacts C3, C4 and increase the size of the other one accordingly: this can save some space.

Note that in FIG. 60 a vertical Hall device is presented where not all contacts are in one row—this is new compared to many other designs of vertical Hall devices, which typically comprise several contacts that are arranged in a row.

Figure 62:
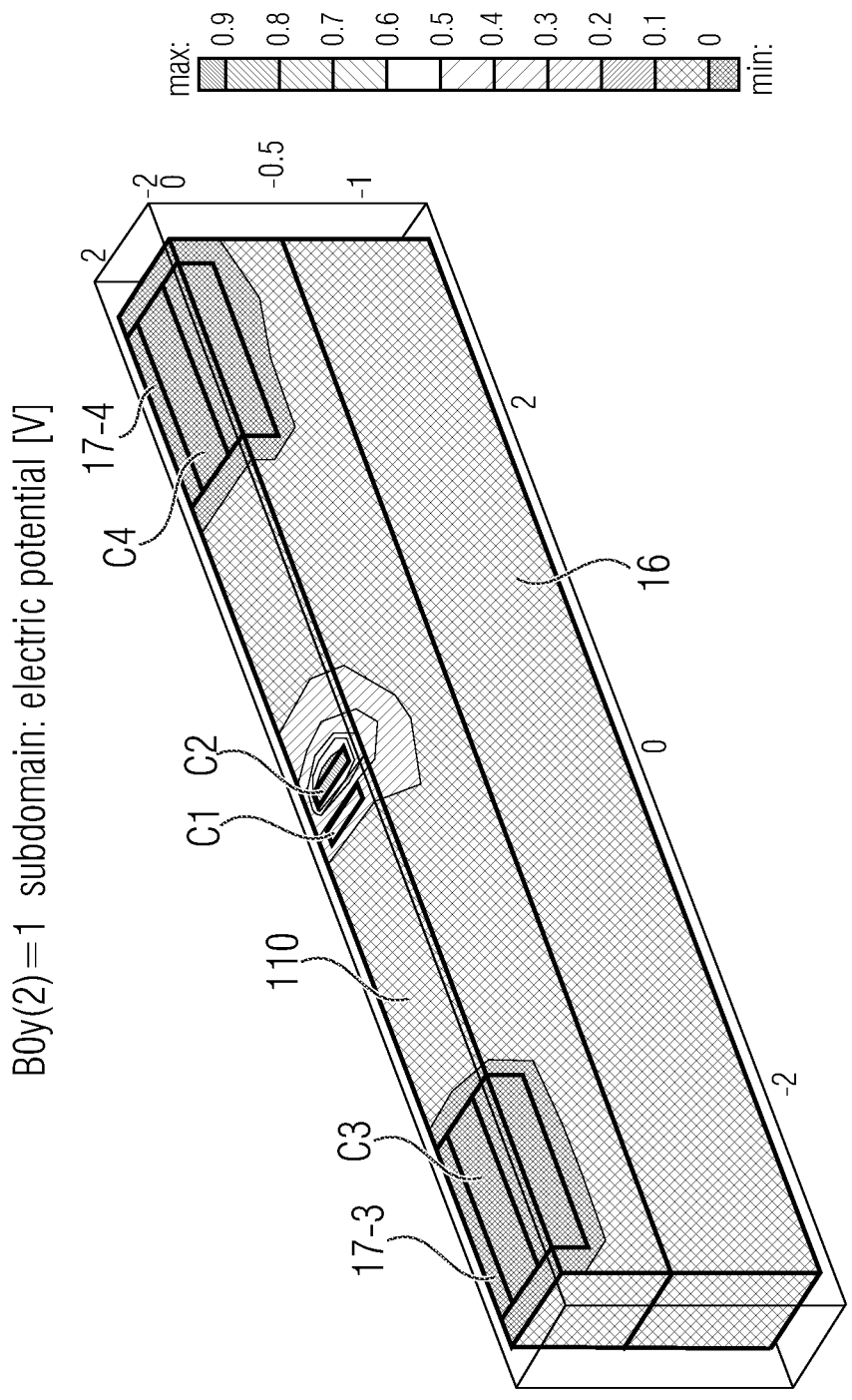
FIG. 62 shows a schematic, three-dimensional view of a Hall effect region during a particular clock phase of the spinning current scheme.

We may even further generalize the device by rotating the Hall region 110 and its BL-contacts C3, C4 by 90° (but not the contacts C1 and C2): Then we end up again with a device where all contacts are in a row, as schematically illustrated in FIG. 62. This device is typically less favorable, because if one of the two center contacts C1, C2 is used as supply terminal, the current is not forced to spread only underneath the other center contact, but it can also spread in the direction of the BL contact(s) C3, C4. Of course we could avoid this by introducing again deep p-isolations as schematically illustrated in the cross-section (=xz-plane) in FIG. 63.

Figure 63:
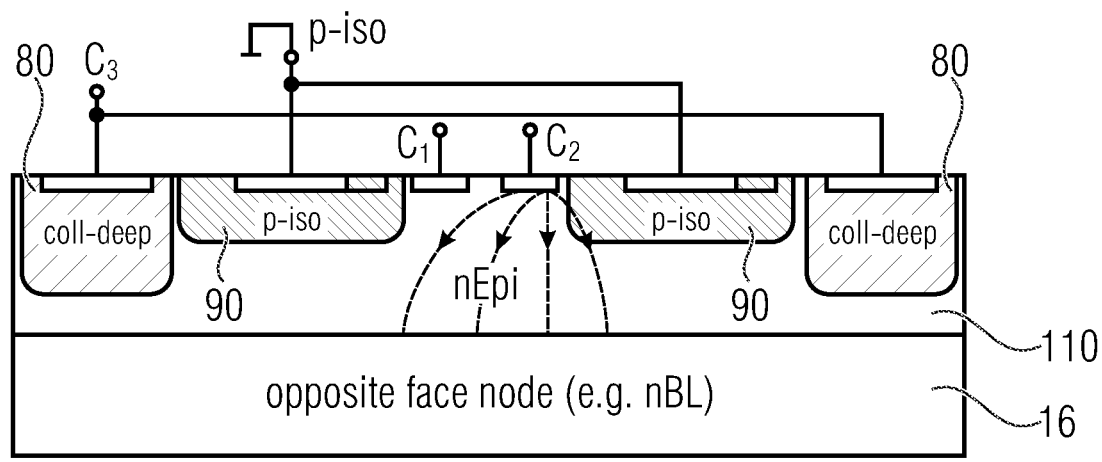
FIG. 63 shows a schematic cross-section of a vertical Hall device in which the contact arrangement of FIG. 62 is combined with semi-deep p-isolations.

In FIG. 63 we show a collector-deep diffusion 80 extending from the main face towards the BL 16 underneath C3 and p-isolation tubs 90 that are not ideal (do not reach down folly up to the BL 16).

Of course it is also possible to make the active Hall region 110 broader and also the contacts C1, C2 longer, while keeping the p-isolation branch as thin as possible and the C3-part again broad. All means that avoid current flow from C1, C2 to C3 through nEpi (=active Hall region) instead of nBL can, in principle, be used.

In other words, the invention shows a vertical Hall device with 3 contacts (C1, C2, C3), a Hall effect region 110, and a highly conductive opposite face node 16 underneath the Hall region 110. The resistances C1-BL and C2-BL are both larger than the resistance C3-BL. A majority of current between C1 and C3 (or C2 and C3) flows via the opposite (ace layer 16 and not entirely via the Hall region.

Current flowing from contact C2 vertically downwards into the opposite face layer 16 can spread laterally only underneath contact C1, because the opposite side is blocked by isolation means (trench or p-isolation tub; in FIG. 63 the rightmost dashed arrow corresponds to a current streamline that would be effectively avoided by the right p-isolation tub 90).

Figure 64:
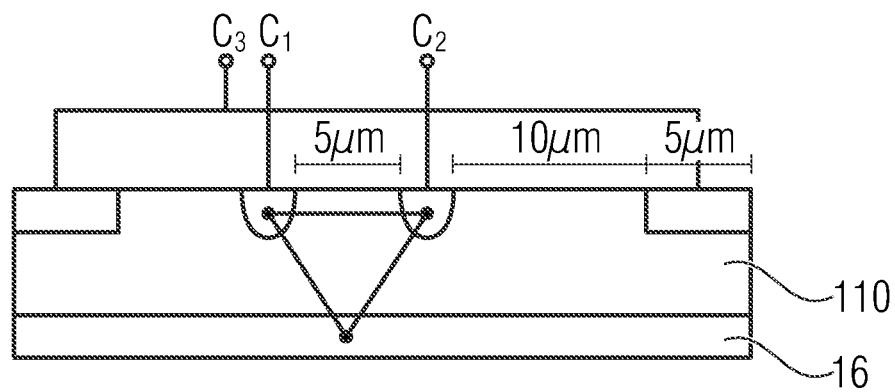
FIG. 64 shows a schematic cross-section of a vertical Hall device comprising two contacts at the main face and a highly conductive opposite face node as a further contact at the opposite face which make up a Hall device with three contacts in a triangular pattern.

FIG. 64 shows the conceptual idea of the device: It has two contacts C1, C2 on the main (sur)face and one contact C3 (effectively) at the opposite face—this is the buried or opposite face node 16. All three contacts make up a Hall device with three contacts in a triangular pattern: The outer contacts are large and serve merely to get low ohmic access to the BL 16: the depth of the Hall region 110 is about 5 μm.

Figure 65:
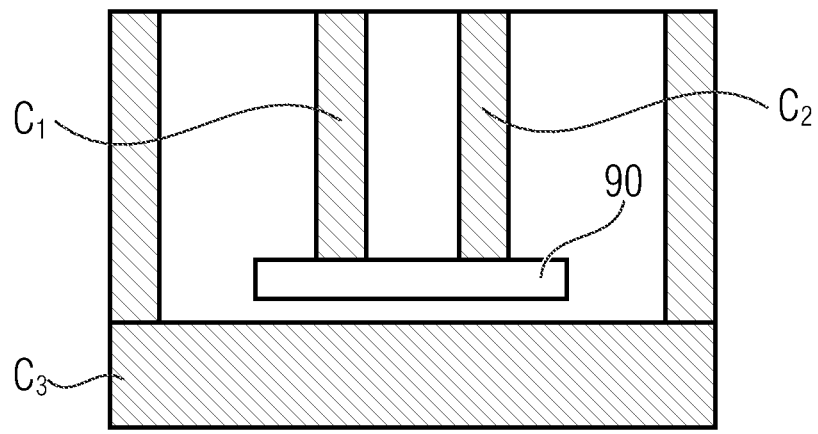
FIG. 65 schematically illustrates a plan view of a vertical Hall device having an isolation means that avoids superficial current flow from an opposite face node contact to the third contact.

FIG. 65 is a plan view of one exemplary embodiment where the white horizontal rectangle denotes some isolation means 90 (e.g. a deep p-tub or a slim trench) that avoid superficial current flow from the contact C3 (the BL-contact) to the other two contacts C1. C2. The structure shown in FIG. 65 can be modified by adding a mirrored structure at the boundary that is opposite to contact C3. In this manner, a ring structure is obtained. It would be further possible to provide a ring shaped isolation between the contact pair C1, C2 and the BL contact C3 so that cross sections in any direction through the center of the contact pair C1, C2 would look as in FIG. 63 or 61—depending on how the cross section through C1 and/or C2 is performed.

Figure 66:
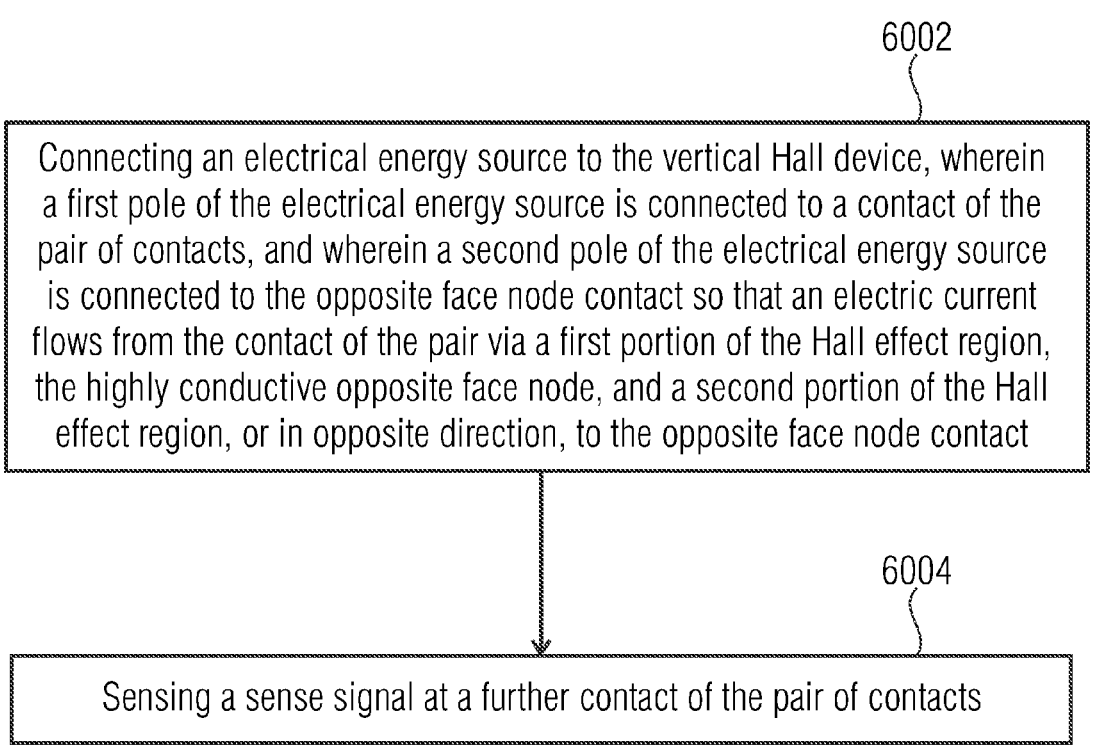
FIG. 66 shows a schematic flow diagram of a method for sensing a magnetic field by means of a vertical Hall device having a Hall effect region, a highly conductive opposite face node, a pair of contacts, and an opposite face node contact.

FIG. 66 is a schematic flow diagram of a method for sensing a magnetic field parallel to a surface of a semiconductor body. The semiconductor body has a main surface. The method can be performed using a vertical Hall device.

The vertical Hall device comprises a Hall effect region in the semiconductor body, wherein the Hall effect region has a main face that is parallel to the main face of the semiconductor body, it further comprises a highly conductive opposite face node in the semiconductor body, extending in ohmic contact to the Hall effect region at a side of the Hall effect region that is opposite to the main face of the Hall effect region. A pair of contacts is provided in or at the main face of the Hall effect region. The pair of contacts is typically symmetrical with respect to at least one symmetry plane of the Hall effect region, the at least one symmetry plane being orthogonal to the face of the Hall effect region. The vertical Hall device also comprises an opposite face node contact in or at the face of the Hall effect region so that the opposite face node contact is separated from the highly conductive opposite face node by a portion of the Hall effect region. A resistance between the opposite face node contact and the highly conductive opposite face node is smaller than a resistance between any contact of the pair of contacts and the highly conductive opposite face node.

The method for sensing the magnetic field comprises a step 6002 of connecting an electrical energy source to the vertical Hall device. A first pole of the electrical energy source is connected to a contact of the pair of contacts, and a second pole of the electrical energy source is connected to the opposite face node contact so that an electric current flows from the contact of the pair via a first portion of the Hall effect region, the opposite face node, and a second portion of the Hall effect region, or in opposite direction, to the opposite face node contact. The method also comprises a step 6004 of sensing a sense signal at a further contact of the pair of contacts.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps can be executed by (or using) a hardware apparatus, like for example, a microprocessor, a programmable computer or an electronic circuit. In some embodiments, some one or more of the most important method steps can be executed by such an apparatus.

In the foregoing Detailed Description, it can be seen that various features are grouped together in embodiments for the purpose of streamlining the disclosure. This method of disclosure is not to be interpreted as reflecting an intention that the claimed embodiments require more features than are expressly recited in each claim. Rather, as the following claims reflect, inventive subject matter may lie in less than all features of a single disclosed embodiment. Thus the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim or a combination of each feature with other dependent or independent claims. Such combinations are proposed herein unless it is stated that a specific combination is not intended, furthermore, it is intended to include also features of a claim to any other independent claim even if this claim is not directly made dependent to the independent claim.

It is further to be noted that methods disclosed in the specification or in the claims may be implemented by a device having means for performing each of the respective steps of these methods.

Furthermore, in some embodiments a single step may include or may be broken into multiple sub steps. Such sub steps may be included and part of the disclosure of this single step unless explicitly excluded.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

The invention claimed is:

1. A vertical Hall device comprising:
   a first Hall effect region and a second Hall effect region different from the first Hall effect region, both Hall effect regions in a common semiconductor body, the first Hall effect region and the second Hall effect region having a main face and an opposite face, respectively;
   a highly conductive opposite face node in common ohmic contact to the opposite face of the first Hall effect region and to the opposite face of the second Hall effect region in the semiconductor body;
   a first pair of contacts in or at the main face of the first Hall effect region; and
   a second pair of contacts in or at the main face of the second Hall effect region, wherein a convex circumscribing contour of the second pair of contacts is disjoint from a convex circumscribing contour of the first pair of contacts, in that a straight line between any two points within the contacts of the first pair of contacts does not contain any point within the contacts of the second pair of contacts, and a straight line between any two points within the contacts of the second pair of contacts does not contain any point within the contacts of the first pair of contacts.

2. The vertical Hall device according to claim 1, wherein a distance of the contacts of at least one of the first pair of contacts and the second pair of contacts is smaller than the depth of at least one of the first Hall effect region and the second Hall effect region, respectively.

3. The vertical Hall device according to claim 1, wherein a distance of the contacts of the first pair of contacts and a distance of the contacts of the second pair of contacts is smaller than a distance of the first pair of contacts and the second pair of contacts.

4. The vertical Hall device according to claim 1, wherein during operation an electric current is fed to the first and second Hall effect regions via exactly one contact of the first and second pair of contacts and withdrawn from the first and second Hall effect regions via exactly one other contact of the first and second pair of contacts.

5. The vertical Hall device according to claim 1, further comprising isolation means between the first Hall effect region and the second Hall effect region.

6. The vertical Hall device according to claim 5, wherein the isolation means is configured to cause at least 50% of a total electric current to flow via the highly conductive opposite face node from the first Hall effect region to the second Hall effect region, or vice versa.

7. The vertical Hall device according to claim 1, wherein the contacts of the first pair and the second pair are arranged symmetrically with respect to the first and second Hall effect regions, respectively.

8. The vertical Hall device according to claim 1, wherein a distance between the first pair and the second pair is larger than the depth of the first Hall effect region and larger than the depth of the second Hall effect region.

9. The vertical Hall device according to claim 1, wherein a distance between the first pair of contacts and the second pair of contacts extends in a direction orthogonal to the distance between the contacts of the first pair of contacts and also orthogonal to the distance between the contacts of the second pair of contacts.

10. The vertical Hall device according to claim 1, wherein the first Hall effect region and the second Hall effect region are arranged within a common tub of a doping type within the semiconductor body, and wherein a distance between the first pair of contacts and the second pair of contacts effectively splits the common tub into the first Hall effect region and the second Hall effect region.

11. The vertical Hall device according to claim 1,
   wherein the first Hall effect region comprises a first medium-doped well, wherein a large part of a contact of the first pair of contacts is overlapped by the first medium-doped well,
   wherein the second Hall effect region comprises a second medium-doped well, wherein a large part of a contact of the second pair of contacts is overlapped by the second medium-doped well, and wherein the first and second medium-doped wells have a doping level that is between a doping level of the contacts and a doping level of the first and second Hall effect regions, and wherein said contacts, said medium-doped wells, and said Hall effect regions are doped with the same type of doping.

12. The vertical Hall device according to claim 11, wherein a distance between the first medium-doped well and a perimeter of the first Hall effect region is less than 10% of the depth of the first Hall effect region, and wherein a distance between the second medium-doped well and a perimeter of the second Hall effect region is less than 10% of the depth of the second Hall effect region.

13. The vertical Hall device according to claim 1, wherein the first and second Hall effect regions are formed in an epitaxial layer of the semiconductor body.

14. The vertical Hall device according to claim 1, wherein the highly conductive node is an n-buried layer in the case of an n-type doping of the Hall effect region and the highly conductive node is a p-buried layer in the case of a p-type doping of the Hall effect region.

15. The vertical Hall device according to claim 1, wherein the opposite face node comprises a material with a conductivity that is at least ten times higher than the conductivity of the material of the Hall effect region.

16. A sensing arrangement comprising a vertical Hall device and a further vertical Hall device, wherein the vertical Hall device and the further vertical Hall device comprise, respectively:
   a first Hall effect region and a second Hall effect region different from the first Hall effect region, both Hall effect regions in a common semiconductor body, the first and second Hall effect regions having a main face and an opposite face, respectively;
   a highly conductive opposite face node in common ohmic contact to the opposite faces of the first Hall effect region and of the second Hall effect region in the semiconductor body;
   a first pair of contacts in or at the main face of the first Hall effect region; and
   a second pair of contacts in or at the main face of the second Hall effect region, wherein a convex circumscribing contour of the second pair of contacts is disjoint from a convex circumscribing contour of the first pair of contacts, in that a straight line between any two points within the contacts of the first pair of contacts does not contain any point within the contacts of the second pair of contacts, and a straight line between any two points within the contacts of the second pair of contacts does not contain any point within the contacts of the first pair of contacts;
   wherein the highly conductive opposite face nodes of the vertical Hall device and the further vertical Hall device are not in ohmic contact with each other.

17. A method for sensing a magnetic field parallel to a face of a semiconductor body, the method comprising:
   connecting an electrical energy source to a vertical Hall device causing an electric current therein, the vertical Hall device comprising a first Hall effect region with a main face and an opposite face within a semiconductor body, a second Hall effect region with a main face and an opposite face within the semiconductor body, and a highly conductive opposite face node in common ohmic contact to the opposite faces of both the first and second Hall effect regions,
   wherein a first pole of the electrical energy source is connected to a first contact belonging to a first pair of contacts in or at the main face of the first Hall effect region, and wherein a second pole of the electrical energy source is connected to a second contact belonging to a second pair of contacts in or at the main face of the second Hall effect region so that a significant portion of the electric current flows from the first contact via the first Hall effect region, through the highly conductive node, and the second Hall effect region to the second contact, or in opposite direction, wherein a convex circumscribing contour of the second pair of contacts is disjoint from a convex circumscribing contour of the first pair of contacts, in that a straight line between any two points within the contacts of the first pair of contacts does not contain any point within the contacts of the second pair of contacts, and a straight line between any two points within the contacts of the second pair of contacts does not contain any point within the contacts of the first pair of contacts; and
   sensing at least one sense signal at a third contact belonging to one of the first pair of contacts and the second pair of contacts.

18. The method according to claim 17, wherein the first Hall effect region is different from the second Hall effect region.

19. The method according to claim 17, wherein a convex circumscribing contour of the second pair of contacts is disjoint from a convex circumscribing contour of the first pair of contacts.

20. The method according to claim 17, further comprising:
   connecting the electrical energy source or a further electrical energy source to a further vertical Hall device causing an electric current therein, the further vertical Hall device comprising a further first Hall effect region, a further second Hall effect region, and a further highly conductive opposite face node in ohmic contact to opposite faces of both the first and second further Hall effect regions, wherein the further vertical Hall device is biased in a manner so that a further sense signal sensed at the further vertical Hall device has an opposite dependency with respect to the magnetic field.

21. The method according to claim 20, further comprising:
   sensing a second sense signal at a fourth contact belonging to one of the first pair of contacts and the second pair of contacts of the vertical Hall device; and
   sensing a further second sense signal at the further vertical Hall device, the further second sense signal having an opposite dependency with respect to the magnetic field than the second sense signal;
   wherein the sense signal and the further sense signal both have a first common mode potential, and wherein a difference of these two signals produces a first differential signal;
   wherein the second sense signal and the further second sense signal both have a second common mode potential different from the first common mode potential, and wherein a difference of the second sense signal and the further second sense signal produces a second differential signal; and
   wherein an output signal indicative of the magnetic field is obtained by combining the first differential signal and the second differential signal.

22. The method according to claim 21, further comprising performing a step of a spinning current scheme for the first pair of contacts of the vertical Hall device and for a further first pair of contacts of the further vertical Hall device, while maintaining a connection configuration of the second pair of contacts of the vertical Hall device and of a further second pair of the contacts of the further vertical Hall device;

sensing a new sense signal at the first contact and a new further sense signal at a contact of the further first pair of contacts that previously functioned as a supply contact prior to performing the step of the spinning current scheme;

determining a subsequent signal on the basis of at least one of the new sense signal and the new further sense signal;

subtracting the subsequent signal from a previous signal selected from the sense signal, the further sense signal, and the first differential signal, or vice versa, so that offset-related components in the subsequent signal and the previous signal cancel each other at least partially, to obtain a first offset-reduced signal indicative of the magnetic field.

23. The method according to claim 22, further comprising:

performing a second step of the spinning current scheme for the second pair of contacts of the vertical Hall device and for the further second pair of the further vertical Hall device, while maintaining a connection configuration of the first pair of contacts of the vertical Hall device and of the further first pair of contacts of the further vertical Hall device;

sensing an ensuing second sense signal at the second contact and an ensuing further second sense signal at a contact of the further first pair of contacts that previously functioned as a supply contact prior to performing the second step of the spinning current scheme;

determining a second subsequent signal on the basis of at least one of the ensuing second sense signal and the ensuing further second sense signal;

subtracting the second subsequent signal from a second previous signal selected from the second sense signal, the further second sense signal, and the second differential signal, or vice versa, so that offset-related components in the second subsequent signal and the second previous signal cancel each other at least partially to obtain a second offset-reduced signal;

combining the first offset-reduced signal with the second offset-reduced signal.

24. A method for sensing a magnetic field parallel to a face of a semiconductor body using a sensing arrangement comprising two vertical Hall devices, each vertical Hall device comprising:

a first Hall effect region and a second Hall effect region in the semiconductor body, the first Hall effect regions having a main face and an opposite face and the second Hall effect region having a main face and an opposite face;

a highly conductive opposite face node in common ohmic contact to the opposite face of the first Hall effect region and the opposite face of the second Hall effect region in the semiconductor body;

a first pair of contacts in or at the main face of the first Hall effect region, wherein a distance of the contacts of the first pair is smaller than twice a depth of the second Hall effect region;

a second pair of contacts in or at the main face of the second Hall effect region, wherein a distance of the contacts of the second pair is smaller than twice a depth of the second Hall effect region, wherein a straight line between any two points within the contacts of the first pair of contacts does not contain any point within the contacts of the second pair of contacts, and a straight line between any two points within the contacts of the second pair of contacts does not contain any point within the contacts of the first pair of contacts;

whereby the highly conductive opposite face nodes of both vertical Hall devices are not in ohmic contact with each other;

wherein the method comprises three, six, nine, or twelve clock phases per spinning current cycles of a spinning current scheme, wherein each clock phase comprises:

connecting a clock phase-specific first contact of each vertical Hall device to a reference potential;

applying a voltage relative to the reference potential or injecting an electric current at a clock phase-specific second contact of each vertical Hall device;

sensing signals at the two remaining contacts per vertical Hall device, wherein of these remaining contacts those contacts whose signals increase with an applied magnetic field for a given clock phase are called positive sense contacts for said clock phase, and those contacts whose signals decrease with the applied magnetic field for said clock phase are called negative sense contacts;

wherein after completion of the spinning current cycle a total output signal is derived in such a way that it corresponds to the sum of the signals of positive sense contacts in the various clock phases minus the sum of the signals of negative sense contacts in the various clock phases.

25. The method according to claim 24, wherein each contact of a first vertical Hall device corresponds to a specific contact of the second vertical Hall device so that these corresponding contacts both function as the clock phase-specific first contact, the clock phase-specific second contact, or one of the two remaining contacts in the same clock phases.

26. A vertical Hall device comprising:

a Hall effect region in a semiconductor body, wherein the Hall effect region has a main face and an opposite face;

a highly conductive opposite face node in common ohmic contact to the opposite face of the Hall effect region in the semiconductor body;

a pair of contacts in or at the main face of the Hall effect region;

an opposite face node contact in or at the main face of the Hall effect region, wherein a resistance between the opposite face node contact and the highly conductive opposite face node is smaller than a resistance between both contacts of the pair of contacts and the highly conductive opposite face node.

27. The vertical Hall device according to claim 26, where not all three contacts and the Hall effect region are rectangles in plan view with the long edges of the contacts being perpendicular to the long edge of the Hall effect region.

28. The vertical Hall device according to claim 26, wherein in plan view the centers of three contacts are located at the corners of one of a triangle, an isosceles triangle, and an equilateral triangle.

29. The vertical Hall device according to claim 26, wherein in plan view the Hall effect region comprises two sub-regions, one of them comprising said pair of contacts and another one of them comprising said opposite face node contact.

30. The vertical Hall device according to claim 26, wherein in plan view all contacts and the Hall effect region are elongated with at least one of their long sides, edges, and axes in parallel.

31. The vertical Hall device according to claim 26, wherein the Hall effect region has a ring topology and the pair of contacts is located diametrically opposed to the opposite face node contact, with respect to the ring topology.

32. The vertical Hall device according to claim 26, wherein a spacing of the pair of contacts is smaller than a depth of the Hall effect region.

33. The vertical Hall device according to claim 26, wherein the contacts of the pair of contacts have a longer lateral extension and a shorter lateral extension, wherein the shorter lateral extension is smaller than a depth of the Hall effect region.

34. The vertical Hall device according to claim 26, wherein a distance between at least one boundary of the Hall effect region and the longest edge of the perimeter of the contacts of the pair of contacts is less than 20% of the depth of the Hall effect region.

35. The vertical Hall device according to claim 26, wherein at least one contact of the pair of contacts and the opposite face node contact comprises a contact diffusion having a same doping type as, and a higher doping level than, the Hall effect region.

36. The vertical Hall device according to claim 26, further comprising an isolating diffusion formed within the Hall effect region between the pair of contacts and the opposite face node contact, wherein the isolating diffusion has a different doping type than the Hall effect region so that an interface between the isolating diffusion and the Hall effect region is configured to function as a reverse-biased pn-junction when appropriately electrically biased.

37. The vertical Hall device according to claim 26, further comprising a second opposite face node contact located at an opposite side of the pair of contacts than the opposite face node contact.

38. The vertical Hall device according to claim 26, wherein the contacts of the pairs of contacts have a longitudinal extension that is orthogonal to a longitudinal extension of the Hall effect region.

39. A method for sensing a magnetic field parallel to a main face of a semiconductor body by using a vertical Hall device that comprises
a Hall effect region in the semiconductor body, wherein the Hall effect region has a main face and an opposite face;
a highly conductive opposite face node in common ohmic contact to the opposite face of the Hall effect region in the semiconductor body;
a pair of contacts in or at the main face of the Hall effect region;
an opposite face node contact in or at the main face of the Hall effect region, wherein a resistance between the opposite face node contact and the highly conductive opposite face node is smaller than a resistance between any contact of the pair of contacts and the highly conductive opposite face node;
the method comprising:
connecting an electrical energy source to the vertical Hall device, wherein a first pole of the electrical energy source is connected to a contact of the pair of contacts, and wherein a second pole of the electrical energy source is connected to the opposite face node contact so that an electric current flows from the contact of the pair via a first portion of the Hall effect region, the highly conductive opposite face node, and a second portion of the Hall effect region, or in opposite direction, to the opposite face node contact; and
sensing a sense signal at a further contact of the pair of contacts.

40. A vertical Hall device comprising:
a Hall effect region in a semiconductor body, wherein the Hall effect region comprises a main face, an opposite face, a first section, a second section, and a connecting section between the first section and the second section;
a highly conductive opposite face node in common ohmic contact to both the first and the second section at the opposite face of the Hall effect region and thus providing a highly conductive connection between the first and second sections compared to the connecting section;
a pair of contacts arranged in or at the main face of the first section of the Hall effect region; and
an opposite face node contact arranged in or at the main face of the second section of the Hall effect region.

* * * * *